US008823067B2

(12) United States Patent
Iwasaki

(10) Patent No.: US 8,823,067 B2
(45) Date of Patent: Sep. 2, 2014

(54) SOLID-STATE IMAGING APPARATUS AND ELECTRONIC APPARATUS

(75) Inventor: Masanori Iwasaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/560,190

(22) Filed: Jul. 27, 2012

(65) Prior Publication Data

US 2013/0032914 A1 Feb. 7, 2013

(30) Foreign Application Priority Data

Aug. 5, 2011 (JP) .................................. 2011-171894

(51) Int. Cl.
*H01L 31/062* (2012.01)
*H01L 27/146* (2006.01)
*H01L 31/0232* (2014.01)

(52) U.S. Cl.
CPC .... *H01L 31/02327* (2013.01); *H01L 27/14621* (2013.01); *H01L 27/14625* (2013.01); *H01L 27/14627* (2013.01); *H01L 27/14618* (2013.01)
USPC ............................ 257/291; 257/292; 257/432

(58) Field of Classification Search
USPC ........................................ 257/291, 292, 432
See application file for complete search history.

(56) References Cited

U.S. PATENT DOCUMENTS

| 6,759,642 | B2 | 7/2004 | Hoshino | |
|---|---|---|---|---|
| 2008/0055729 | A1* | 3/2008 | Li et al. | 359/601 |
| 2010/0243869 | A1* | 9/2010 | Wano et al. | 250/227.2 |
| 2011/0147872 | A1* | 6/2011 | Inoue et al. | 257/432 |
| 2012/0240979 | A1* | 9/2012 | Maeda et al. | 136/247 |

FOREIGN PATENT DOCUMENTS

| JP | 2001-203913 | 7/2001 |
|---|---|---|
| JP | 2007-311454 | 11/2007 |
| JP | 2010-186818 | 8/2010 |
| JP | 2011-82266 | 4/2011 |

\* cited by examiner

*Primary Examiner* — Tan N Tran
(74) *Attorney, Agent, or Firm* — Oblon, Spivak, McClelland, Maier & Neustadt, L.L.P.

(57) ABSTRACT

A solid-state imaging apparatus including: a sensor substrate that has a plurality of pixels configured to receive incident light, the plurality of pixels being arranged on an upper surface of a semiconductor substrate; a transparent substrate that has a lower surface facing an upper surface of the sensor substrate and is configured to transmit the incident light therethrough; and a diffraction grating that is provided at any position between an upper surface of the transparent substrate and the upper surface of the sensor substrate and is configured to transmit the incident light therethrough, in which the diffraction grating is formed so as to diffract reflected diffraction light caused by that the incident light is incident on a pixel area in which the plurality of pixels are arranged on the upper surface of the semiconductor substrate and is diffracted.

15 Claims, 36 Drawing Sheets

Color filter
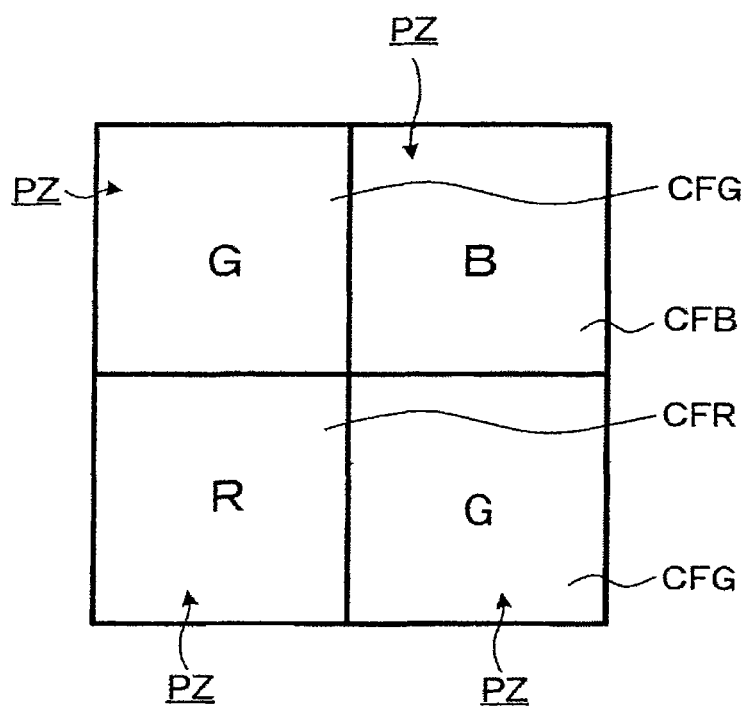
FIG.7
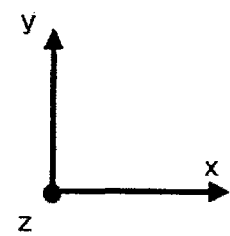

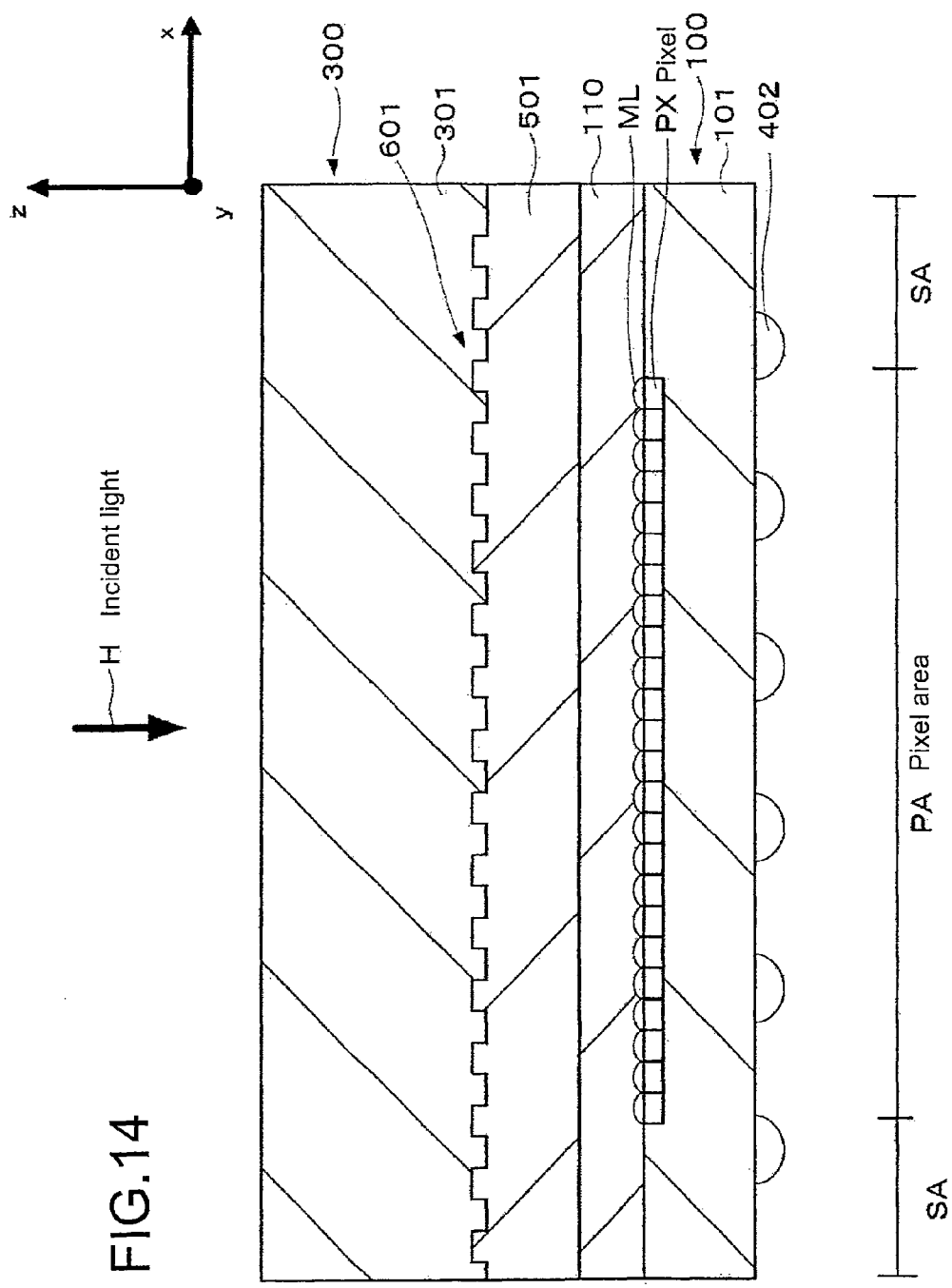

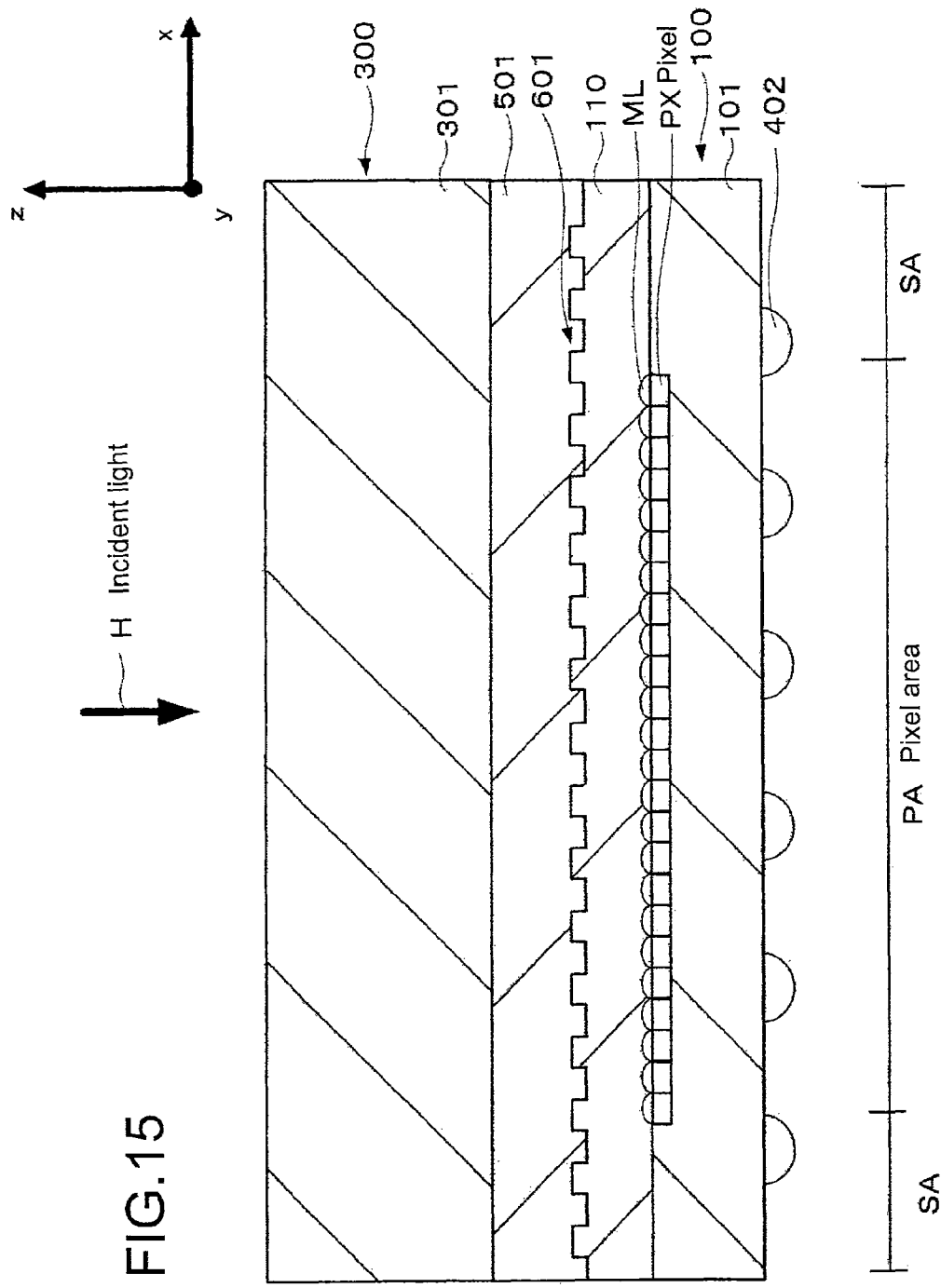

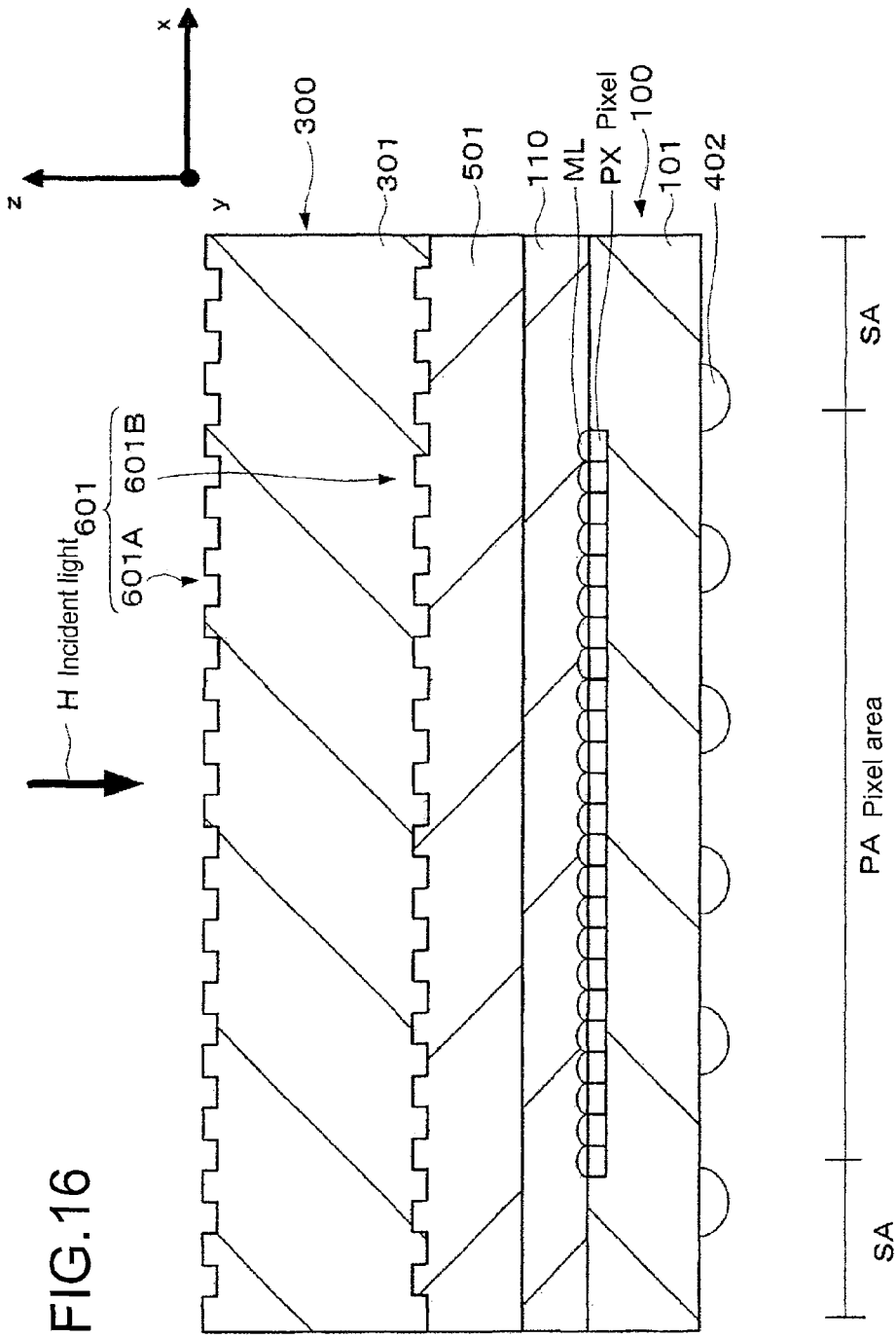

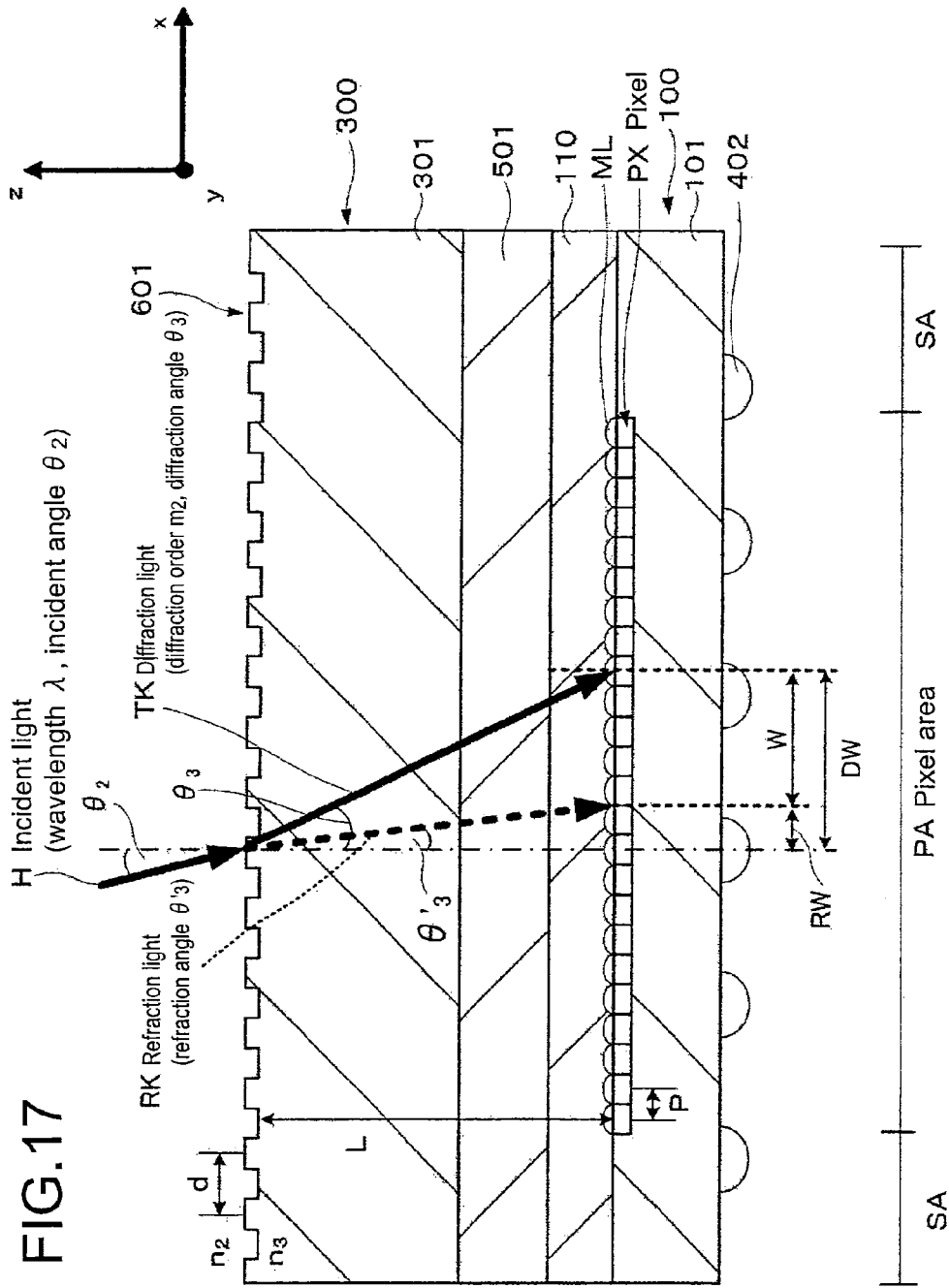

SOLID-STATE IMAGING APPARATUS AND ELECTRONIC APPARATUS

BACKGROUND

The present technology relates to a solid-state imaging apparatus and an electronic apparatus such as a camera including the solid-state imaging apparatus.

Electronic apparatuses such as a digital video camera and a digital still camera include the solid-state imaging apparatus. Such electronic apparatuses include a complementary metal oxide semiconductor (CMOS) type image sensor chip or a charge coupled device (CCD) type image sensor chip, for example, as the solid-state imaging apparatus.

In the solid-state imaging apparatus, a plurality of pixels are arranged in an array on an imaging surface of a substrate. Each of the plurality of pixels is provided with a photoelectric conversion unit. The photoelectric conversion unit is, for example, a photodiode, and receives light, which is incident as a subject image through an external optical system including an imaging lens, on a light receiving surface and photoelectrically converts the light, thereby generating a signal charge.

In the substrate constituting the solid-state imaging apparatus, a cover glass is disposed above a surface on which the incident light is incident as the subject image. The solid-state imaging apparatus has, for example, a "cavity structure", and an air layer is interposed between the cover glass and the substrate on which the pixels are arranged. Otherwise, the solid-state imaging apparatus has, for example, a "cavity-less structure", and the air layer is not interposed between the cover glass and the substrate on which the pixels are arranged, and for example, a solid layer such as resin is interposed between the cover glass and the substrate on which the pixels are arranged. It is suitable that the "cavity-less structure" can prevent the occurrence of problems such as "warping", "peeling", and "decrease in sensitivity due to interface reflection" caused by a gap of the "cavity structure" (for example, see Japanese Patent Application Laid-Open No. 2007-311454 (for example, FIGS. 1 and 5)).

Moreover, a band-pass filter such as an infrared cut filter may be provided on one surface of the cover glass (for example, see Japanese Patent Application Laid-Open No. 2010-186818 (for example, FIG. 29)). For example, a plurality of deposited films are stacked and a reflection-type infrared cut filter is provided, thereby enhancing the image quality for a captured image of a subject image of visible light (for example, see Japanese Patent Application Laid-Open No. 2001-203913 (for example, paragraph [0014])).

In the solid-state imaging apparatus, a ghost (flare) occurs on the captured image due to reflected diffraction light caused by the pixels periodically arranged on the imaging surface of the substrate, so that the image quality may be deteriorated. Specifically, when incident light is incident from above as the subject image to periodic structures such as microlenses periodically disposed corresponding to the plurality of pixels, the incident light is diffracted by the periodic structures and some of the incident light is reflected above as the reflected diffraction light. For example, light reflected on the surface of the microlens or the substrate becomes the reflected diffraction light. Then, the reflected diffraction light is incident on and reflected by elements such as the cover glass, the infrared cut filter, and an external lens disposed above the substrate. Subsequently, when the reflected diffraction light reflected by the elements is re-incident on the pixels, the ghost occurs on the captured image. In order to solve these problems, various techniques have been proposed (for example, see Non-Patent Document, Shohei Matsuoka et al., "Reflection diffraction ghost caused by imaging element", Thirty-fourth Optical Symposium proceedings, The Optical Society of Japan, An Affiliate of Japan Society of Applied Physics, Jul. 2, 2009, p. 11 to p. 12; Non-Patent Document, Yasuhiro Aono et al., "Evaluation method of digital camera optical system", Twenty-seventh Optical Symposium proceedings, The Optical Society of Japan, An Affiliate of Japan Society of Applied Physics, Jun. 20, 2009, p. 1 to p. 4; and Japanese Patent Application Laid-Open No. 2011-082266 (for example, paragraphs [0002], [0026])).

SUMMARY

However, in the solid-state imaging apparatus described above, it is not easy to suppress the occurrence of the ghost sufficiently and may be difficult to enhance the image quality of the captured image.

For example, when fine pixels are arranged in the case of the "cavity-less structure", the reflected diffraction light due to the pixels is totally reflected on an upper surface of the cover glass, and the ghost radially extending around a high-luminance subject may occur frequently in the captured image.

Moreover, for example, in the case of the "cavity structure", light having a high-wavelength component among the reflected diffraction light due to the pixels is reflected on the reflection-type infrared cut filter, and a red ghost which is referred to as a "red-ball ghost" may occur frequently in the captured image.

Therefore, the present technology provides the solid-state imaging apparatus and the electronic apparatus which are capable of enhancing the image quality of the captured image.

The solid-state imaging apparatus and the electronic apparatus of the present technology include: a sensor substrate that has a plurality of pixels configured to receive incident light, the plurality of pixels being arranged on an upper surface of a semiconductor substrate; a transparent substrate that has a lower surface facing an upper surface of the sensor substrate and is configured to transmit the incident light therethrough; and a diffraction grating that is provided at any position between an upper surface of the transparent substrate and the upper surface of the sensor substrate and is configured to transmit the incident light therethrough, in which the diffraction grating is formed so as to diffract reflected diffraction light caused by that the incident light is incident on a pixel area in which the plurality of pixels are arranged on the upper surface of the semiconductor substrate and is diffracted.

In the present technology, the diffraction grating diffracts the reflected diffraction light caused by that the incident light is incident on the pixel area in which the plurality of pixels are provided on the upper surface of the semiconductor substrate and is diffracted. Therefore, some of the reflected diffraction light is not reflected from the diffraction grating to a side on which the semiconductor substrate is provided and is transmitted through a side opposite to the side on which the semiconductor substrate is provided.

According to the present technology, it is possible to provide the solid-state imaging apparatus and the electronic apparatus which are capable of enhancing the image quality of the captured image.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 7 is a diagram showing a color filter CF according to the first embodiment;

FIG. 14 is a diagram showing a main portion of a solid-state imaging apparatus according to a second embodiment;

FIG. 15 is a diagram showing a main portion of a solid-state imaging apparatus according to a third embodiment;

FIG. 16 is a diagram showing a main portion of a solid-state imaging apparatus according to a fourth embodiment;

FIG. 17 is a diagram showing factors constituting Expressions (B) and (C) according to a fifth embodiment;

DETAILED DESCRIPTION OF EMBODIMENTS

Embodiments will be described below with reference to the drawings.

The description will be made in the following order.
1. First embodiment (in case where diffraction grating is provided on upper surface of cover glass)
2. Second embodiment (in case where diffraction grating is provided on lower surface of cover glass)
3. Third embodiment (in case where diffraction grating is provided on layer other than cover glass)
4. Fourth embodiment (in case where diffraction gratings are provided on upper and lower surfaces of cover glass)
5. Fifth embodiment (in case where diffraction grating satisfies Expressions (B) and (C))
6. Sixth embodiment (in case where diffraction grating satisfies Expression (D))
7. Seventh embodiment (in case where diffraction grating is provided on lower surface of cover glass in cavity structure)
8. Eighth embodiment (in case where diffraction grating is provided on layer other than cover glass in cavity structure)
9. Ninth embodiment (in case where diffraction grating satisfies Expression (E))
10. Others

1. First Embodiment

[1] Configuration of Apparatus (1-1) Configuration of Main Portion of Camera

Figure 1:
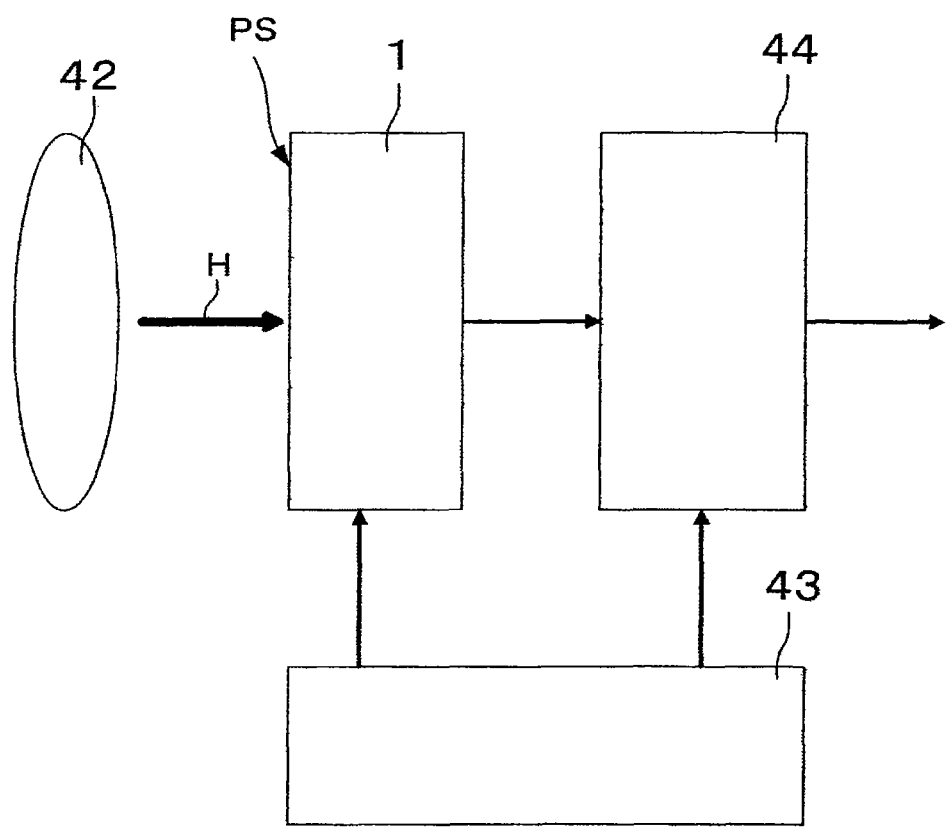
FIG. 1 is a configuration diagram showing a configuration of a camera 40 according to a first embodiment.

FIG. 1 is a configuration diagram showing a configuration of a camera 40 according to a first embodiment.

As shown in FIG. 1, the camera 40 includes a solid-state imaging apparatus 1, an optical system 42, a controller 43, and a signal processing unit 44. The respective elements will be described in order of precedence.

The solid-state imaging apparatus 1 receives, by an imaging surface PS, incident light H which is incident through the optical system 42 as a subject image, and photoelectrically converts the incident light H, thereby generating a signal charge. In this case, the solid-state imaging apparatus 1 is driven based on a control signal which is outputted from the controller 43. The signal charge is then read and outputted as an electric signal.

The optical system 42 includes optical members such as an imaging lens, and is disposed to concentrate the incident light H onto the imaging surface PS of the solid-state imaging apparatus 1.

The controller 43 outputs various control signals to the solid-state imaging apparatus 1 and the signal processing unit 44, thereby controlling and driving the solid-state imaging apparatus 1 and the signal processing unit 44.

The signal processing unit 44 is configured to perform signal processing on electric signals which are outputted from the solid-state imaging apparatus 1, thereby generating a color digital image, for example.

(1-2) Configuration of Main Portion of Solid-State Imaging Apparatus

The configuration of a main portion of the solid-state imaging apparatus 1 will be described.

Figure 2:
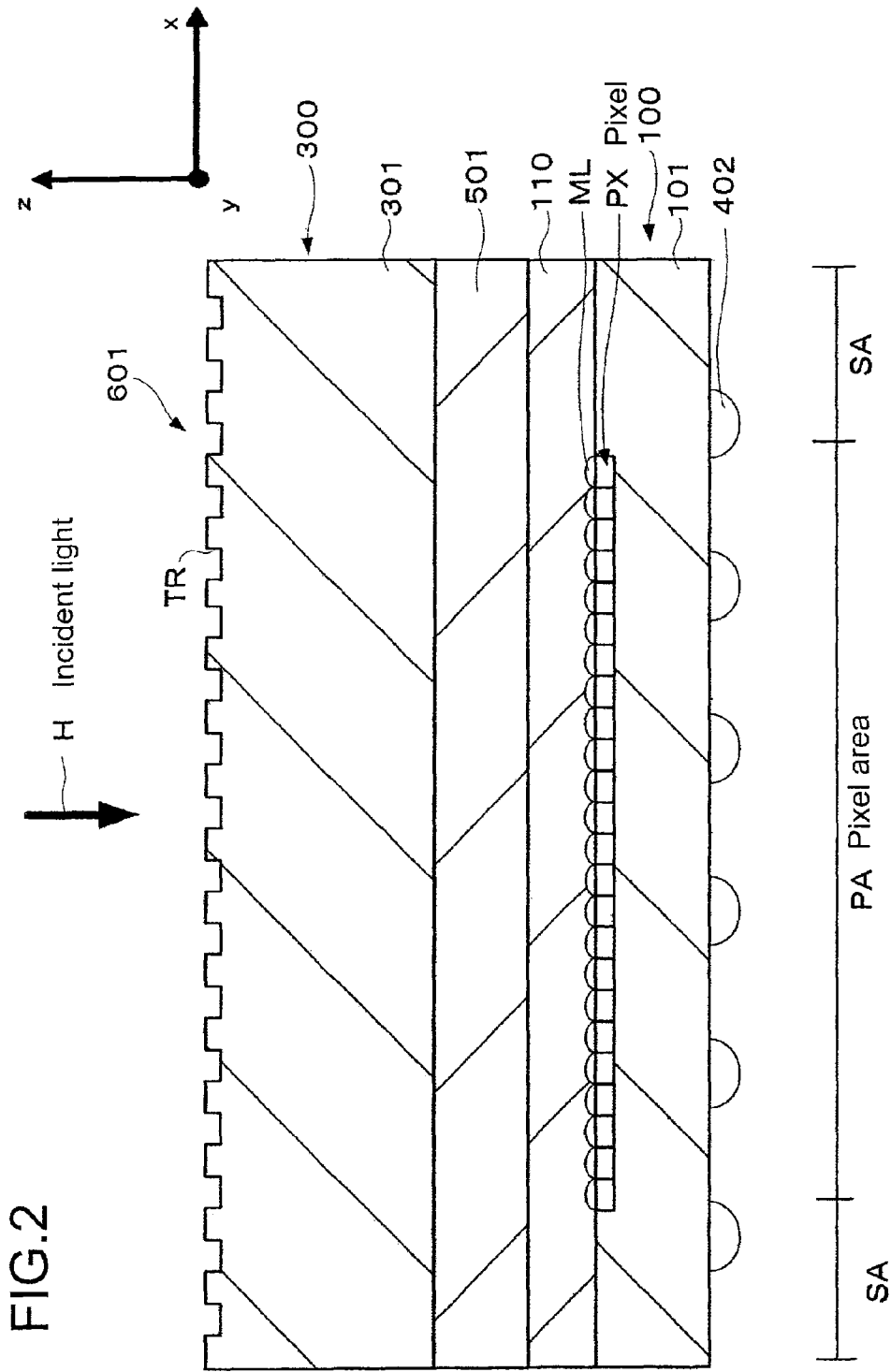
FIG. 2 is a diagram showing a configuration of a main portion of a solid-state imaging apparatus 1 according to the first embodiment.

FIG. 2 is a diagram showing the configuration of the main portion of the solid-state imaging apparatus 1 according to the first embodiment. FIG. 2 is a cross-sectional view schematically showing the configuration of the solid-state imaging apparatus 1.

The solid-state imaging apparatus 1, as shown in FIG. 2, includes a sensor substrate 100 and a cover glass 300.

As shown in FIG. 2, the sensor substrate 100 and the cover glass 300 are disposed to face each other.

In this case, as shown in FIG. 2, an adhesive layer 501 is interposed between the sensor substrate 100 and the cover glass 300, and the sensor substrate 100 and the cover glass 300 are bonded by the adhesive layer 501. The solid-state imaging apparatus 1 has a "cavity-less structure", and the adhesive layer 501 is provided on an entire surface between the sensor substrate 100 and the cover glass 300 without providing a cavity portion.

The respective elements constituting the solid-state imaging apparatus 1 will be described in order of precedence.

(A) Sensor Substrate 100

The sensor substrate 100 constituting the solid-state imaging apparatus 1 will be described.

In the solid-state imaging apparatus 1, the sensor substrate 100 has, for example, a CMOS image sensor chip, and includes a semiconductor substrate 101 as shown in FIG. 2. For example, the semiconductor substrate 101 is formed of single crystalline silicon.

In the semiconductor substrate 101, an upper surface (front surface) facing the cover glass 300 is provided with a pixel area PA and a surrounding area SA as shown in FIG. 2. A plurality of pixels PX are arranged in the pixel area PA. Each of the plurality of pixels PX is provided with a microlens ML. Then, a transparent layer 110 is provided on an upper surface of the semiconductor substrate 101 so as to cover the microlens ML.

On the other hand, as shown in FIG. 2, a bump 402 is provided on a lower surface (rear surface) of the semiconductor substrate 101.

As shown in FIG. 2, the sensor substrate 100 is configured to capture a color image by that each pixel PX of the pixel area PA receives the incident light H of a visible light region which is incident as a subject image through the cover glass 300 and the adhesive layer 501 from above.

(A-1) Overall Configuration of Sensor Substrate 100

Figure 3:
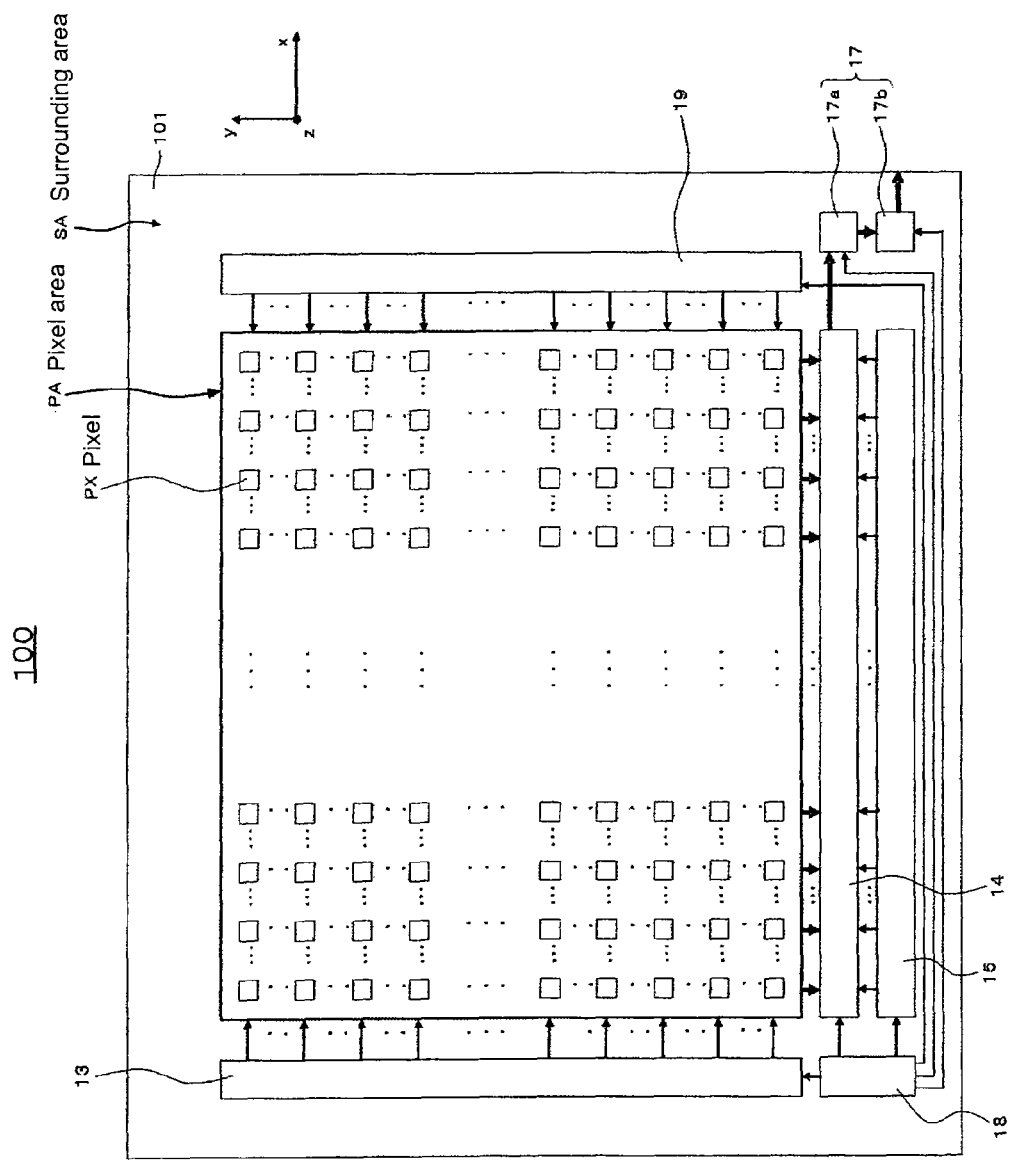
FIG. 3 is a diagram showing an overall configuration of a sensor substrate 100 according to the first embodiment.

FIG. 3 is a diagram showing an overall configuration of the sensor substrate 100 according to the first embodiment. FIG. 3 shows an upper surface of the sensor substrate 100.

In the sensor substrate 100, as shown in FIG. 3, the pixel area PA is provided at a central portion of the semiconductor substrate 101. The pixel area PA has a rectangular shape and the plurality of pixels PX are disposed in each of a horizontal direction x and a vertical direction y. The configuration of the pixels PX will be described in detail later.

In the sensor substrate 100, as shown in FIG. 3, the surrounding area SA is positioned at the periphery of the pixel area PA. Then, in the surrounding area SA, peripheral circuits are provided.

Specifically, a vertical drive circuit 13, a column circuit 14, a horizontal drive circuit 15, an external output circuit 17, a timing generator (TG) 18, and a shutter drive circuit 19 are provided as the peripheral circuits, as shown in FIG. 3. Each unit is driven in accordance with a control signal inputted from the controller 43 (see FIG. 1) and a capturing operation is executed.

As shown in FIG. 3, the vertical drive circuit 13 is provided at a lateral part of the pixel area PA in the surrounding area SA and is configured to select and drive the pixels PX of the pixel area PA row by row.

As shown in FIG. 3, a column circuit 14 is provided at a lower end part of the pixel area PA in the surrounding area SA, and executes signal processing on signals outputted from the pixels PX column by column. In this case, the column circuit 14 includes a correlated double sampling (CDS) circuit (not shown) and executes signal processing for removing fixed pattern noise.

The horizontal drive circuit 15 is electrically connected to the column circuit 14 as shown in FIG. 3. The horizontal drive circuit 15 includes a shift register, for example, and allows the column circuit 14 to sequentially output signals, which are held for each column of the pixels PX, to the external output circuit 17.

The external output circuit 17 is electrically connected to the column circuit 14 as shown in FIG. 3. The external output circuit 17 executes signal processing on the signals outputted from the column circuit 14 and then outputs the signals to the outside. The external output circuit 17 includes an automatic gain control (AGC) circuit 17a and an ADC circuit 17b. In the external output circuit 17, after the AGC circuit 17a amplifies the signals, the ADC circuit 17b converts the signals from analog signals to digital signals and outputs the signals to the outside.

The timing generator 18 is electrically connected to each of the vertical drive circuit 13, the column circuit 14, the horizontal drive circuit 15, the external output circuit 17, and the shutter drive circuit 19 as shown in FIG. 3. The timing generator 18 produces various types of timing signals and outputs the signals to the vertical drive circuit 13, the column circuit 14, the horizontal drive circuit 15, the external output circuit 17, and the shutter drive circuit 19 so as to drive-control each of the elements.

The shutter drive circuit 19 is configured to select the pixels PX row by row and adjust exposure time in the pixels PX.

(A-2) Detail of Configuration of Sensor Substrate 100

The configuration of the sensor substrate 100 will be described in detail.

Figure 4:
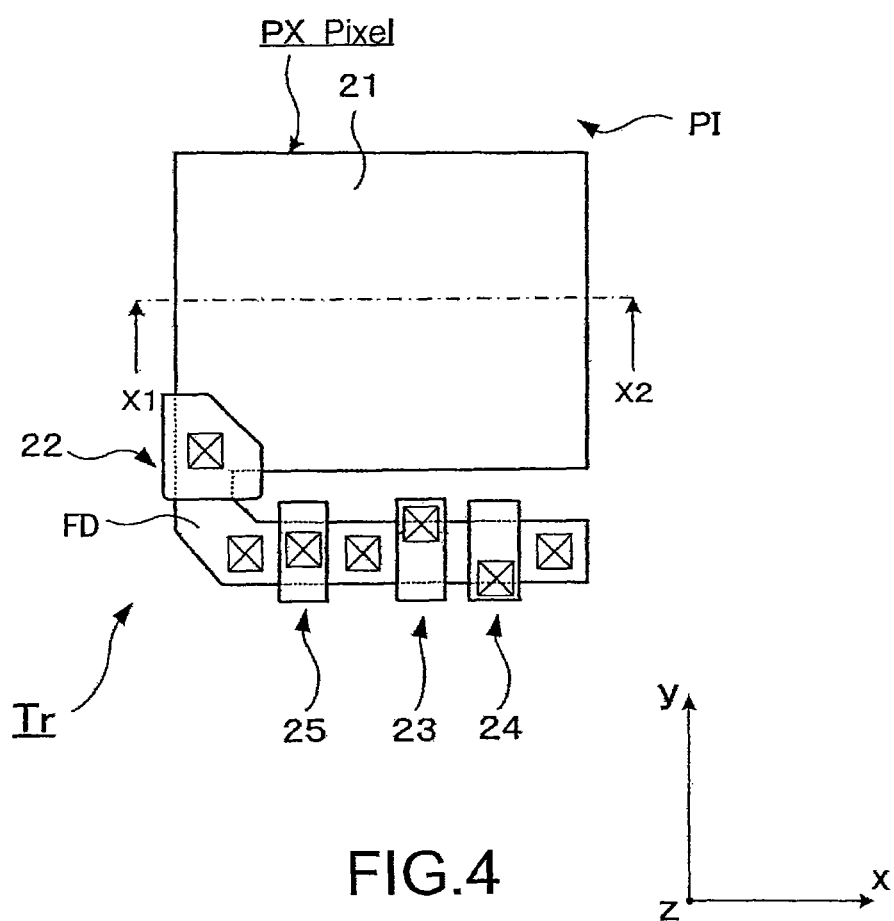
FIG. 4 is a diagram showing a main portion of the sensor substrate 100 according to the embodiment.
Figure 5:
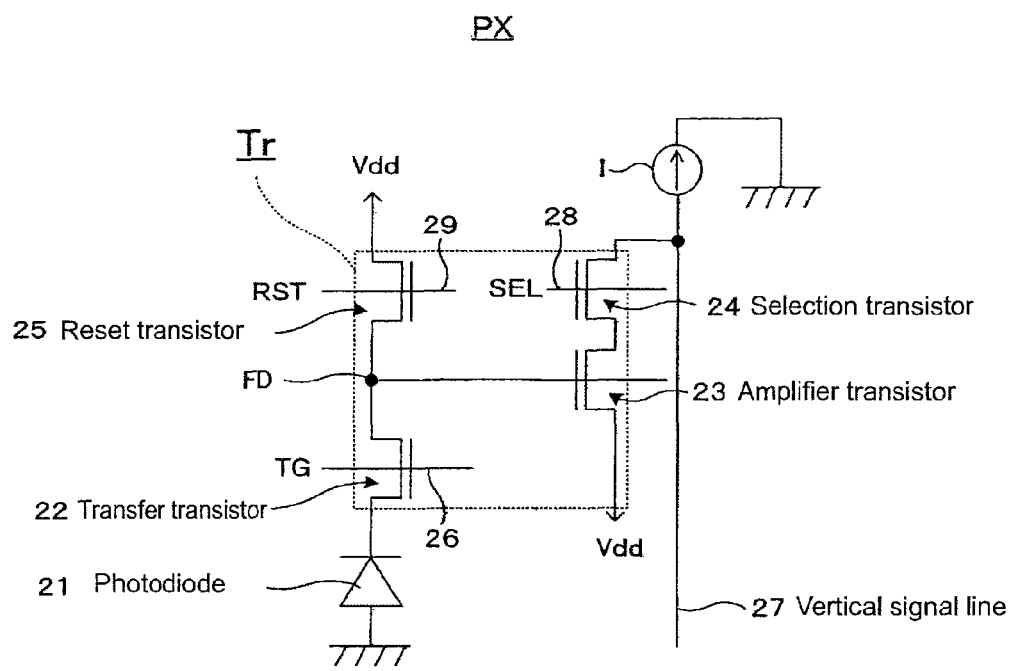
FIG. 5 is a diagram showing the main portion of the sensor substrate 100 according to the embodiment.
Figure 6:
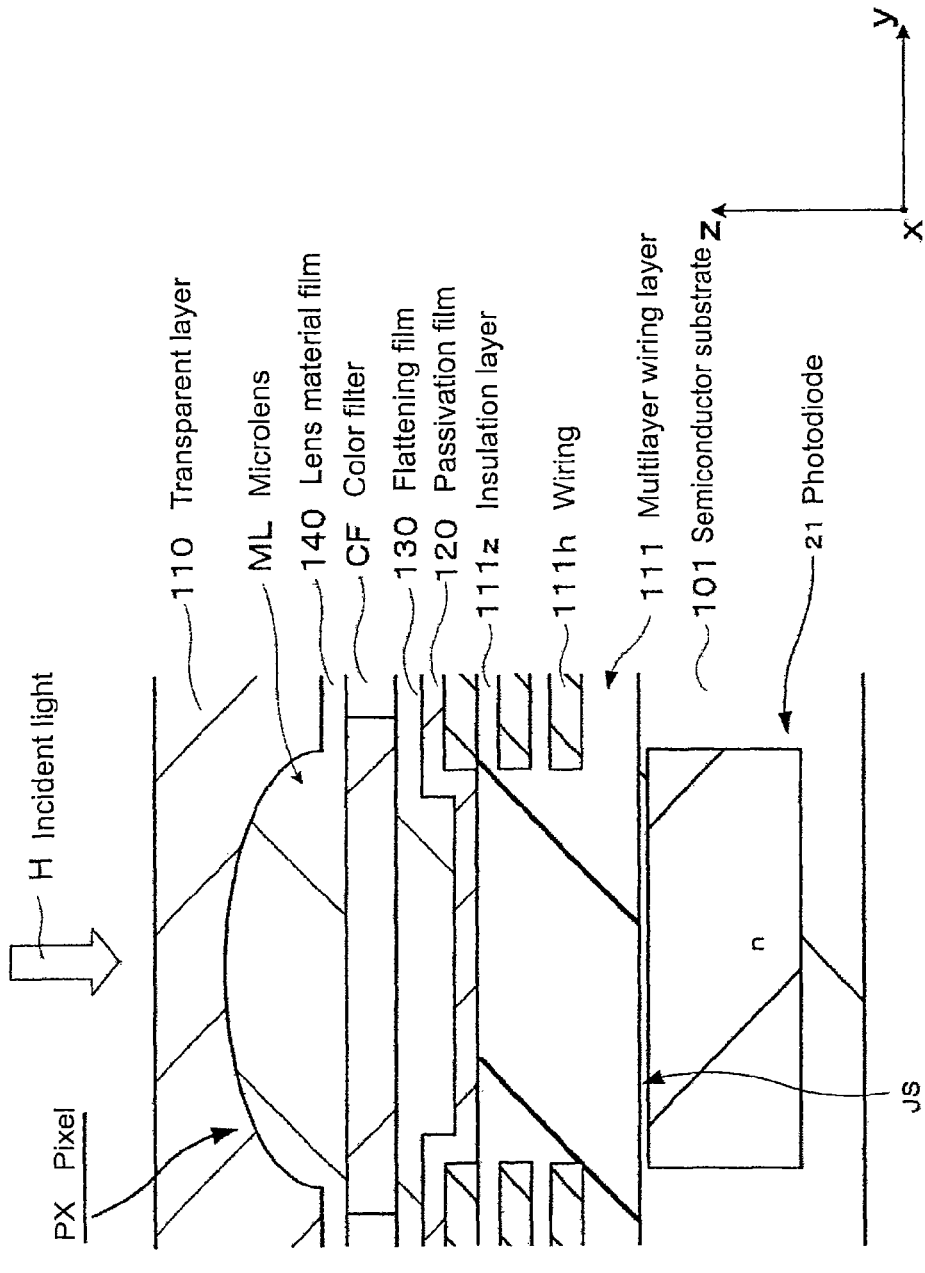
FIG. 6 is a diagram showing the main portion of the sensor substrate 100 according to the embodiment.

FIGS. 4 to 6 are diagrams showing a main portion of the sensor substrate 100 according to the embodiment.

FIG. 4 schematically shows an upper surface of a portion on which the pixels PX are provided in the pixel area PA. Then, FIG. 5 shows a circuit configuration of the pixels PX. Subsequently, FIG. 6 schematically shows a cross-section of the pixels PX. Specifically, FIG. 6 shows the cross-section taken along the line X1-X2 shown in FIG. 4.

As shown in FIGS. 4 and 5, in the pixel area PA, the pixels PX include a photodiode 21 and a pixel transistor Tr.

As shown in FIG. 6, in the pixel PX, the photodiode 21 is provided within the semiconductor substrate 101. Although not shown in FIG. 6, the pixel transistor Tr is provided on the front surface of the semiconductor substrate 101 (upper surface in FIG. 6) as shown in FIGS. 4 and 5. Then, as shown in FIG. 6, a multilayer wiring layer 111 is provided so as to cover the pixel transistor Tr. Then, elements such as a color filter CF and the microlens ML are provided above the multilayer wiring layer 111.

In the pixel PX, the incident light H is incident from above and the photodiode 21 receives it on a light receiving surface JS through each unit. That is, the sensor substrate 100 of the present embodiment has a "front surface illumination type" CMOS image sensor.

Although not shown in the drawings, in the surrounding area SA (see FIG. 2), semiconductor elements (not shown) such as transistors constituting the above peripheral circuits are provided on the front surface (upper surface) of the semiconductor substrate 101. Then, the multilayer wiring layer 111 is provided so as to cover the semiconductor elements (not shown).

The respective elements constituting the sensor substrate 100 will be described in details.

(a) Photodiode 21

A plurality of photodiodes 21 are disposed to correspond to the plurality of pixels PX shown in FIG. 2. That is, on the imaging surface (xy plane), the photodiodes 21 are aligned in each of the horizontal direction x and the vertical direction y orthogonal to the horizontal direction x.

As shown in FIG. 4, each photodiode 21 is provided in a region partitioned by a pixel isolation portion PI isolating the plurality of pixels PX from each other. Then, the pixel transistor Tr is provided with a portion adjacent to the photodiode 21.

As shown in FIG. 5, an anode of the photodiode 21 is grounded, and thus the accumulated signal charge (here, electrons) is read by the pixel transistor Tr, and is outputted as an electric signal to a vertical signal line 27.

As shown in FIG. 6, the photodiode 21 includes an n-type charge storage area, and a p-type hole storage area is provided on upper and lower surface sides of the n-type charge storage area. That is, the photodiode 21 is formed in a so-called HAD (Hall Accumulated Diode) structure.

(b) Pixel Transistor Tr

A plurality of pixel transistors Tr are disposed to correspond to the plurality of pixels PX shown in FIG. 2.

As shown in FIGS. 4 and 5, each pixel transistor Tr includes a transfer transistor 22, an amplifier transistor 23, a selection transistor 24, and a reset transistor 25 and reads the signal charge from the photodiode 21 and outputs the same as the electric signal. For example, as shown in FIG. 4, the pixel transistor Tr is provided so as to be positioned below the photodiode 21 in the imaging surface (xy plane).

Although not shown in FIG. 6, each of the transistors 22 to 25 constituting the pixel transistor Tr is provided on the upper surface (front surface) of the semiconductor substrate 101 as described above. For example, each of the transistors 22 to 25 is an N-channel MOS transistor, and each gate is formed using, for example, polysilicon. Then, each of the transistors 22 to 25 is covered by the multilayer wiring layer 111.

(b-1) Transfer Transistor 22

As shown in FIGS. 4 and 5, in the pixel transistor Tr, the transfer transistor 22 is configured so as to transfer the signal charge created in the photodiode 21 to a floating diffusion FD.

Specifically, as shown in FIGS. 4 and 5, the transfer transistor 22 is provided between a cathode of the photodiode 21 and the floating diffusion FD. Then, in the transfer transistor 22, a transfer line 26 is electrically connected to the gate. In the transfer transistor 22, a transmission signal TG is supplied from the transfer line 26 to the gate, thereby transferring the signal charge accumulated in the photodiode 21 to the floating diffusion FD.

(b-2) Amplifier Transistor 23

As shown in FIGS. 4 and 5, in the pixel transistor Tr, the amplifier transistor 23 is configured so as to amplify and output the electric signal transformed from the charge to the voltage in the floating diffusion FD.

Specifically, as shown in FIG. 4, the amplifier transistor 23 is provided between the selection transistor 24 and the reset transistor 25. In this case, as shown in FIG. 5, in the amplifier transistor 23, the gate is electrically connected to the floating diffusion FD. Moreover, in the amplification transistor 23, a drain is electrically connected to a power supply line Vdd and a source is electrically connected to the selection transistor 24. The amplifier transistor 23 is supplied with constant current from a constant-current source I when the selection transistor 24 is selected so as to be turned on, and is operated as a source follower. Accordingly, in the amplifier transistor 23, a selection signal is supplied to the selection transistor 24, and therefore the electric signal transformed from the charge to the voltage is amplified in the floating diffusion FD.

(b-3) Selection Transistor 24

In the pixel transistor Tr, the selection transistor 24 is configured to output the electric signal outputted by the amplifier transistor 23 to the vertical signal line 27 when the selection signal is inputted, as shown in FIGS. 4 and 5.

Specifically, as shown in FIG. 4, the selection transistor 24 is provided so as to be adjacent to the amplifier transistor 23. Moreover, as shown in FIG. 5, in the selection transistor 24, the gate is connected to an address line 28 to be supplied with the selection signal. Then, the selection transistor 24 turns on upon being supplied with the selection signal, and outputs the output signal amplified by the amplifier transistor 23 as described above to the vertical signal line 27.

(b-4) Reset Transistor 25

In the pixel transistor Tr, as shown in FIGS. 4 and 5, the reset transistor 25 is configured so as to reset a gate electric potential of the amplifier transistor 23.

Specifically, as shown in FIG. 4, the reset transistor 25 is provided so as to be adjacent to the amplifier transistor 23. As shown in FIG. 5, in the reset transistor 25, the gate is electrically connected to a reset line 29 to be provided with the reset signal. Moreover, in the reset transistor 25, the drain is electrically connected to the power supply line Vdd and the source is electrically connected to the floating diffusion FD. Then, when the reset signal is supplied from the reset line 29 to the gate, the reset transistor 25 resets the gate electric potential of the amplifier transistor 23 to a power supply voltage through the floating diffusion FD.

In the above description, the transfer line 26, the address line 28, and the reset line 29 are wired so as to be connected to the gates of the respective transistors 22, 24, and 25 of the plurality of pixels PX aligned in the horizontal direction x (line direction). Therefore, the operations of the respective transistors 22, 23, 24, and 25 are concurrently performed with respect to the pixels PX of one line.

(c) Multilayer Wiring Layer 111

As shown in FIG. 6, the multilayer wiring layer 111 is provided on the front surface of the semiconductor substrate 101.

The multilayer wiring layer 111 includes a wiring 111*h* and an insulation layer 111*z*, and is formed so that the wiring 111*h* is electrically connected to each element in the insulation layer 111*z*. The multilayer wiring layer 111 is formed by alternately stacking the insulation layer 111*z* and the wiring 111*h*. For example, the wiring 111*h* is formed using a metallic conductive material such as aluminum (Al) or copper (Cu). Moreover, the insulation layer 111*z* is formed using an insulating material such as silicon oxide.

In this case, in the pixel area PA, each wiring 111*h* is stacked and formed so as to function as each wiring such as the transfer line 26, the address line 28, the vertical signal line 27, and the reset line 29, which are shown in FIG. 5. For example, each wiring 111*h* is provided in the boundary portion between the pixels PX and is electrically connected by a via-hole (not shown) suitably.

Meanwhile, in the surrounding area SA, each wiring 111*h* is suitably electrically connected to each semiconductor element (not shown) constituting the peripheral circuit.

Then, as shown in FIG. 6, a passivation film 120 and a flattening film 130 are provided on the upper surface of the multilayer wiring layer 111. For example, the passivation film 120 is formed using silicon nitride (SiN). Moreover, for example, the flattening film 130 is formed using an organic material such as resin. The flattening film 130 is provided to flatten a concave and convex surface on which the passivation film 120 is formed.

(d) Color Filter CF

As shown in FIG. 6, in the pixel area PA, the color filter CF is provided on an upper surface of the flattening film 130.

FIG. 7 is a diagram showing the color filter CF according to the first embodiment. FIG. 7 shows an upper surface of the color filter CF.

As shown in FIG. 7, the color filter CF includes a red filter layer CFR, green filter layers CFG, and a blue filter layer CFB.

In the color filter CF, the red filter layer CFR has a high optical transmittance in a wavelength region (for example, 625 to 740 nm) corresponding to red, and is configured to color the incident light H with red and transmit the light onto the light receiving surface JS.

The green filter layers CFG have a high optical transmittance in a wavelength region (for example, 500 to 565 nm) corresponding to green, and are configured to color the incident light H with green and transmit the light onto the light receiving surface JS. The blue filter layer CFB has a high optical transmittance in a wavelength region (for example, 450 to 485 nm) corresponding to blue, and is configured to color the incident light H with blue and transmit the light onto the light receiving surface JS.

The red filter layer CFR, the green filter layers CFG, and the blue filter layer CFB are adjacent to each other, and each one thereof corresponds to each of the plurality of pixels PX.

In this case, as shown in FIG. 7, the red filter layer CFR, the green filter layers CFG, and the blue filter layer CFB are disposed to be aligned in a Bayer array. That is, the plurality of green filter layers CFG are disposed to be aligned in a checkered pattern in the diagonal direction. Then, the red filter layer CFR and the blue filter layer CFB are disposed to be aligned in the diagonal direction of the plurality of green filter layers CFG.

For example, the color filter layers CFR, CFG, and CFB are formed by that a coated film is formed by coating a coating liquid, which includes a color pigment and a photoresist resin, in a coating method such as a spin coat method, and then patterns are formed on the coated film by using a lithography technique.

Thus, the color filter CF is configured so that different colors of light transmit therethrough between the pixels PX aligned adjacently to each other in the horizontal direction x and the vertical direction y.

The color filter CF may be configured by a complementary color filter including yellow, magenta, and cyan in addition to a primary color filter including RBG.

(e) Microlens ML

As shown in FIG. 6, in the pixel area PA, the microlens ML is provided on an upper surface of the color filter CF. The microlens ML is provided corresponding to the pixels PX in the pixel area PA.

The microlens ML is a convex lens protruding upwards in a convex shape and is configured to concentrate the incident light H to the photodiode 21. That is, the microlens ML is formed such that the center is thicker than the rim, in a direction z perpendicular to the light receiving surface JS.

For example, the microlens is formed using a high refractive index material having a refractive index higher than 1.5. For example, the microlens is formed using SiN and the like as the high refractive index material. The microlens is formed, for example, by forming a resist film having lens shapes on a lens material film and subsequently performing etch-back processing thereon. Otherwise, the microlens ML may be formed by forming patterns on a photosensitive resin film through a photolithography technique and subsequently deforming the patterns in lens shapes through reflow processing.

Then, as shown in FIG. 6, in the pixel area PA, the transparent layer 110 is provided so as to cover and flatten the upper surface of the microlens ML. In the transparent layer 110, a material constituting the microlens ML is also formed using a low refractive index material having a low refractive index. For example, the transparent layer 110 is formed using materials such as porous silica (n=equal to or less than 1.2), fluorine compound MgF and the like (n=equal to or less than 1.2), silicon resin-based (n=1.3 to 1.4), and siloxane resin-based. The transparent layer 110 has a thickness, for example, about 10 nm to 2 μm and is suitably as thin as possible.

(B) Cover Glass 300

The cover glass 300 will be described.

As shown in FIG. 2, in the solid-state imaging apparatus 1, the cover glass 300 includes a glass substrate 301. The glass substrate 301 has a thickness, for example, about 10 μm to 2 mm and is suitably as thin as possible. Then, the glass substrate 301 is bonded to the sensor substrate 100 by the adhesive layer 501. The adhesive layer 501 has a thickness, for example, about 1 μm to 500 μm and is suitably as thin as possible.

In the glass substrate 301, as shown in FIG. 2, a diffraction grating 601 is formed on the upper surface which is the opposite side to the lower surface facing the sensor substrate 100.

As shown in FIG. 2, the diffraction grating 601 is provided over the whole upper surface of the glass substrate 301. That is, in the glass substrate 301, the diffraction grating 601 is formed in a region corresponding to the pixel area PA of the sensor substrate 100 and a region corresponding to the surrounding area SA.

Figure 8:
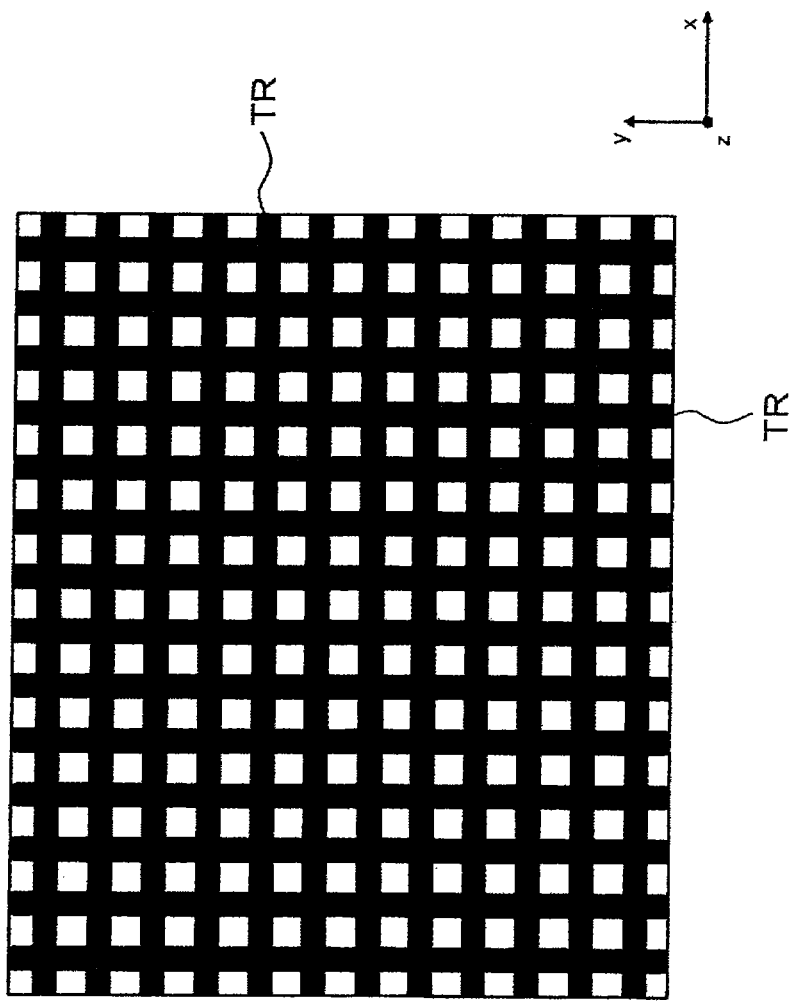
FIG. 8 is a top view showing a diffraction grating 601 according to the first embodiment.

FIG. 8 is a top view showing the diffraction grating 601 according to the first embodiment.

As shown in FIG. 8, the diffraction grating 601 has a grid shaped concave and convex pattern, for example.

For example, the diffraction grating 601 is formed by processing the upper surface of the glass substrate 301 so that grooves TR parallel to an x direction are periodically aligned and grooves TR parallel to a y direction are periodically aligned.

Besides the above grid pattern, the diffraction grating 601 may be configured in various patterns. For example, the diffraction grating 601 may be formed by symmetrically aligning, as an axis, a center point of a plurality of circular grooves having different diameters. That is, the diffraction grating 601 may be formed by providing a plurality of grooves in concentric circle-shaped patterns having different diameters.

In the present embodiment, the diffraction grating 601 is a transmission type and is provided so that the incident light H which is incident on the plurality of pixels PX periodically arranged in the pixel area PA of the semiconductor substrate 101 is reflected and the light which is incident on the diffraction grating 601 as the reflected diffraction light is diffracted and transmitted therethrough.

Figure 9:
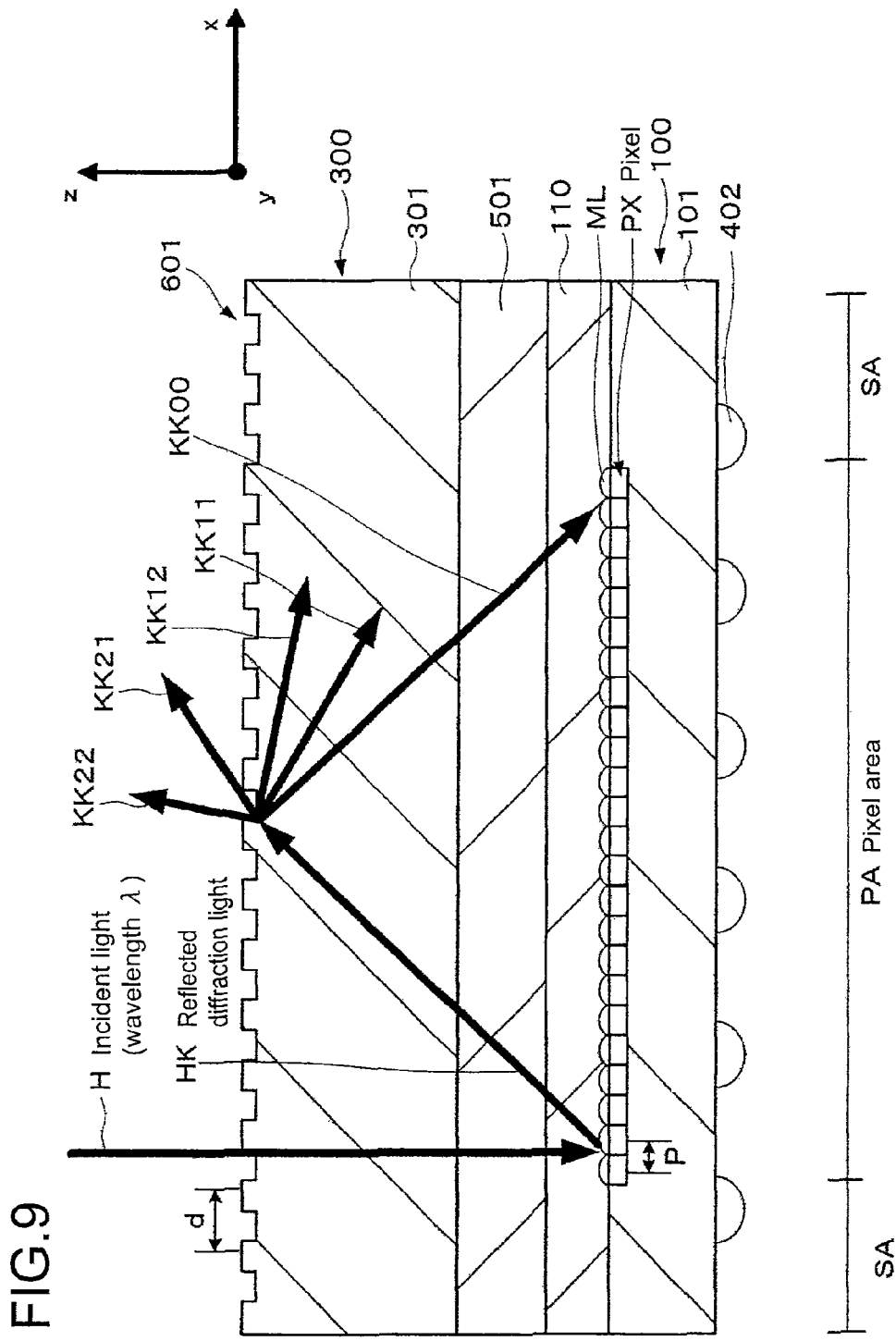
FIG. 9 is a cross-sectional view showing a state of light according to the first embodiment.

FIG. 9 is a cross-sectional view showing a state of light according to the first embodiment.

Figure 10:
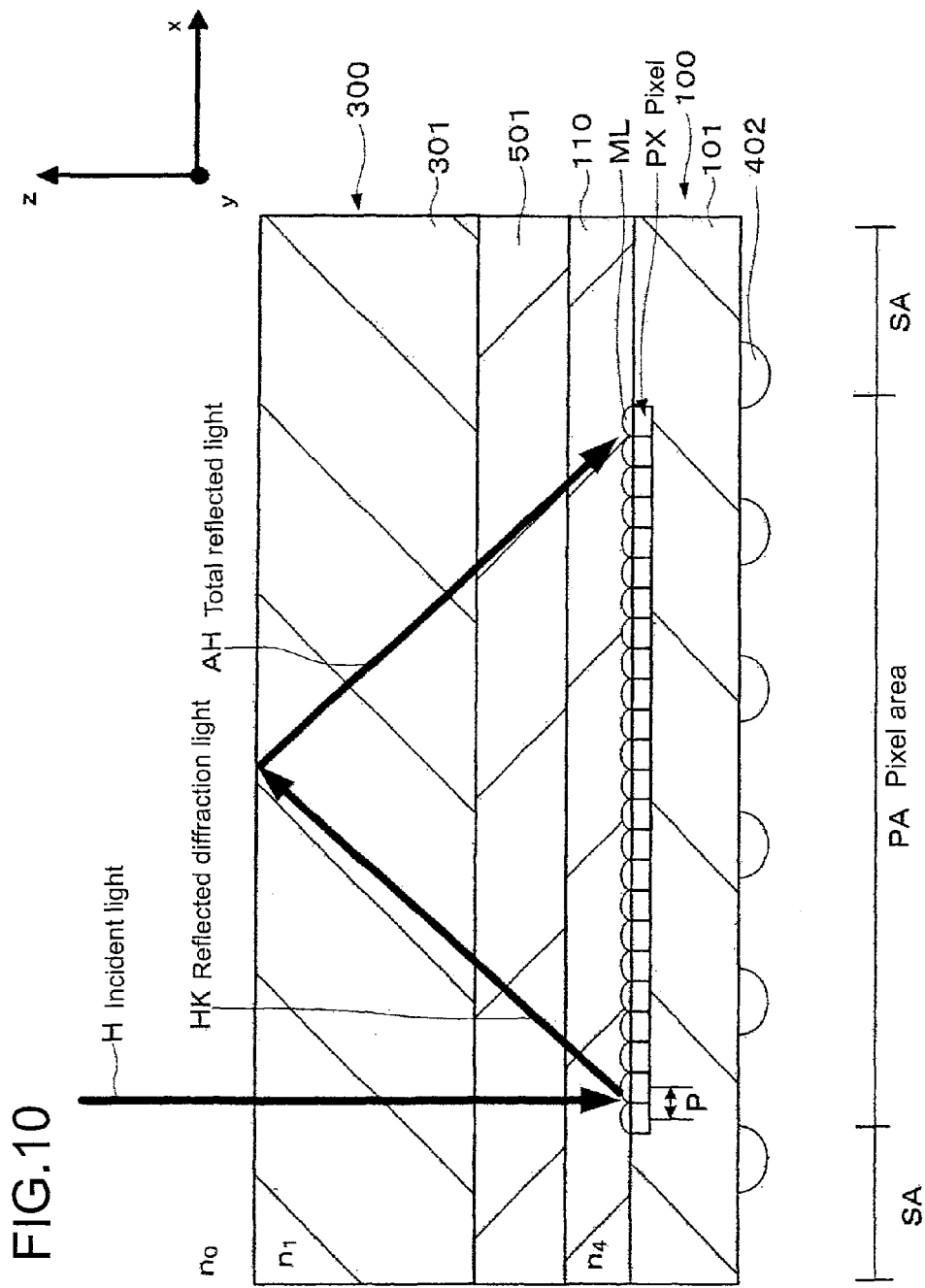
FIG. 10 is a cross-sectional view showing a state of light in a case where the diffraction grating is not provided.

On the other hand, FIG. 10 is a cross-sectional view showing a state of light in a case where the diffraction grating is not provided.

As shown in FIGS. 9 and 10, in the upper surface side of the semiconductor substrate 101, the incident light H which is incident from above is diffracted and some of the incident light H is reflected above as a reflected diffraction light HK. For example, when the incident light H is incident, from above as a subject image, to the periodic structures such as the microlens ML periodically disposed corresponding to each of the plurality of pixels PX, the incident light H is diffracted by the periodic structures and some of the incident light H is reflected above as a reflected diffraction light. For example, the light reflected on the front surface of the microlens ML and the semiconductor substrate 101 becomes the reflected diffraction light HK.

The reflected diffraction light HK is directed upwardly and is incident on elements such as the cover glass 300.

In this case, the reflected diffraction light HK is directed from the cover glass 300 having a high refractive index to a air layer having a low refractive index disposed above the cover glass 300. Therefore, as shown in FIG. 10, in some cases, the reflected diffraction light HK is totally reflected on an interface between the cover glass 300 and air above the cover glass 300 and is re-incident on the pixel PX as total reflected light AH. Accordingly, when the total reflected light AH having strong light intensity is incident on the pixel PX, a ghost (flare) occurs on a captured image, thereby deteriorating image quality.

For example, when the incident light H having a wavelength of 600 nm is incident in a case where the units are provided under the following conditions, a total reflection angle is 41.26°. Then, 3-order diffraction light among the reflected diffraction light HK has a diffraction angle of 42.71° which is larger than the total reflection angle. Therefore, the 3-order diffraction light is totally reflected on the interface between the cover glass 300 and the air. Then, the total reflected light AH is incident on a position about 0.94 mm (540 pixels PX) away from a position at which the incident light H is incident in a forward path. Therefore, as described above, the ghost (flare) occurs on the captured image, so that the image quality may be deteriorated.

refractive index of cover glass 300: 1.52
refractive index of adhesive layer 501: 1.52
refractive index of transparent layer 110: 1.52
thickness of cover glass 300: 500 μm
thickness of adhesive layer 501: 10 μm
thickness of transparent layer 110: 1 μm
pitch P of pixels PX: 1.75 μm As shown in FIG. 9, also in the present embodiment, some of the reflected diffraction light HK is reflected as 0-order diffraction light KK00 and can be incident on the pixel PX under the condition that the total reflected light AH is generated on the interface between the cover glass 300 and the air.

However, in the present embodiment, as shown in FIG. 9, the reflected diffraction light HK is dispersed as ±1- and 2-order diffraction light KK11, KK12, KK21, and KK22 by the diffraction grating 601. Therefore, light intensity re-incident on the pixel PX is decreased.

For example, in the case where the diffraction grating 601 is formed under the following conditions, the reflected diffraction light HK incident on the diffraction grating 601 at an incident angle of 42.71° is dispersed into the following diffraction light of a diffraction angle by the diffraction grating 601.

grating pitch of diffraction grating 601: 2.2 μm
diffraction angle of +1-order diffraction light: 43.2°
diffraction angle of −1-order diffraction light: 23.4°
diffraction angle of +2-order diffraction light: 58.4°
diffraction angle of −2-order diffraction light: 13.3°

Therefore, although the 0-order diffraction light KK00, the +1-order diffraction light KK11, and the +2-order diffraction light KK12 are totally reflected, the −1-order diffraction light KK21 and the −2-order diffraction light KK22 are not reflected on the interface between the cover glass 300 and the air and are refracted above the interface and are transmitted therethrough. As a result, the light intensity incident on the pixel PX is decreased. Although not shown in the drawings, the reflected diffraction light HK is also diffracted into 3 or higher order diffraction light, and some of the light is transmitted above the interface between the cover glass 300 and the air.

Therefore, even if the ghost (flare) occurs on the captured image, the ghost (flare) is less noticeable and deterioration of the image quality can be suppressed.

In the case described above, it is suitable that the diffraction grating 601 has a grating pitch of 3 μm or less. In the case of the grating pitch of 3 μm or higher, when the incident light H having a wavelength of 650 nm is incident, the light having a total reflection angle of 41.28° is difficult to be emitted to the air layer by diffraction due to the diffraction grating (see Expression (d3) later described). Therefore, in this case, the ghost (flare) may occur by the total reflection.

When the respective elements are configured to satisfy the following Expression (A), in the case where the diffraction grating 601 as described in the present embodiment is not provided, the total reflection occurs on the interface between the cover glass 300 and the air. Therefore, in this case, similarly to the present embodiment, it is suitable that the diffraction grating 601 is provided so that the diffraction grating 601 diffracts and transmits components on which the reflected diffraction light HK is totally reflected.

$$1 \leq \left| \frac{m_1 \lambda}{n_0 P} - \frac{n_4}{n_0} \sin\theta_4 \right| \quad (A)$$

Figure 11:
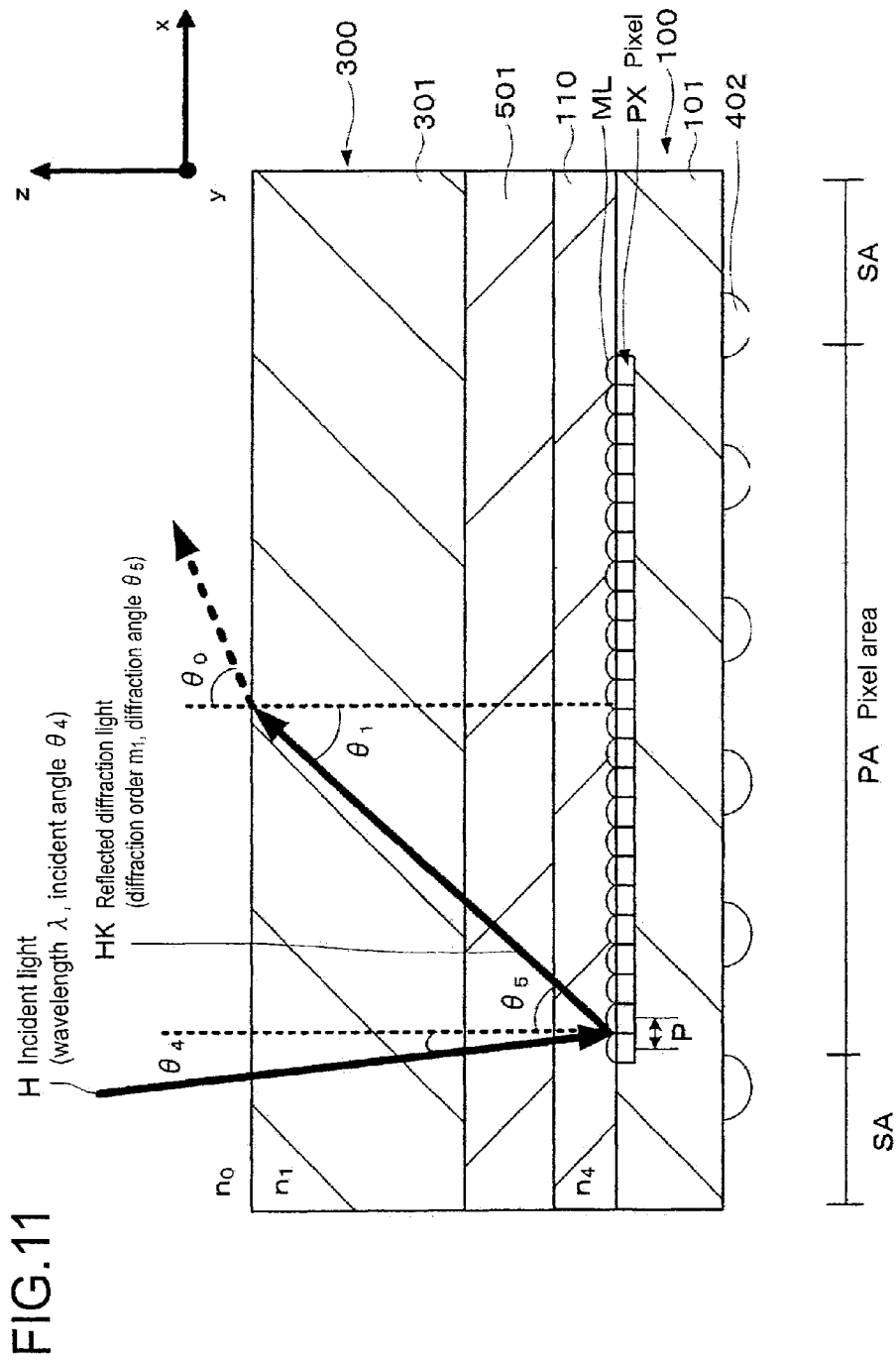
FIG. 11 is a diagram showing factors constituting Expression (A) according to the first embodiment.

FIG. 11 is a diagram showing factors constituting Expression (A) according to the first embodiment.

The respective factors shown in FIG. 11 are as follows.

$\lambda$: wavelength of incident light H (center wavelength of light received by pixel PX)
$n_0$: refractive index of layer (air layer) positioned above cover glass 300
$n_1$: refractive index of cover glass 300
$n_4$: refractive index of transparent layer 110 covering microlens ML
P: pixel pitch of plurality of pixels PX
$\theta_0$: emission angle of light emitted from interface between cover glass 300 and air layer
$\theta_1$: incidence angle of light incident on interface between cover glass 300 and air layer
$\theta_4$: incidence angle of incident light H incident on pixel PX (angle at which optical axis of external lens is inclined relative to axis perpendicular to surface on which pixel PX is provided)
$\theta_5$: diffraction angle of reflected diffraction light HK by pixel PX $m_1$: diffraction order ($m_1=\pm1, \pm2, \ldots$) of reflected diffraction light HK by pixel PX Expression (A) is derived using the following Expression (a1) according to the Snell's law and expression of diffraction (a2) by the pixel PX.

$$n_0 \sin\theta_0 = n_1 \sin\theta_1 \quad (a1)$$

$$n_4(\sin\theta_4 \pm \sin\theta_5) = \frac{m_1 \lambda}{p} \quad (a2)$$

In FIG. 11, in the case of $n_4=n_1$, $\theta_1=\theta_5$, Expression (a1) is the following Expression (a3).

$$n_0 \sin\theta_0 = n_4 \sin\theta_5 \quad (a3)$$

Moreover, Expression (a2) can be expanded to the following Expression (a4).

$$\pm n_4 \sin\theta_5 = \frac{m_1 \lambda}{p} - n_4 \sin\theta_4 \quad (a4)$$

Thus, Expression (a5) is derived from Expressions (a3) and (a4).

$$n_0 \sin\theta_0 = \frac{m_1 \lambda}{p} - n_4 \sin\theta_4 \quad (a5)$$

Therefore, when the total reflection occurs ($\theta_0 \geq 90°$), the following Expression (A) can be obtained from this Expression (a5).

In the case of $\theta_4=0°$, when the following Expression (A1) is satisfied according to Expression (A), the total reflection occurs. Moreover, in the case of $n_0=1$ (air), when the following Expression (A2) is satisfied, the total reflection occurs.

$$1 \leq \left| \frac{m_1 \lambda}{n_0 P} \right| \quad (A1)$$

$$1 \leq \left| \frac{m_1 \lambda}{P} \right| \quad (A2)$$

FIGS. 12 and 13 are diagrams showing a relationship of Expression (A) according to the first embodiment.

Figure 12A:
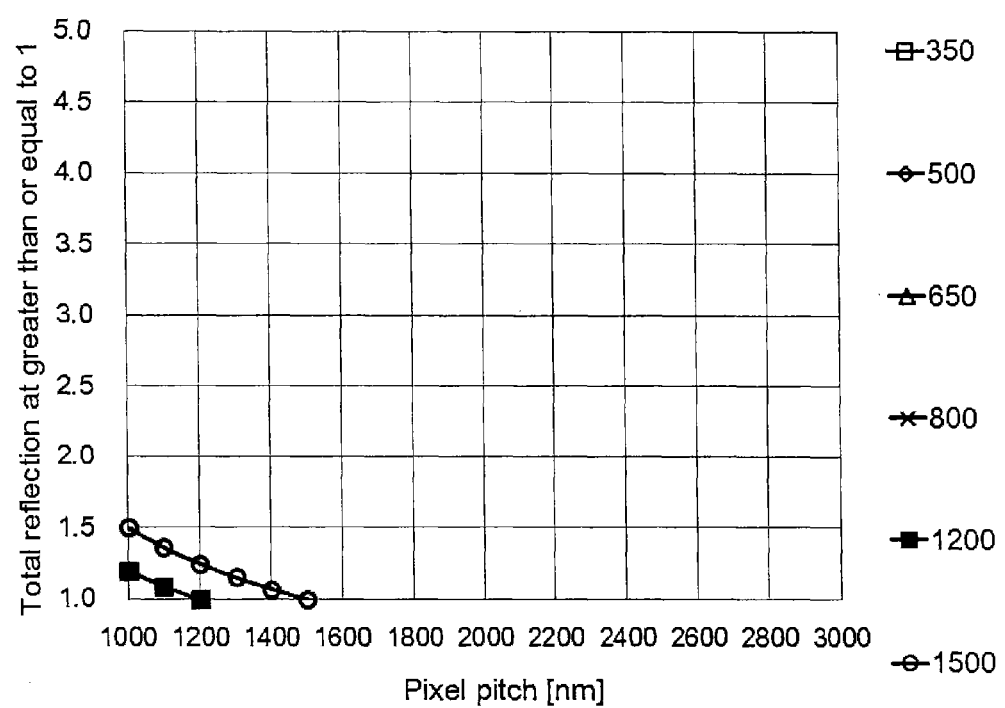
FIGS. 12A to 12C are diagrams each showing a relationship of Expression (A) according to the first embodiment.
Figure 12B:
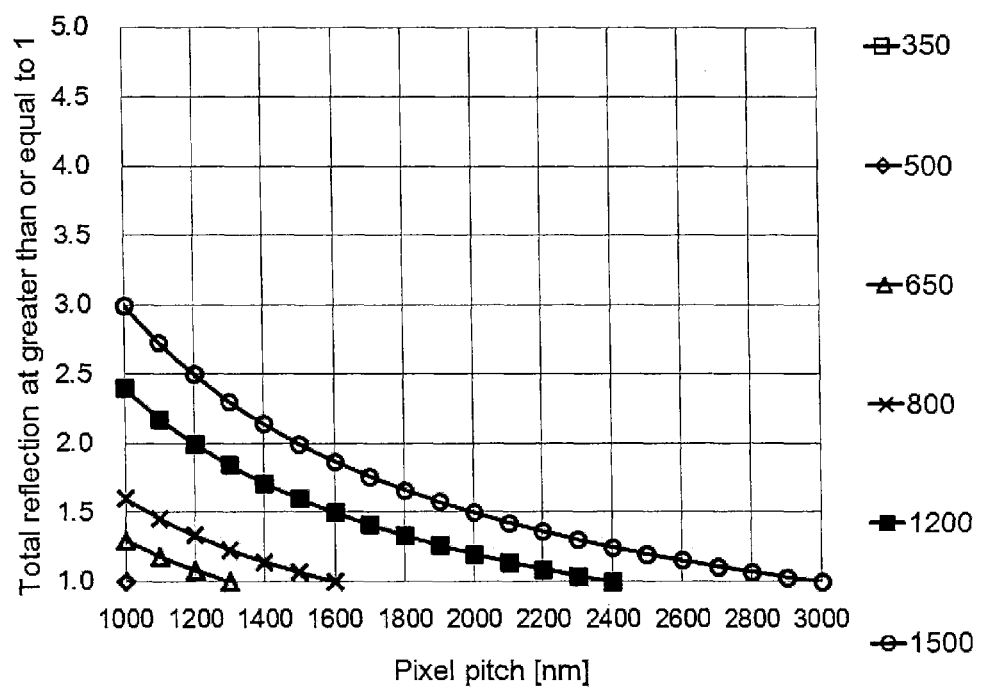
Figure 12C:
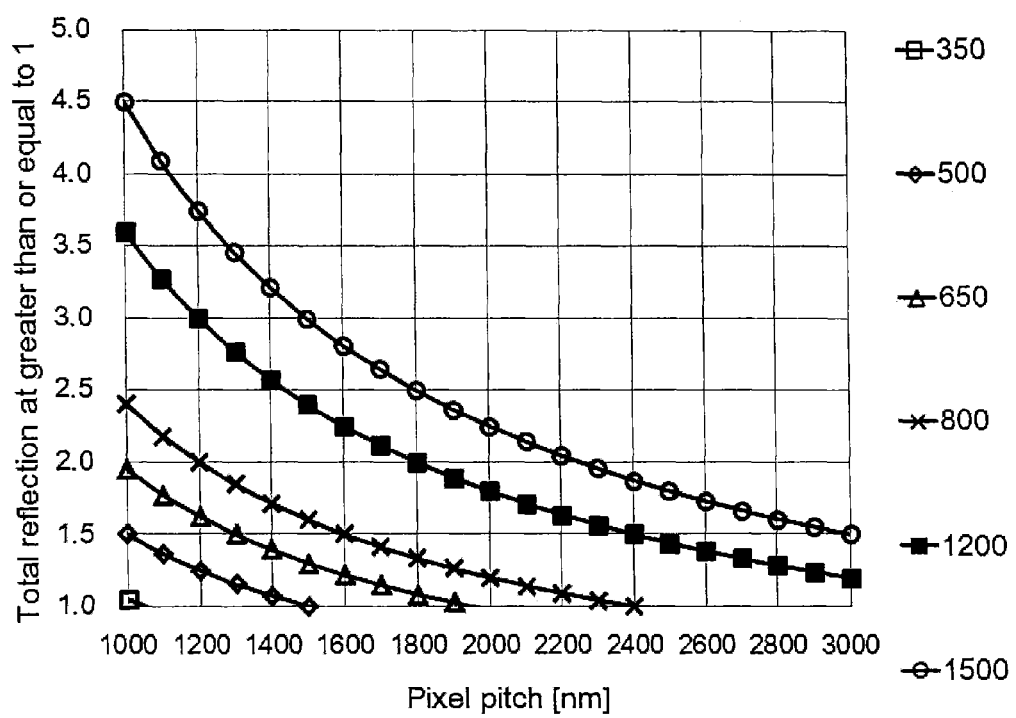
Figure 13A:
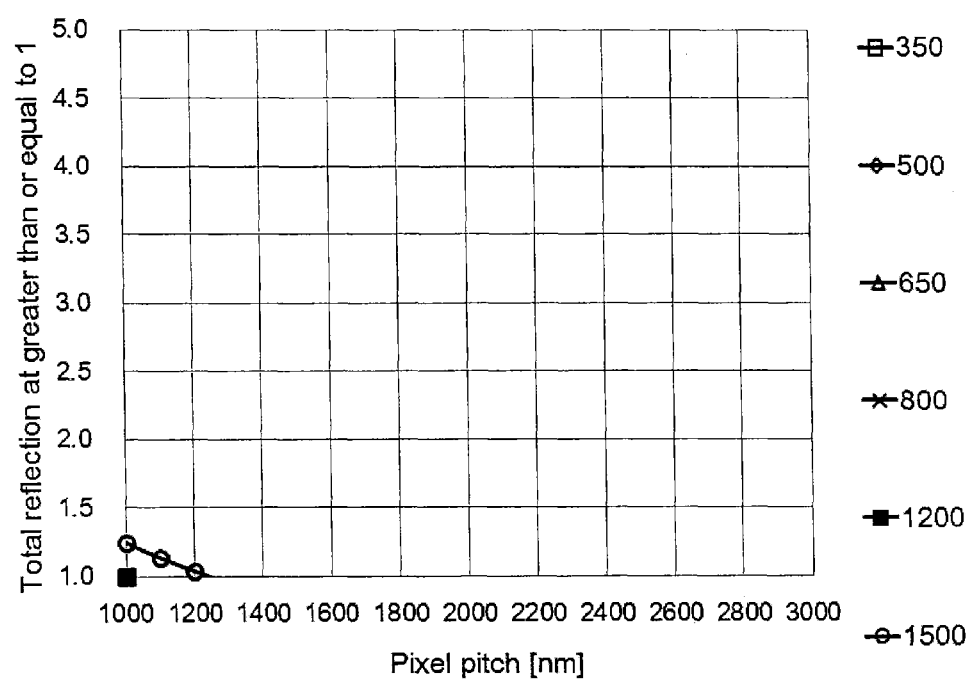
FIGS. 13A to 13C are diagrams each showing the relationship of Expression (A) according to the first embodiment.
Figure 13B:
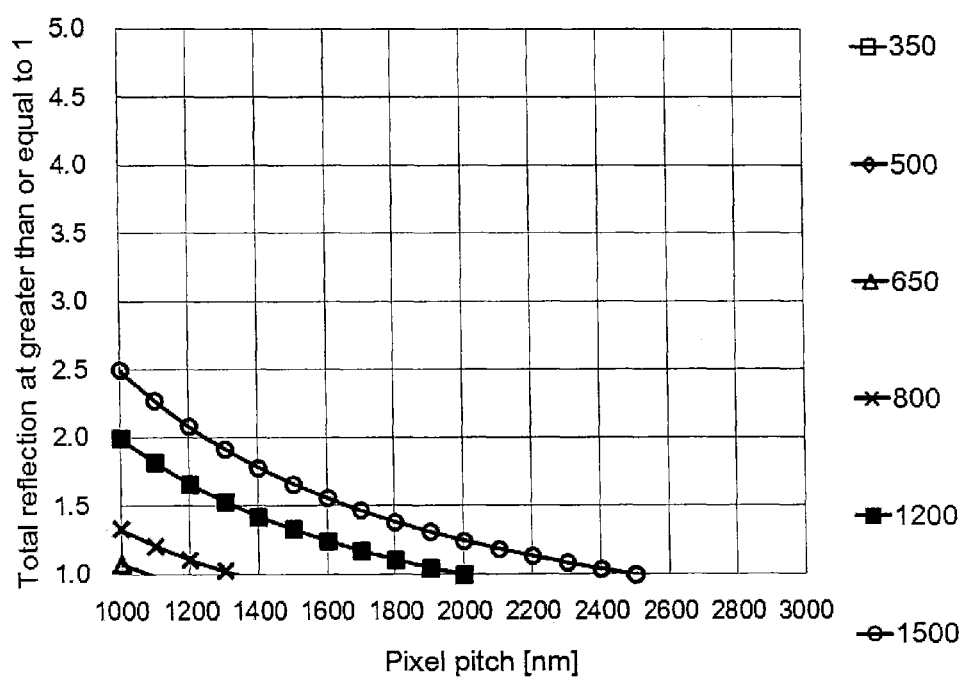
Figure 13C:
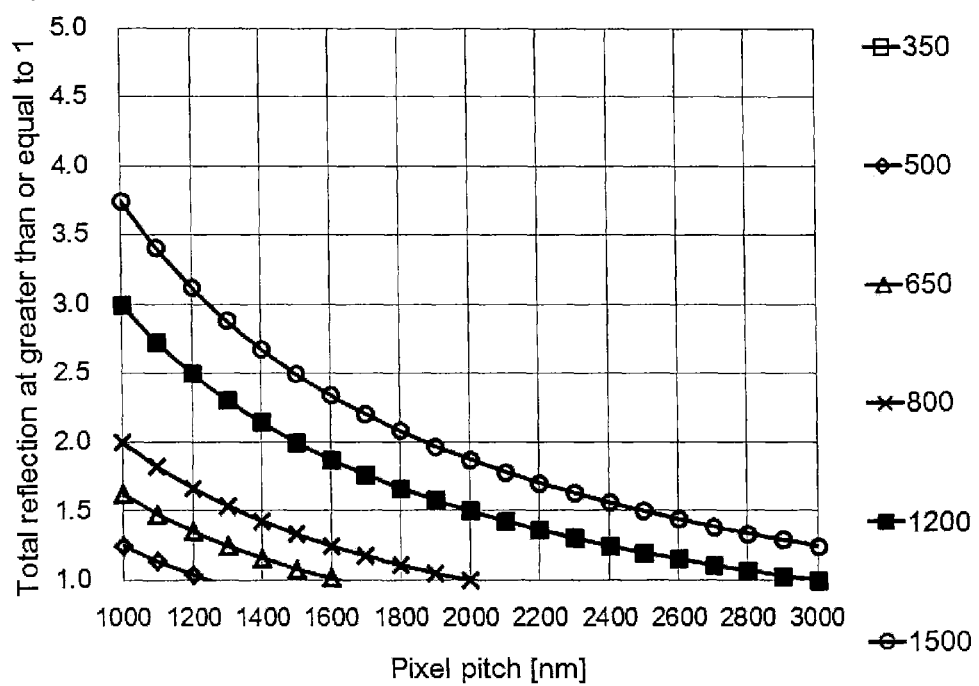

In FIGS. 12 and 13, a vertical axis shows a value of the right side of the Expression (A) and when this value is greater than or equal to 1, the total reflection occurs. A horizontal axis shows a pixel pitch P (nm). Then, FIGS. 12 and 13 show a result when the incident light H has a plurality of typical wavelengths $\lambda$. FIGS. 12A and 13A show the case where $m_1=1$, FIGS. 12B and 13B show the case where $m_1=2$, and FIGS. 12C and 13C show the case where $m_1=3$. Moreover, FIGS. 12A to 12C shows the case of $n_0=1$ (air), and FIGS. 13A to 13C shows the case of $n_0=1.2$.

According to Expression (A), it is understood that when visible light (wavelength of 400 to 650 nm) is received, the 2-order diffraction light is totally reflected in the case of the pixel pitch of 1.4 μm or less, for example. Moreover, it is understood that the 3-order diffraction light is totally reflected in the case of the pixel pitch of 2 μm or less, for example.

Otherwise, in consideration of a wavelength band (1,200 nm or less) in which silicon has sensitivity, it is understood that the 1-order diffraction light is totally reflected in the case of the pixel pitch of 1.2 μm or less. Moreover, it is understood that the 2-order diffraction light is totally reflected in the case of the pixel pitch of 2.4 μm or less, for example.

Although the diffraction light of 4 or higher diffraction orders can be totally reflected, diffraction efficiency is low and light intensity is so small that the ghost occurs less. Therefore, particularly, when the diffraction light of 3 or lower diffraction orders is totally reflected, it is suitable that the diffraction grating 601 is provided similarly to the present embodiment.

(2) Manufacturing Method

Hereinafter, a main portion of a method of manufacturing the solid-state imaging apparatus 1 will be described.

When the solid-state imaging apparatus 1 is manufactured, firstly, the sensor substrate 100 is formed. Specifically, as shown in FIG. 2, the respective elements such as the pixels PX are provided on the semiconductor substrate 101.

Otherwise, the cover glass 300 is formed. In this case, as described above, the cover glass 300 is formed by processing one surface of the glass substrate 301 to form a groove and providing the diffraction grating 601.

Next, the sensor substrate 100 and the cover glass 300 are bonded. For example, in the sensor substrate 100, the adhesive layer 501 is provided on a surface on which the cover glass 300 is bonded. Then, the cover glass 300 is aligned and bonded.

Subsequently, the bump 402 is formed, dicing is performed, and the solid-state imaging apparatus 1 is completed.

(3) Conclusion

In the present embodiment, as described above, in the sensor substrate 100, the plurality of pixels PX receiving the incident light H are arranged on the upper surface of the semiconductor substrate 101. The cover glass 300 (transparent substrate) has a lower surface facing the upper surface of the sensor substrate 100 and transmits the incident light H therethrough. The diffraction grating 601 is provided on the glass substrate 301 constituting the cover glass 300 that transmits the incident light H therethrough. Moreover, the diffraction grating 601 is formed so as to diffract the reflected diffraction light HK caused by that the incident light H is incident on the pixel area PA in which the plurality of pixels PX are arranged on the upper surface of the semiconductor substrate 101 and is diffracted (see FIG. 9).

In this case, at least some of components totally reflected on the upper surface of the cover glass 300 without the diffraction grating 601 among the reflected diffraction light HK are formed so that the diffraction grating 601 is diffracted and transmitted therethrough (see FIG. 9). That is, some of the reflected diffraction light HK is not reflected from the diffraction grating 601 to a side on which the semiconductor substrate 101 is provided, and is transmitted through the opposite side of the side on which the semiconductor substrate 101 is provided.

Therefore, as described above, in the present embodiment, it is possible to suppress the occurrence of the ghost and enhance the image quality of the captured image.

Particularly, in the present embodiment, the diffraction grating 601 is provided on the upper surface of the cover glass 300.

In this case, difference $\Delta n$ of about 0.5 between the refractive index $n_0$ of air and the refractive index $n_1$ of the cover glass 300 is obtained. Therefore, a diffraction grating 601 having a wider grating pitch can prevent the total reflection, so that it is more suitable that difficulty in manufacture of the diffraction grating 601 can be lowered.

The diffraction grating 601 of the present embodiment is a second level. Accordingly, in the diffraction light due to the diffraction grating 601, 0-order diffraction light component is about 50%, +1-order light component is about 20%, and −1-order light component is about 20%. Therefore, even when ±1-order light component is shifted by a distance equal to or greater than the pixel pitch P, it is unlikely to be viewed as a double image.

2. Second Embodiment

(1) Device Configuration or the Like

FIG. 14 is a diagram showing a main portion of a solid-state imaging apparatus according to a second embodiment. FIG. 14 shows a cross-section similarly to FIG. 2.

As shown in FIG. 14, in the present embodiment, the position at which the diffraction grating 601 is provided is different from that of the first embodiment. Except for this point and the associated points, the present embodiment is the same as the first embodiment. Therefore, a repeated description of the same parts is omitted.

In the present embodiment, unlike the case of the first embodiment, as shown in FIG. 14, the diffraction grating 601 is formed on the lower surface facing the sensor substrate 100 in the glass substrate 301.

Similarly to the case of the first embodiment, the diffraction grating 601 diffracts the reflected diffraction light caused by the incident light H which is incident on the plurality of pixels PX, and is provided so that some light among the reflected diffraction light is refracted on the upper surface of the cover glass 300 and is transmitted therethrough.

In this case, it is suitable that the refractive index difference Δn between the refractive index of the adhesive layer 501 and a refractive index of the glass substrate 301 is set larger than 0.2.

Moreover, it is suitable that the diffraction grating 601 is formed of materials whose refractive index difference Δn between the refractive index of the convex portion of the diffraction grating 601 and the refractive index of the glass substrate 301 is larger than 0.2. Otherwise, it is suitable that the diffraction grating 601 is formed so that materials whose refractive index difference Δn between the refractive index of the concave portion of the diffraction grating 601 and the refractive index of the glass substrate 301 is larger than 0.2 are filled into the concave portion of the diffraction grating 601.

For example, as the materials having the refractive index larger than that of the glass substrate 301, it is suitable to use a nitride such as SiN and form the diffraction grating 601. Moreover, as the materials having the refractive index smaller than that of the glass substrate 301, it is suitable to form the diffraction grating 601 using materials such as porous silica (n=equal to or less than 1.2), fluorine compound MgF and the like (n=equal to or less than 1.2), silicon resin-based (n=1.3 to 1.4), and siloxane resin-based.

That is, it is suitable to provide the diffraction grating 601 so that the difference between the refractive index of the materials constituting the convex portion and the refractive index of the materials filled into the concave portion is larger than 0.2.

(2) Conclusion

In the present embodiment, similarly to the case of the first embodiment, the diffraction grating 601 diffracts the reflected diffraction light HK caused by that the incident light H is incident on the pixel area PA in which the plurality of pixels PX are arranged on the upper surface of the semiconductor substrate 101 and is diffracted.

Therefore, in the present embodiment, similarly to the case of the first embodiment, it is possible to suppress the occurrence of the ghost and enhance the image quality of the captured image.

Particularly, in the present embodiment, the diffraction grating 601 is provided on the lower surface of the cover glass 300. In this case, the front surface of the glass substrate 301 has no concave and convex, so that dirt such as dust is unlikely to be adhered.

Moreover, in the present embodiment, the diffraction grating 601 is close to the imaging surface in comparison with the first embodiment. Therefore, when a light spreading width diffracted by the diffraction grating 601 in the forward path is set to about the pixel pitch, the pitch of the diffraction grating 601 can be wider than the case of the first embodiment.

Therefore, it is possible to reduce manufacturing variation of the grating pitch.

For example, when a manufacturing tolerance of the grating pitch is about 0.1 μm and the grating pitch is extremely narrow at about 1 μm, a variation of the grating pitch is 10%. However, in the case of the grating pitch of about 5 μm, the variation of the grating pitch is about 2%, so that it is possible to achieve the effect of stabilizing the diffraction angle more suitably.

3. Third Embodiment

FIG. 15 is a diagram showing a main portion of a solid-state imaging apparatus according to a third embodiment. FIG. 15 shows a cross-section similarly to FIG. 2.

As shown in FIG. 15, in the present embodiment, the position at which the diffraction grating 601 is provided is different from that of the first embodiment. Except for this point and the associated points, the present embodiment is the same as the first embodiment. Therefore, a repeated description of the same parts is omitted.

In the present embodiment, unlike the case of the first embodiment, the diffraction grating 601 is formed on the upper surface of the transparent layer 110.

Similarly to the case of the first embodiment, the diffraction grating 601 diffracts the reflected diffraction light caused by the incident light H which is incident on the plurality of pixels PX, and is provided so that some light among the reflected diffraction light is refracted on the upper surface of the cover glass 300 and is transmitted therethrough.

In the present embodiment, it is necessary to mutually differentiate the refractive index between the transparent layer 110 and the adhesive layer 501.

Therefore, for example, it is suitable to form the transparent layer 110 using low refractive index materials such as porous silica (n=equal to or less than 1.2), fluorine compound MgF and the like (n=equal to or less than 1.2), silicon resin-based (n=1.3 to 1.4), and siloxane resin-based. Moreover, for example, it is suitable that the adhesive layer 501 is formed of materials having a refractive index (n=1.5) equivalent to the glass substrate 301.

(2) Conclusion

As described above, similarly to the case of the first embodiment, the diffraction grating 601 diffracts the reflected diffraction light HK caused by that the incident light H is incident on the pixel area PA in which the plurality of pixels PX are arranged on the upper surface of the semiconductor substrate 101 and is diffracted.

Therefore, in the present embodiment, similarly to the case of the first embodiment, it is possible to suppress the occurrence of the ghost and enhance the image quality of the captured image.

Particularly, in the present embodiment, the diffraction grating 601 is provided on the lower surface of the transparent layer 110. In this case, the front surface of the glass substrate 301 has no concave and convex, so that dirt such as dust is unlikely to be adhered.

Moreover, in the present embodiment, the diffraction grating 601 is close to the imaging surface in comparison with the first embodiment. Therefore, when a light spreading width diffracted by the diffraction grating 601 in a forward path is set to about the pixel pitch, the pitch of the diffraction grating 601 can be wider than the case of the first embodiment. Therefore, the effect similarly to the second embodiment can be achieved more suitably.

4. Fourth Embodiment

FIG. 16 is a diagram showing a main portion of a solid-state imaging apparatus according to a fourth embodiment. FIG. 16 shows a cross-section similarly to FIG. 2.

As shown in FIG. 16, in the present embodiment, a first diffraction grating 601A and a second diffraction grating 601B are provided as the diffraction grating 601. Except for this point and the associated points, the present embodiment is the same as the first embodiment. Therefore, a repeated description of the same parts is omitted.

In the present embodiment, similarly to the first embodiment, the first diffraction grating 601A is provided over the whole upper surface of the glass substrate 301 as the diffraction grating 601.

Along with this, in the present embodiment, unlike the case of the first embodiment, the second diffraction grating 601B is formed on the upper surface of the transparent layer 110 as the diffraction grating 601.

The first diffraction grating 601A and the second diffraction grating 601B diffract the reflected diffraction light caused by the incident light H which is incident on the plurality of pixels PX, and is provided so that some light among the reflected diffraction light is refracted above and is transmitted therethrough.

That is, in the present embodiment, the reflected diffraction light caused by the incident light H which is incident on the plurality of pixels PX is incident on the second diffraction grating 601B and is transmitted therethrough. Further, the reflected diffraction light is incident on the first diffraction grating 601A and is transmitted therethrough. Then, some of the reflected diffraction light is transmitted above the glass substrate 301.

(2) Conclusion

As described above, in the present embodiment, similarly to the case of the first embodiment, the first diffraction grating 601A and the second diffraction grating 601B diffract the reflected diffraction light HK caused by that the incident light H is incident on the pixel area PA in which the plurality of pixels PX are arranged on the upper surface of the semiconductor substrate 101 and is diffracted.

Therefore, in the present embodiment, similarly to the case of the first embodiment, it is possible to suppress the occurrence of the ghost and enhance the image quality of the captured image.

Particularly, in the present embodiment, the first diffraction grating 601A and the second diffraction grating 601B are provided on the upper and lower surfaces of the cover glass 300, respectively, as the diffraction grating 601.

As a result, in the first diffraction grating 601A and the second diffraction grating 601B, the diffraction angle is decreased and the grating pitch can be wide. Therefore, it is possible to reduce the manufacturing variation of the grating pitch.

For example, when the manufacturing tolerance of the grating pitch is about 0.1 μm and the grating pitch is extremely narrow at about 1 μm, the variation of the grating pitch is 10%. However, in the case of the grating pitch of about 5 μm, the variation of the grating pitch is about 2%, so that it is possible to stabilize the diffraction angle.

5. Fifth Embodiment

In the present embodiment, the respective elements are designed to satisfy the following Expressions (B) and (C) and are provided in accordance with the design. Except for this point and the associated points, the present embodiment is the same as the first embodiment. Therefore, a repeated description of the same parts is omitted.

$$W = \left| \frac{L \times \left(\frac{m_2 \lambda}{n_3 d} - \frac{n_2}{n_3}\sin\theta_2\right)}{\sqrt{1 - \left(\frac{m_2 \lambda}{n_3 d} - \frac{n_2}{n_3}\sin\theta_2\right)^2}} - \frac{L \times \frac{n_2}{n_3}\sin\theta_2}{\sqrt{1 - \frac{n_2^2}{n_3^2}\sin^2\theta_2}} \right| \quad (B)$$

Where $m_2 = \pm 1$ $$W \leq P \quad (C)$$

FIG. 17 is a diagram showing factors constituting Expressions (B) and (C) according to a fifth embodiment.

The factors shown in FIG. 17 are as follows.

λ: wavelength of incident light H (center wavelength of light received by pixel PX)

$n_2$: refractive index of layer (air layer) positioned above surface on which diffraction grating 601 is provided $n_3$: refractive index of layer (glass substrate 301) positioned below surface on which diffraction grating 601 is provided d: grating pitch of diffraction grating 601

P: pixel pitch of plurality of pixels PX

L: optical distance between diffraction grating 601 and semiconductor substrate 101 (actual distance x refractive index)

$m_2$: diffraction order of diffraction light TK diffracted by diffraction grating 601 ($m_2 = \pm 1$, $\theta_2$: incidence angle of incident light H incident on surface on which diffraction grating 601 is provided (inclination angle of incident light with respect to normal of diffraction grating)

$\theta_3$: inclination angle of diffraction light TK diffracted by diffraction grating 601 (incidence angle of diffraction light with respect to normal of diffraction grating)

$\theta_3'$: refraction angle of refraction light RK (0-order light) refracted on interface of diffraction grating 601 (inclination angle of refraction light with respect to normal of diffraction grating surface)

W: shift amount of diffraction light TK (amount by which diffraction light having predetermined order ($m_2$) on surface of semiconductor substrate 101 is shifted to refraction light RK (0-order diffraction light)

RW: width when refraction light RK reaches surface of semiconductor substrate 101 from incident position (refraction light reaching width)

DW: width when diffraction light TK reaches surface of semiconductor substrate 101 from incident position (diffraction light reaching width)

Expression (B) is derived using the following diffraction Expressions (b1) to (b4). The diffraction light reaching width DW described above has a relationship of the following Expression (b2). The refraction light reaching width RW described above has a relationship of the following Expression (b3). Moreover, the refraction light reaching width RW and the diffraction light reaching width DW have a relationship of the following Expression (b4).

$$\pm \sin\theta_3 = \frac{m_2\lambda}{n_3 d} - \frac{n_2}{n_3}\sin\theta_2 \quad (b1)$$

$$DW = L \times \tan\theta_3 = L \times \left( \pm \frac{\pm \sin\theta_3}{\sqrt{1 - \sin^2\theta_3}} \right) \quad (b2)$$

$$RW = L \times \tan\theta'_3 = L \times \left( \pm \frac{\pm \sin\theta'_3}{\sqrt{1 - \sin^2\theta'_3}} \right) \quad (b3)$$

Where $$\sin\theta'_3 = \frac{n_2 \times \sin\theta_2}{n_3}$$

$$W = DW - RW \quad (b4)$$

Then, from Expressions (b1) to (b4), the shift amount W is derived by the following Expression (b5). Therefore, the following Expression (B) can be obtained from this Expression (b5).

$$|W| = \frac{L \times \left(\frac{m_2\lambda}{n_3 d} - \frac{n_2}{n_3}\sin\theta_2\right)}{\sqrt{1 - \left(\frac{m_2\lambda}{n_3 d} - \frac{n_2}{n_3}\sin\theta_2\right)^2}} - \frac{L \times \frac{n_2}{n_3}\sin\theta_2}{\sqrt{1 - \frac{n_2^2}{n_3^2}\sin^2\theta_2}} \quad (b5)$$

As shown in FIG. 17, when the incident light H is incident on the diffraction grating 601 from above, the incident light H is diffracted by the diffraction grating 601 and is emitted. Therefore, in some cases, the diffraction light TK of the other orders is incident on the pixel PX of the position which is different from the position at which the refraction light RK (0-order diffraction light) is incident. Thus, a blur is generated in the captured image and the image quality may deteriorate.

However, when the shift amount W shown in the above Expression (B) satisfies Expression (C), the shift amount W is equal to or less than the pitch P of the pixels PX. Therefore, the light which is incident on the pixel PX of the different position can be suppressed, so that deterioration of the image quality can be prevented. Particularly, ±1-order diffraction light ($m_2 = \pm 1$) has strong light intensity, so that it is suitable that the respective elements are configured so as to satisfy the above relationship.

In the case of $\theta_2 = 0°$, the following Expression (B1) is derived from Expression (B).

$$W = \left| \frac{Lm_2\lambda}{\sqrt{n_3^2 d^2 - m_2^2\lambda^2}} \right| \quad (B1)$$

Where $m_2 = \pm 1$

Figure 18:
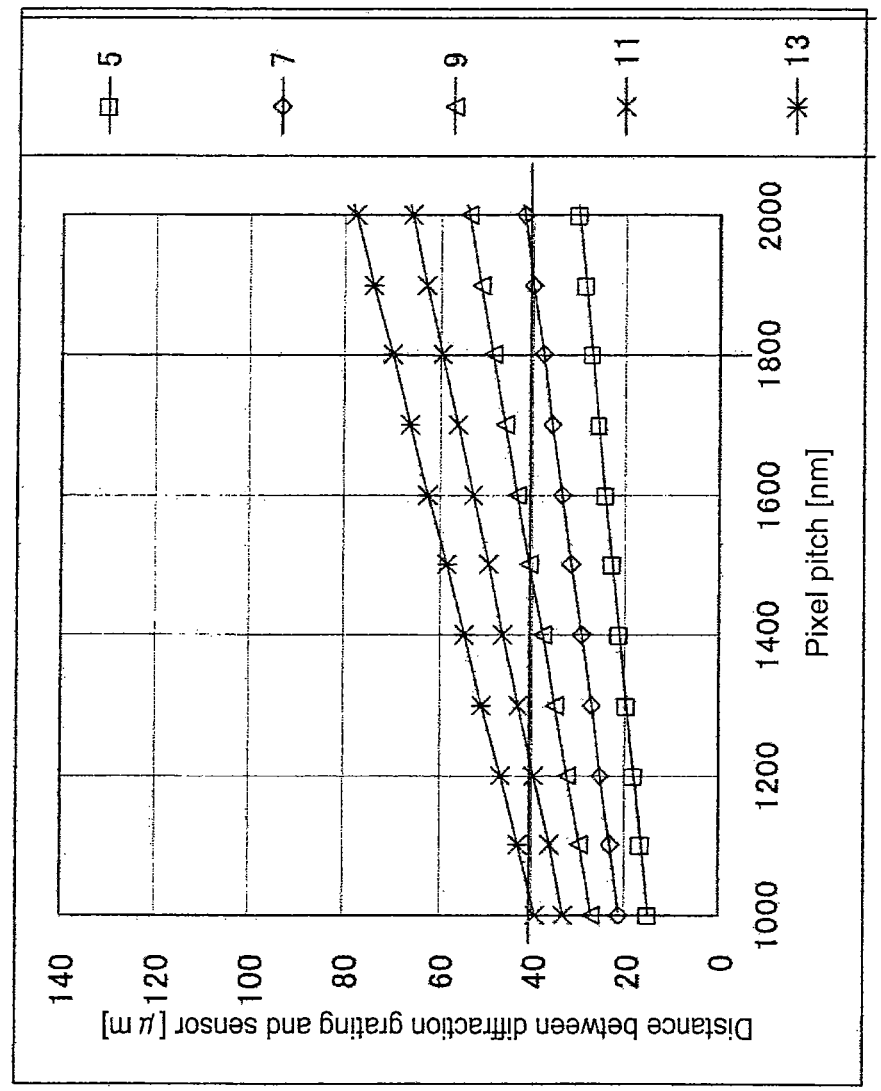
FIG. 18 is a diagram showing a relationship of Expression (B1) according to the fifth embodiment.

FIG. 18 is a diagram showing a relationship of Expression (B1) according to a fifth embodiment.

In FIG. 18, the vertical axis shows a distance L (μm) between the diffraction grating and the sensor. The horizontal axis shows the pixel pitch P (nm). Moreover, a legend shows a grating pitch d (μm).

In this case, the legend shows $m_2 = 1$, $n_3 = 1.5$, $\lambda = 500$ nm, and $\theta_2 = 0°$.

From Expression (B1), for example, it is suitable that the respective elements are provided so as to satisfy the following condition.

λ=500 nm
$n_3$=1.5
P=1.8 μm
L 40 μm
$m_2$=±1
d>about 7.5

That is, in the diffraction light TK transmitted through the diffraction grating 601 to which the incident light H is incident from above, the central axis of ±1-order diffraction light is shifted to the central axis of the refraction light (0-order diffraction light). It is suitable that the diffraction grating 601 is formed so that the shift amount W at this time is smaller than the pixel pitch P.

(2) Conclusion

As described above, in the present embodiment, similarly to the case of the first embodiment, the diffraction grating 601 diffracts the reflected diffraction light HK caused by that the incident light H is incident on the pixel area PA in which the plurality of pixels PX are arranged on the upper surface of the semiconductor substrate 101 and is diffracted.

Therefore, in the present embodiment, similarly to the case of the first embodiment, it is possible to suppress the occurrence of the ghost and enhance the image quality of the captured image.

Otherwise, in the present embodiment, as described above, the respective elements are provided to satisfy Expressions (B) and (C).

Therefore, as described above, since the light which is incident on the pixel PX of the different position can be suppressed, the blur generated in the captured image is prevented and the image quality can be more enhanced.

Particularly, in the present embodiment, the diffraction grating 601 is formed so that the shift amount W of 1-order diffraction light ($m_2 = \pm 1$) among the diffraction light TK caused by diffracting the incident light H by the diffraction grating 601 is smaller than the pixel pitch P of the plurality of pixels PX. That is, on the upper surface of the semiconductor substrate 101, the diffraction grating 601 is formed so that the shift amount W by which the central axis of the ±1-order diffraction light ($m_2 = \pm 1$) is shifted to the central axis of the refraction light (0-order diffraction light) is smaller than the pixel pitch P (W<P). In this case, ±1-order diffraction light ($m_2 = \pm 1$) having strong light intensity is not incident on other adjacent pixels, so that the blur generated in the captured image can be more suitably prevented.

Besides the above, the diffraction grating 601 may be formed so that the shift amount W of 1-order diffraction light ($m_2=\pm 1$) among the diffraction light TK caused by diffracting the incident light H by the diffraction grating 601 is identical to the pixel pitch P of the plurality of pixels PX. That is, on the upper surface of the semiconductor substrate 101, the diffraction grating 601 is formed so that the shift amount W by which the central axis of the 1-order diffraction light ($m_2=\pm 1$) is shifted to the central axis of 0-order diffraction light is identical to the pixel pitch P (W=P).

In this case, the diffraction grating 601 functions as an optical-low pass filter. That is, when the incident light having a high frequency as a subject image is received and imaged, aliasing component may be generated at a spatial frequency (Nyquist frequency) based on the pixel pitch, but the generation of the aliasing component can be suppressed. Thus, the image quality of the captured image can be more suitably enhanced.

(3) Modified Examples

In the present embodiment, in the case of the first embodiment, although the description has been given of the case where the respective elements are provided so as to satisfy Expressions (B) and (C) described above, the present embodiment is not limited thereto. Also in the other embodiments, the respective elements may be provided so as to satisfy the above Expressions (B) and (C).

(3-1) First Modified Example

Figure 19:
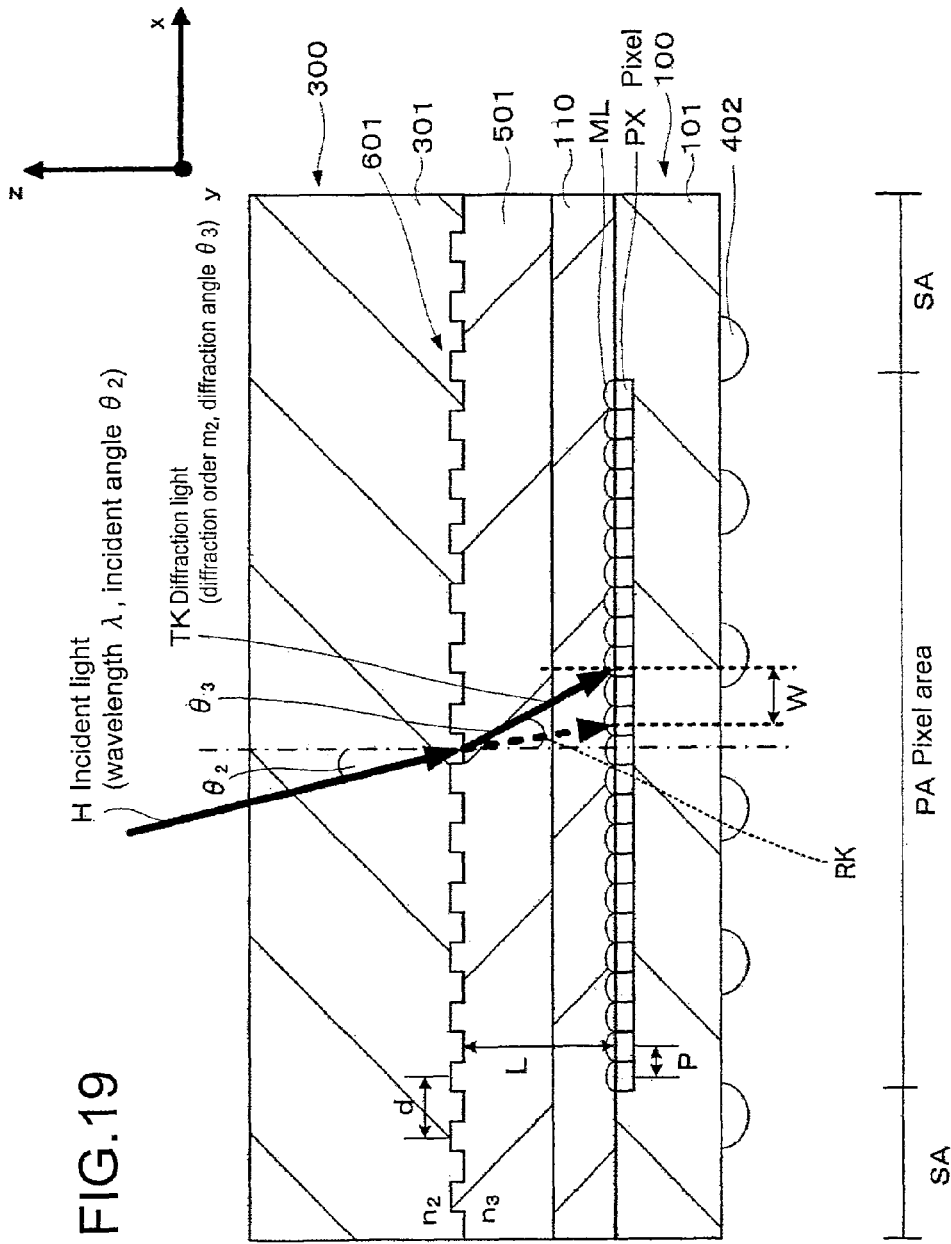
FIG. 19 is a diagram showing factors constituting Expressions (B) and (C) according to a modified example of the fifth embodiment.

FIG. 19 is a diagram showing factors constituting Expressions (B) and (C) according to a modified example of the fifth embodiment. FIG. 19 shows the respective factors constituting Expressions (B) and (C) in the case of the second embodiment (see FIG. 14).

As shown in FIG. 19, in the present modified example, the following points are different from the above embodiments.
- $n_2$: refractive index of layer (glass substrate 301) positioned above surface on which diffraction grating 601 is provided
- $n_3$: refractive index of layer (adhesive layer 501) positioned below surface on which diffraction grating 601 is provided Also in the present modified example, the respective elements are provided so as to satisfy Expressions (B) and (C), so that the same effects as in the above embodiments can be achieved.

(3-2) Second Modified Example

Figure 20:
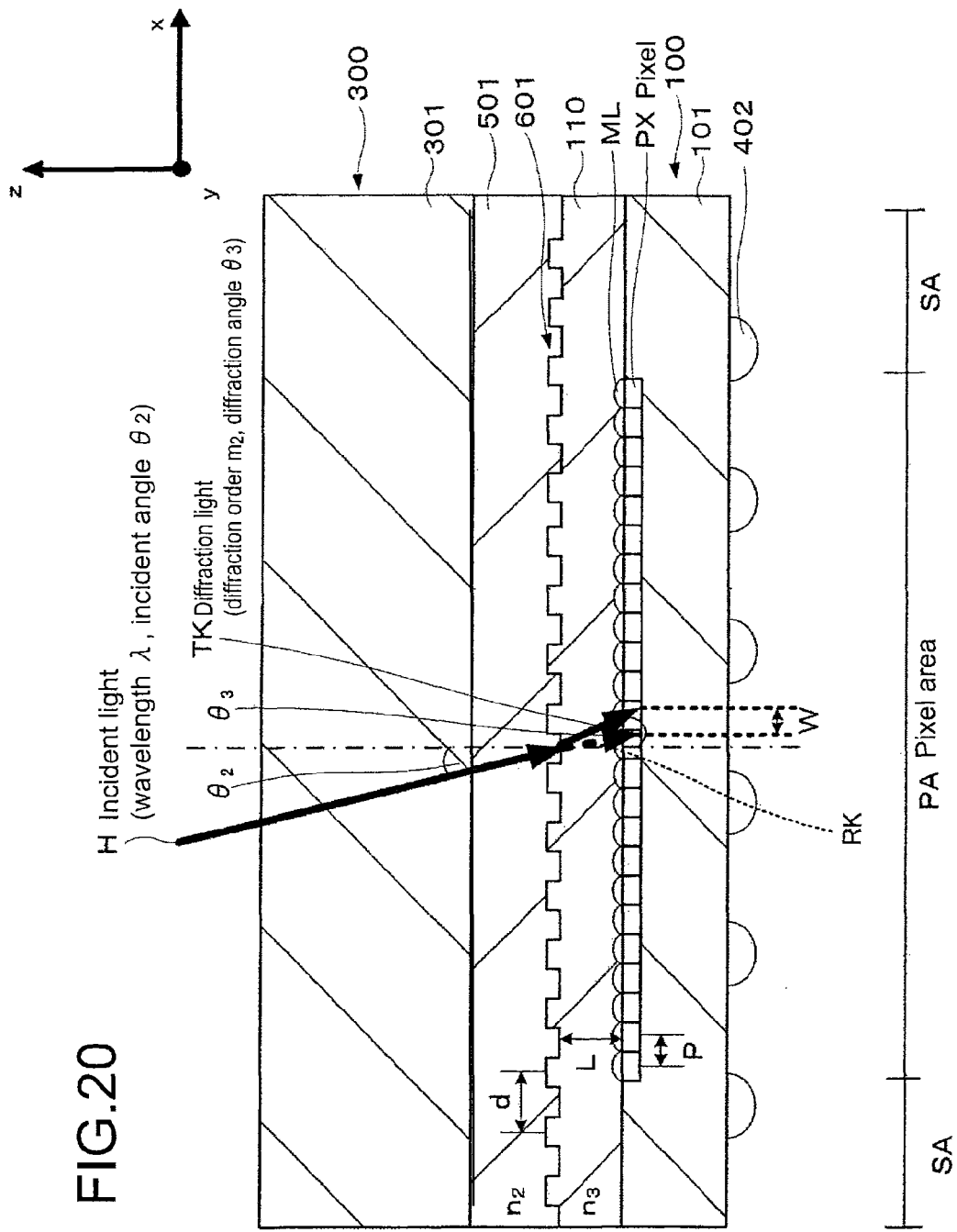
FIG. 20 is a diagram showing factors constituting Expressions (B) and (C) according to a modified example of the fifth embodiment.

FIG. 20 is a diagram showing factors constituting Expressions (B) and (C) according to a modified example of the fifth embodiment. FIG. 20 shows the respective factors constituting Expressions (B) and (C) in the case of the third embodiment (see FIG. 15).

As shown in FIG. 20, in the present modified example, the following points are different from the above embodiments.
- $n_2$: refractive index of layer (adhesive layer 501) positioned above surface on which diffraction grating 601 is provided
- $n_3$: refractive index of layer (transparent layer 110) positioned below surface on which diffraction grating 601 is provided Also in the present modified example, the respective elements are provided so as to satisfy Expressions (B) and (C), so that the same effects as in the above embodiments can be achieved.

(3-3) Third Modified Example

Figure 21:
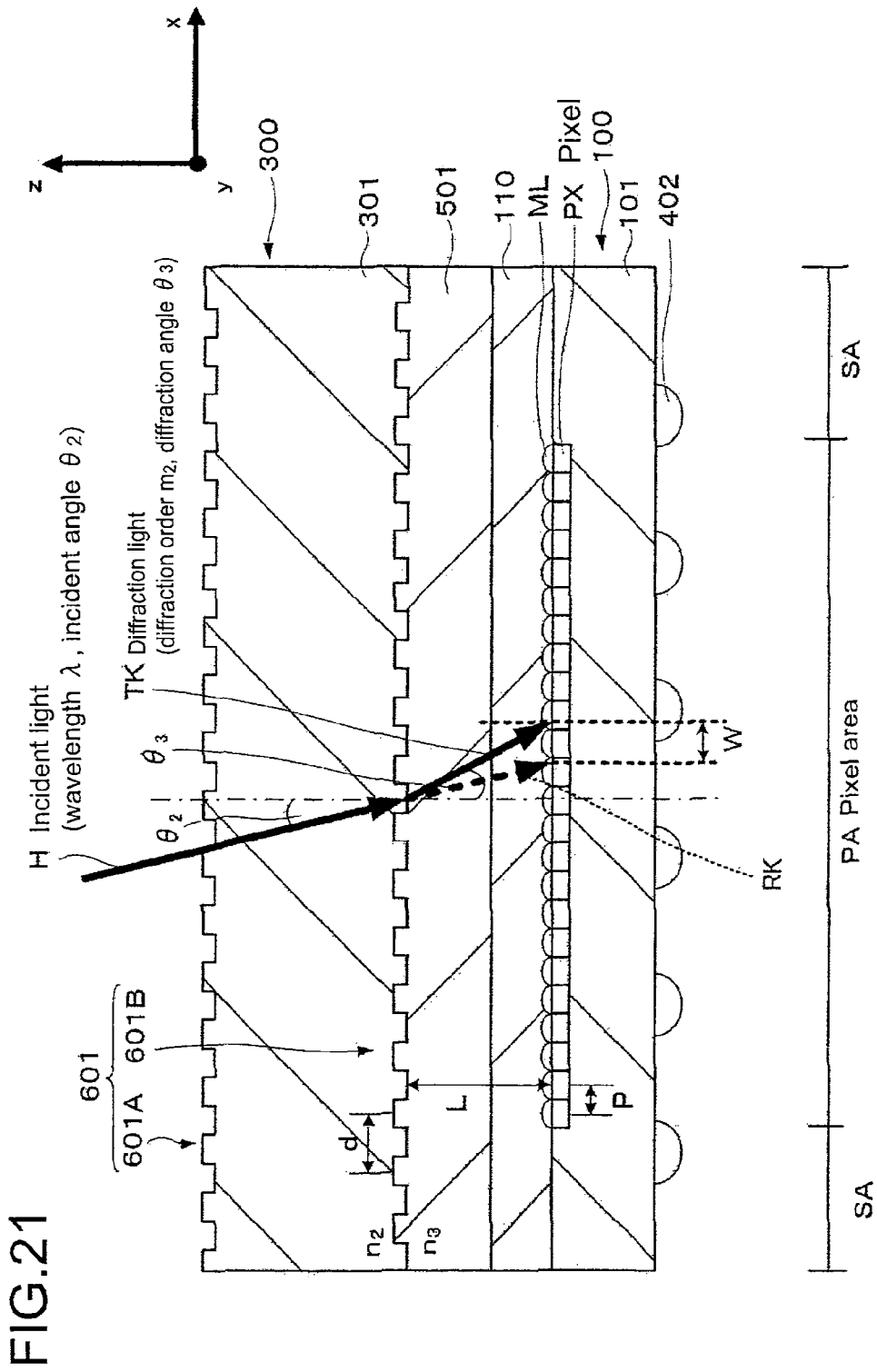
FIG. 21 is a diagram showing factors constituting Expressions (B) and (C) according to a modified example of the fifth embodiment.

FIG. 21 is a diagram showing factors constituting Expressions (B) and (C) according to a modified example of the fifth embodiment. FIG. 21 shows the respective factors constituting Expressions (B) and (C) in the case of the fourth embodiment (see FIG. 16).

As shown in FIG. 21, in the present modified example, it is suitable that the second diffraction grating 601B closest to the semiconductor substrate 101 among the plurality of diffraction gratings 601 (first diffraction grating 601A and second diffraction grating 601B) is provided so as to satisfy Expressions (B) and (C). Specifically, the following points are different from the above embodiments.
- $n_2$: refractive index of layer (glass substrate 301) positioned above surface on which diffraction grating 601 is provided
- $n_3$: refractive index of layer (adhesive layer 501) positioned below surface on which diffraction grating 601 is provided Also in the present modified example, the respective elements are provided so as to satisfy Expressions (B) and (C), so that the same effects as in the above embodiments can be achieved.

(3-4) Fourth Modified Example

In the above description, although the description has been given of the case satisfying Expression (C) in addition to Expression (B), the present embodiment is not limited thereto.

Besides the above, an imaging lens (corresponding to the optical system 42 in FIG. 1) has an aberration and an imaging limit. The imaging limit is a finite value, and a minimum spot diameter at this time is defined as a width LM of an imaging limitation capability.

In this case, it is suitable that the diffraction grating 601 is formed so that the shift amount W of the 1-order diffraction light ($m_2=\pm 1$) among the diffraction light TK caused by diffracting the incident light H by the diffraction grating 601 is smaller than the width LM of the imaging limitation capability. That is, it is also suitable that on the upper surface of the semiconductor substrate 101, the diffraction grating 601 is formed so that the shift amount W by which the central axis of the 1-order diffraction light ($m_2=\pm 1$) is shifted to the central axis of the refraction light (0-order diffraction light) is smaller than the width LM of the imaging limitation capability (W<LM).

In an ideal case not considering the imaging capability, the condition of the shift amount providing less blur is allowable within one pixel. However, as described above, an allowable shift amount is increased by considering aberrations of real lenses under the condition of the diffraction grating taking in consideration the imaging capability of the imaging lens and therefore the design flexibility of the diffraction grating 601 can be widened.

Therefore, the effect of adequately maintaining the image quality can be achieved suitably.

6. Sixth Embodiment

In the present embodiment, the respective elements are provided so as to satisfy the following Expression (D). Except for this point and the associated points, the present embodiment is the same as the fifth embodiment. Therefore, a repeated description of the same parts is omitted.

$$1 > \left| \frac{m_3 \lambda}{n_2 d} - \frac{n_4}{n_2} \left( \frac{m_1 \lambda}{n_4 P} - \sin\theta_4 \right) \right| \quad (D)$$

Figure 22:
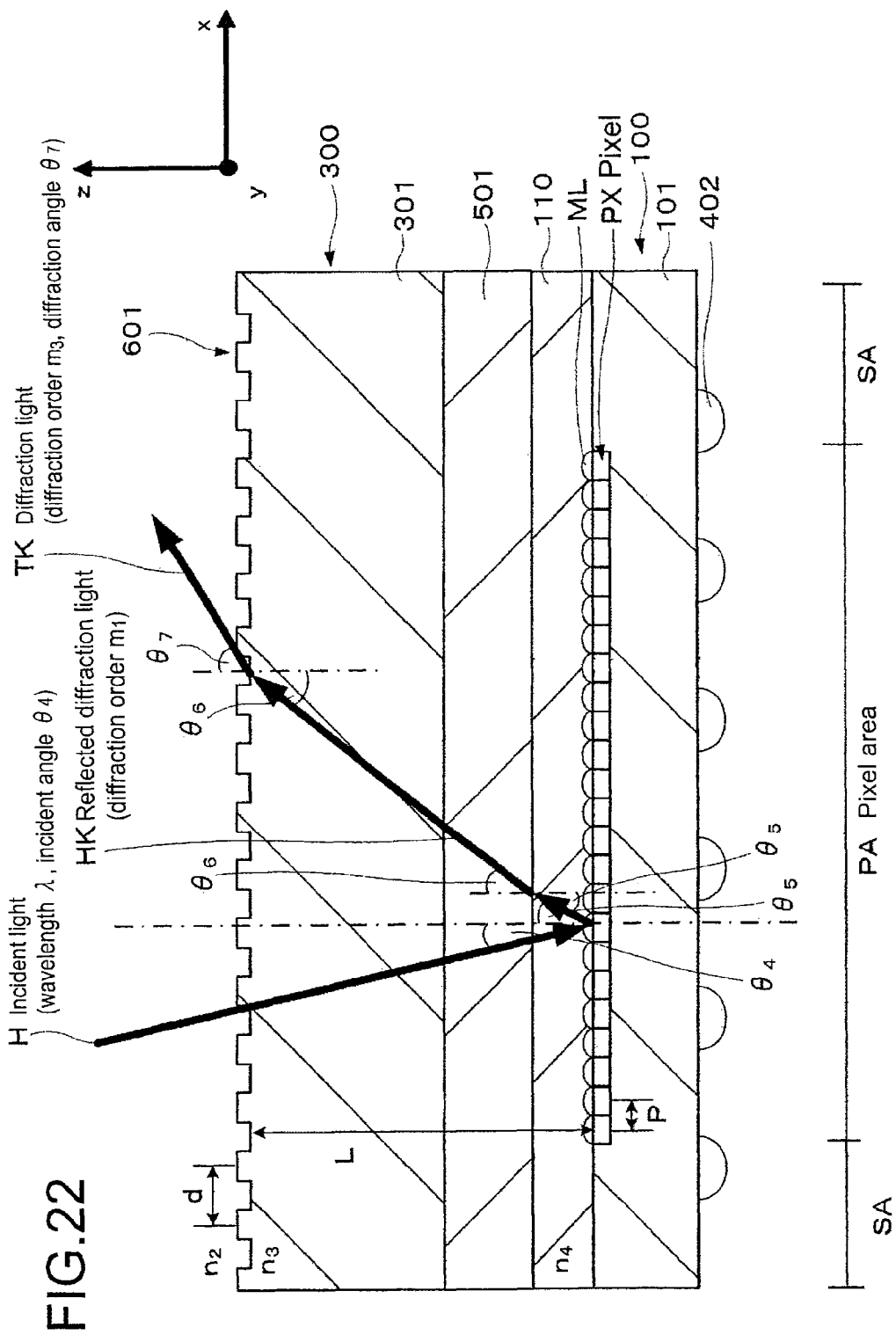
FIG. 22 is a diagram showing factors constituting Expression (D) according to a sixth embodiment.

FIG. 22 is a diagram showing factors constituting Expression (D) according to a sixth embodiment.

The respective factors shown in FIG. 22 are as follows.
λ: wavelength of incident light H (center wavelength of light received by pixel PX)
$n_2$: refractive index of layer (air layer) positioned above surface on which diffraction grating 601 is provided
$n_3$: refractive index of layer (glass substrate 301 and adhesive layer 501) positioned below surface on which diffraction grating 601 is provided
$n_4$: refractive index of transparent layer 110 covering microlens ML
P: pixel pitch of plurality of pixels PX
d: grating pitch of diffraction grating 601
$\theta_4$: incidence angle of incident light H incident toincident on pixel PX (angle at which optical axis of external lens is inclined relative to the axis perpendicular to surface on which pixel PX is provided)
$\theta_5$: diffraction angle of reflected diffraction light HK by pixel PX
$\theta_6$: incidence angle onto diffraction grating 601 of reflected diffraction light HK
$\theta_7$: diffraction angle of diffraction light TK generated by that reflected diffraction light HK is diffracted by diffraction grating 601
$m_1$: diffraction order ($m_1 = \pm 1, \pm 2, \ldots$) of reflected diffraction light HK by pixel PX
$m_3$: diffraction order ($m_3 = \pm 1, \pm 2, \ldots$) of diffraction light TK generated by that reflected diffraction light HK is diffracted by diffraction grating 601

Expression (D) is derived using the following Expressions (d1) to (d3). In this case, Expression (d1) is an expression showing diffraction by the pixel PX. Expression (d2) is an expression showing a behavior in the interface between the transparent layer 110 covering microlens ML and the layer (adhesive layer 501) positioned below the surface on which diffraction grating 601 is provided. Expression (d3) is an expression showing a behavior in the interface between the layer (air layer) positioned above the surface on which the diffraction grating 601 is provided and the layer (glass substrate 301) positioned below the surface on which the diffraction grating 601 is provided.

$$\pm \sin\theta_5 = \frac{m_1 \lambda}{n_4 p} - \sin\theta_4 \quad (d1)$$

$$n_3 \sin\theta_6 = n_4 \sin\theta_5 \quad (d2)$$

$$n_3 \sin\theta_6 \pm n_2 \sin\theta_7 = \frac{m_3 \lambda}{d} \quad (d3)$$

Expression (d4) is derived by Expressions (d1) and (d2).

$$n_3 \sin\theta_6 = n_4 \times \left( \frac{m_1 \lambda}{n_4 P} - \sin\theta_4 \right) \quad (d4)$$

Then, when Expression (d3) is modified, Expression (d5) is derived.

$$\pm \sin\theta_7 = \frac{m_3 \lambda}{n_2 d} - \frac{n_3}{n_2} \sin\theta_6 \quad (d5)$$

Then, when Expression (d5) is added to Expression (d4), Expression (d6) is derived.

$$\pm \sin\theta_7 = \frac{m_3 \lambda}{n_2 d} - \frac{n_4}{n_2} \times \left( \frac{m_1 \lambda}{n_4 P} - \sin\theta_4 \right) \quad (d6)$$

As shown in FIG. 22, the reflected diffraction light HK advances from below to the diffraction grating 601 and is diffracted by the diffraction grating 601, and the diffraction light TK is generated. At this time, when the diffraction angle $\theta_7$ of the diffraction light TK is equal to or greater than 90°, the diffraction light TK is reflected on the surface on which the diffraction grating 601 is provided. Therefore, the diffraction light TK may be incident on the pixel PX of the position which is different from the position at which the diffraction light TK should be incident originally. Accordingly, the image quality may deteriorate.

However, when the diffraction angle $\theta_7$ of the diffraction light TK is less than 90°, the diffraction light TK is not reflected on the surface on which the diffraction grating 601 is provided, and the diffraction light TK is refracted and is transmitted above. Therefore, since the diffraction light TK is not incident on the pixel PX of the position which is different from the position at which the diffraction light TK should be incident originally, it is possible to prevent deterioration of the image quality. That is, as shown in the present embodiment, it is possible to enhance the image quality by satisfying Expression (D) which shows the case where $\theta_7$ is less than 90° in Expression (d6). For example, since $m_1 = \pm 1$ to 5 determined by Expression (A) and $m_3 = \pm 1$ to 5 in Expression (D) have strong light intensity, it is suitable to constitute the respective elements so as to satisfy the above relationship.

In the present embodiment, the following procedure is used to optimize the grating pitch d of the diffraction grating 601 and the diffraction grating 601 is formed based on the optimized condition.

First, Expression (A) shown in the first embodiment is used to determine the minimum order ($m_1$) that can cause the total reflection for the reflected diffraction light HK by pixels PX.

Then, as shown in the fifth embodiment, the condition (range) of the grating pitch d of the diffraction grating is determined so as to satisfy Expressions (B) and (C).

Subsequently, the condition of the grating pitch d of the diffraction grating is optimized so as to minimize the total reflection light due to the diffraction grating 601.

This optimization is applied to the above determined order $m_1$. In the case of the order $m_3$ having a plurality of conditions, the grating pitch d of the diffraction grating is separately determined to satisfy Expression (D). Then, the condition that satisfies all of the respective conditions of the grating pitch d satisfying Expression (D) and the condition of the grating pitch d satisfying the Expressions (B) and (C) is set as the optimum condition of the grating pitch d of the diffraction grating 601.

Specifically, in the case of light having a wavelength of 500 nm, it is obtained that the total reflection is generated at 4 ($m_1 = 4$) or higher order by Expression (A). Therefore, under the condition of $m_1 = 4$, for example, in the case of $m_3 = 1, 2, 3,$ the grating pitch d satisfying the relationship of the above Expression (D) is calculated as follows.

(In the case of $m_1=4, m_3=1, \lambda=500$ nm, P=1800 nm, $\theta_4=0°$) d is suitable when d is less than 4.5 μm.
(In the case of $m_1=4, m_3=2, \lambda=500$ nm, P=1800 nm, $\theta_4=0°$) d is suitable when d is less than 9.0 μm.
(In the case of $m_1=4, m_3=3, \lambda=500$ nm, P=1800 nm, $\theta_4=0°$) d is suitable when d is less than 9.0 μm.

Otherwise, as shown in the fifth embodiment, it is suitably calculated that the grating pitch d is set to 7.5 μm or more to satisfy Expressions (B) and (C).

Therefore, from these results, in the case of $m_1=4, m_3=1, 2$, and 3, $\lambda=500$ nm, P=1800 nm, $\theta_4=0°$, the condition that the grating pitch d is 4 μm or less is obtained as the optimum condition.

(2) Conclusion

As described above, in the present embodiment, similarly to the case of the other embodiments, the diffraction grating 601 diffracts the reflected diffraction light HK caused by that the incident light H is incident on the pixel area PA in which the plurality of pixels PX are arranged on the upper surface of the semiconductor substrate 101 and is diffracted.

Therefore, in the present embodiment, similarly to the case of the other embodiments, it is possible to suppress the occurrence of the ghost and enhance the image quality of the captured image.

Particularly, in the present embodiment, the respective elements are provided to satisfy Expression (D). Therefore, the diffraction grating 601 can diffract and transmit therethrough components on which the reflected diffraction light HK is totally reflected. Accordingly, it is possible to suppress the occurrence of the ghost more suitably and enhance the image quality of the captured image.

(3) Modified Example

In the present embodiment, in the case of the fifth embodiment, although the description has been given of the case where the respective elements are provided so as to satisfy Expression (D) described above, the present embodiment is not limited thereto. Also in the other embodiments, the respective elements may be provided so as to satisfy the above Expression (D).

(3-1) First Modified Example

Figure 23:
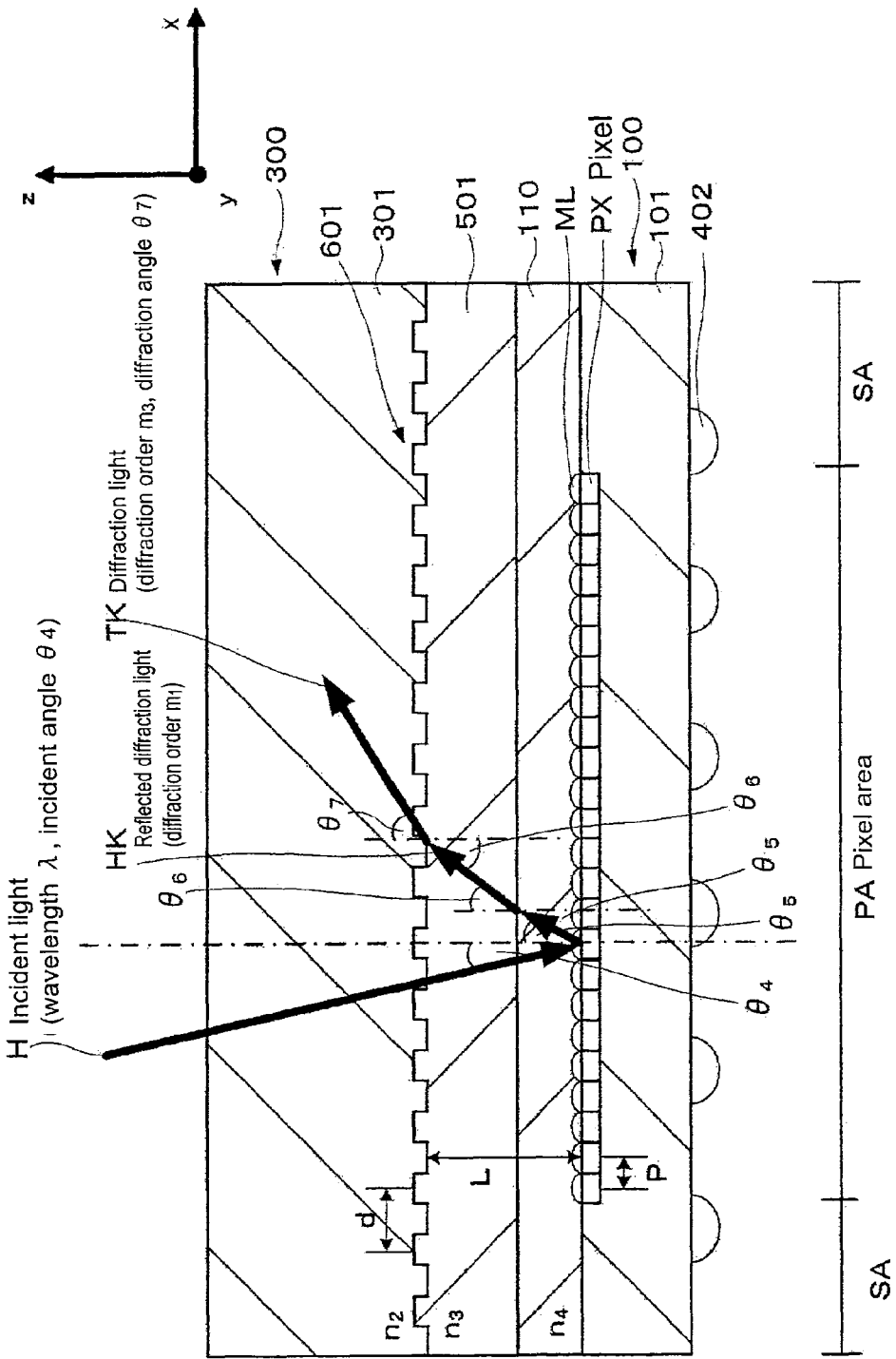
FIG. 23 is a diagram showing factors constituting Expression (D) according to a modified example of the sixth embodiment.

FIG. 23 is a diagram showing factors constituting Expression (D) according to a modified example of the sixth embodiment. FIG. 23 shows the respective factors constituting Expression (D) in the case of the second embodiment (see FIG. 14).

As shown in FIG. 23, in the present modified example, the following points are different from the above embodiments.

$n_2$: refractive index of layer (glass substrate 301) positioned above surface on which diffraction grating 601 is provided Also in the present modified example, the respective elements are provided so as to satisfy Expression (D), so that the same effects as in the above embodiments can be achieved.

(3-2) Second Modified Example

Figure 24:
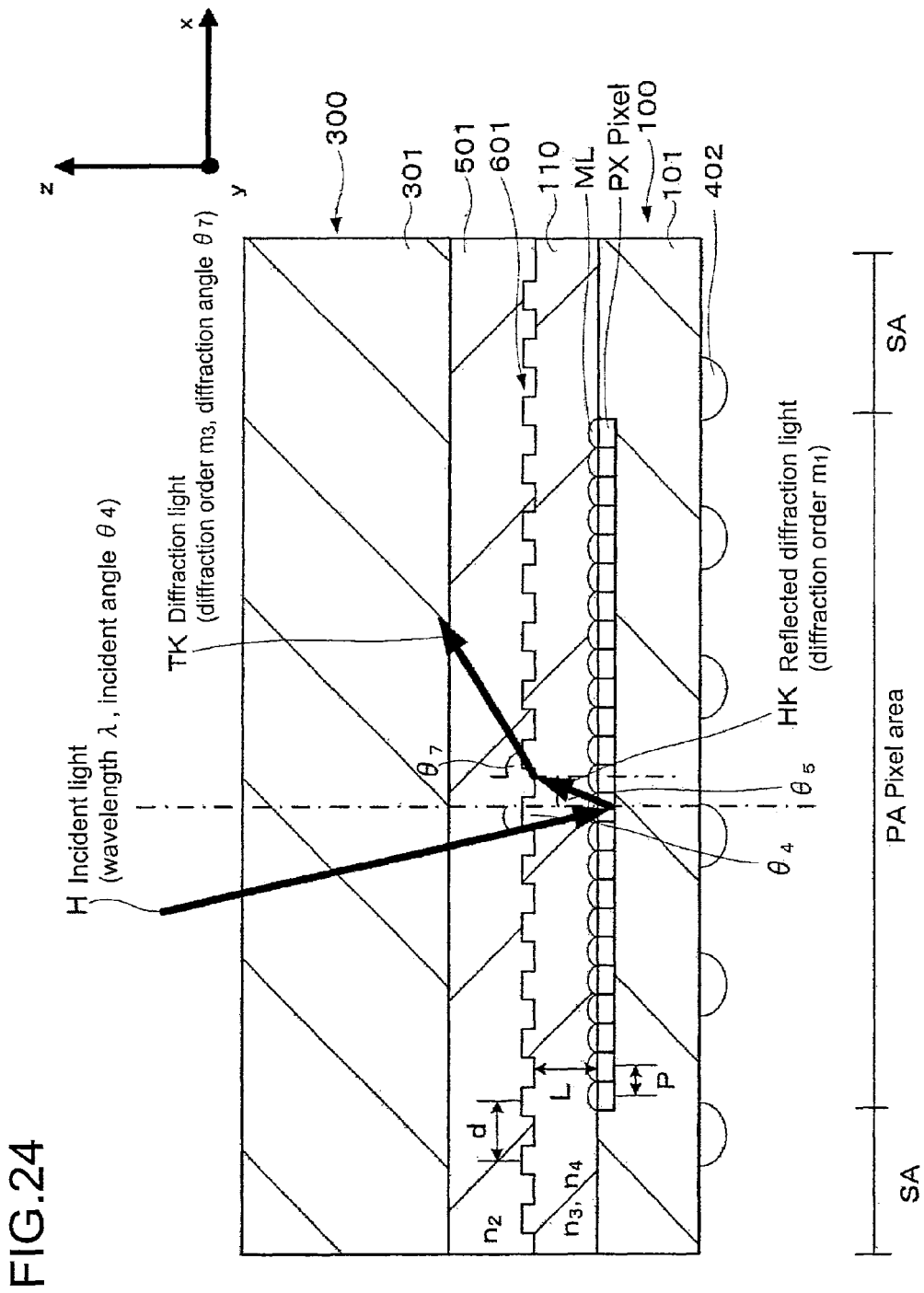
FIG. 24 is a diagram showing factors constituting Expression (D) according to a modified example of the sixth embodiment.

FIG. 24 is a diagram showing factors constituting Expression (D) according to a modified example of the sixth embodiment. FIG. 24 shows the respective factors constituting Expression (D) in the case of the third embodiment (see FIG. 15).

As shown in FIG. 24, in the present modified example, the following points are different from the above embodiments.

$n_2$: refractive index of layer (adhesive layer 501) positioned above surface on which diffraction grating 601 is provided Also in the present modified example, the respective elements are provided so as to satisfy Expression (D), so that the same effects as in the above embodiments can be achieved.

(3-3) Third Modified Example

Figure 25:
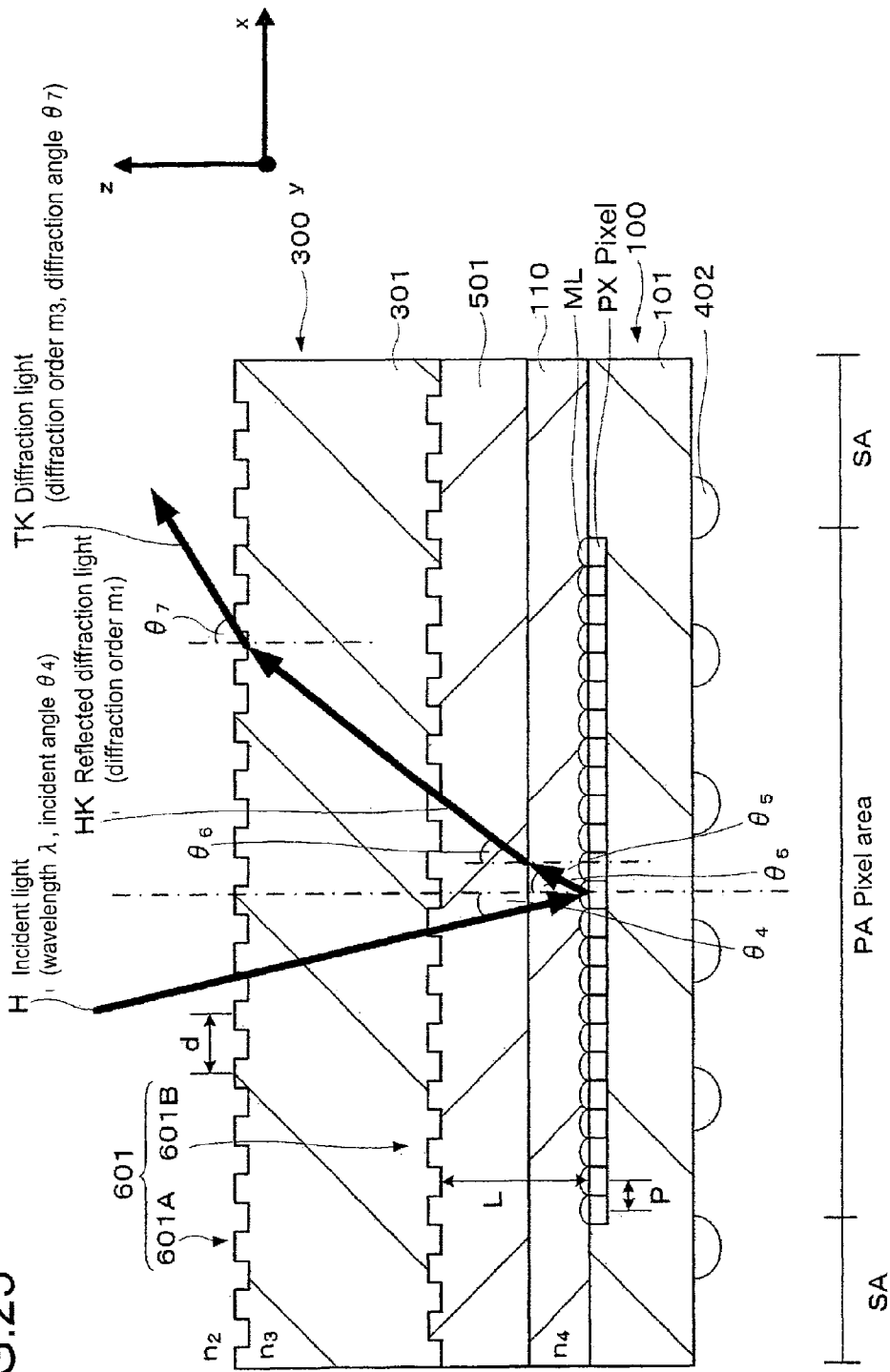
FIG. 25 is a diagram showing factors constituting Expression (D) according to a modified example of the sixth embodiment.

FIG. 25 is a diagram showing factors constituting Expression (D) according to a modified example of the sixth embodiment. FIG. 25 shows the respective factors constituting Expression (D) in the case of the fourth embodiment (see FIG. 16).

As shown in FIG. 25, in the present modified example, it is suitable that the first diffraction grating 601A farthest from the semiconductor substrate 101 among the plurality of diffraction gratings 601 (first diffraction grating 601A and second diffraction grating 601B) is provided so as to satisfy Expression (D).

Also in the present modified example, the respective elements are provided so as to satisfy Expression (D), so that the same effects as in the above embodiments can be achieved.

7. Seventh Embodiment

Figure 26:
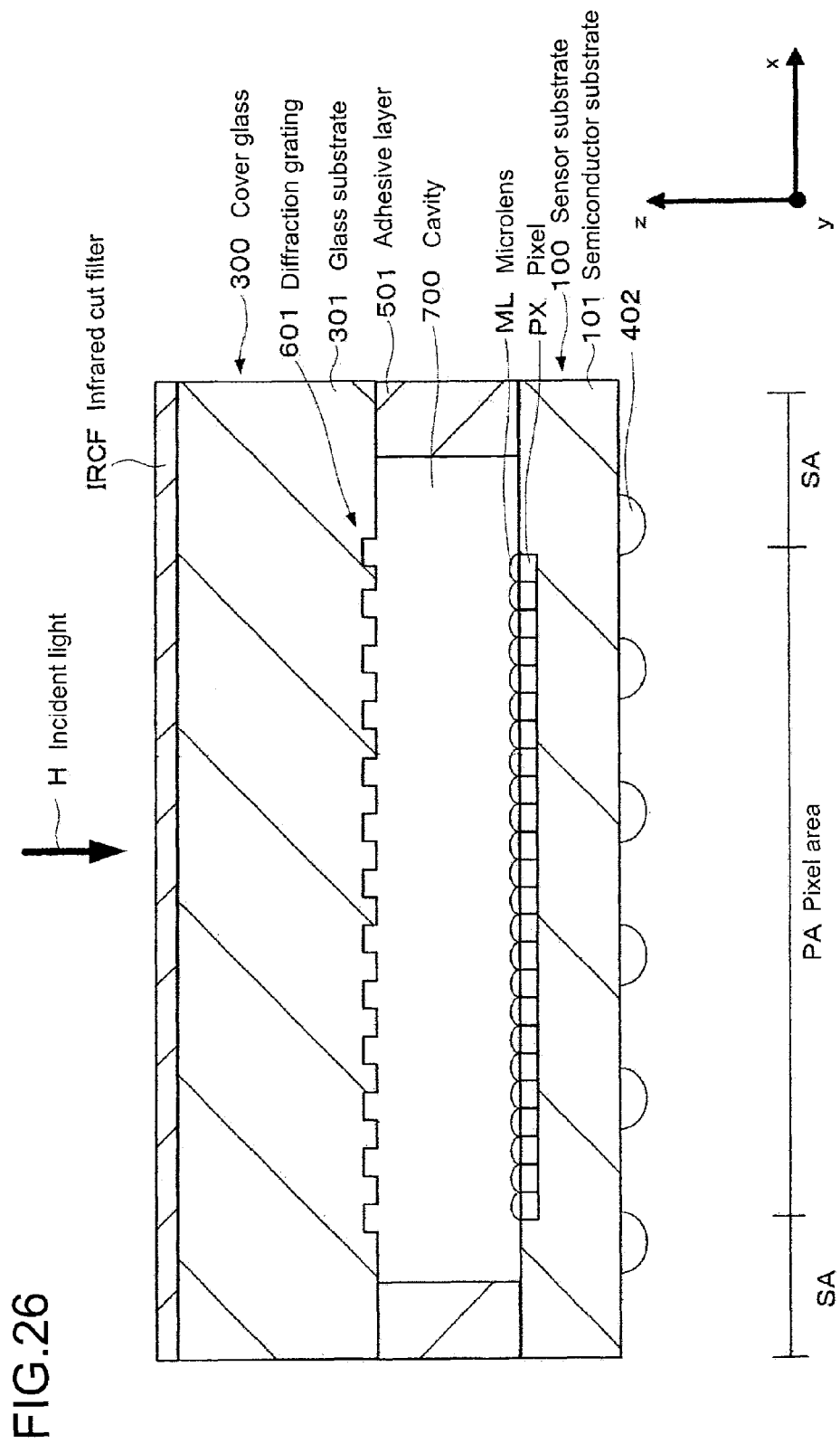
FIG. 26 is a diagram showing a main portion of a solid-state imaging apparatus according to a seventh embodiment.

FIG. 26 is a diagram showing a main portion of a solid-state imaging apparatus according to a seventh embodiment. FIG. 26 shows a cross-section similarly to FIG. 14.

As shown in FIG. 26, in the present embodiment, a cavity 700 is provided. Moreover, an infrared cut filter IRCF is provided. Moreover, the transparent layer 110 is not provided. Except for this point and the associated points, the present embodiment is the same as the second embodiment. Therefore, a repeated description of the same parts is omitted.

As shown in FIG. 26, in the solid-state imaging apparatus, the sensor substrate 100 and the cover glass 300 are disposed to face each other. Then, the cavity 700 is provided at a central portion of the faced surface. Then, the adhesive layer 501 is provided at a peripheral portion of the surface facing the sensor substrate 100 and the cover glass 300, and the sensor substrate 100 and the cover glass 300 are bonded by the adhesive layer 501.

In this case, as shown in FIG. 26, the cavity 700 is provided so as to be interposed between the portion at which the pixel area PA is provided and the glass substrate 301 constituting the cover glass 300 in the sensor substrate 100.

Then, in the glass substrate 301 constituting the cover glass 300, the infrared cut filter IRCF is provided on the surface of the opposite side to the surface facing the sensor substrate 100. The infrared cut filter IRCF is a band-pass filter and is provided so as to selectively transmit a visible light component of the incident light H. In the present embodiment, the infrared cut filter IRCF is not an absorptive type but is a reflective type and is provided so as to cut, by the reflection, light having an infrared component or the like among the incident light H and selectively transmit the visible light component.

On the other hand, in the glass substrate 301 constituting the cover glass 300, the diffraction grating 601 is provided on the surface facing the sensor substrate 100.

Figure 27:
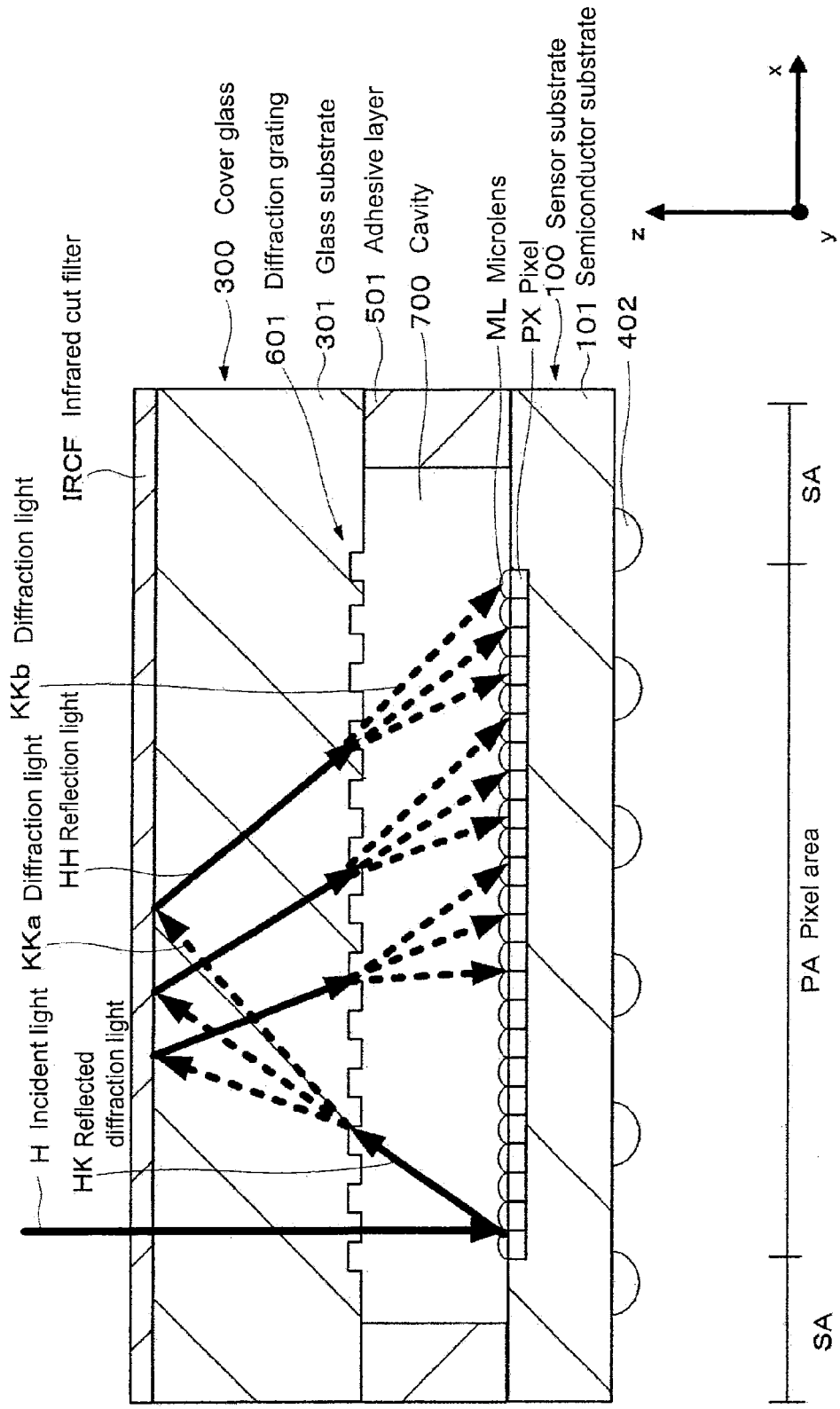
FIG. 27 is a cross-sectional view showing a state of light according to the seventh embodiment.

FIG. 27 is a cross-sectional view showing a state of light according to the seventh embodiment.

Figure 28:
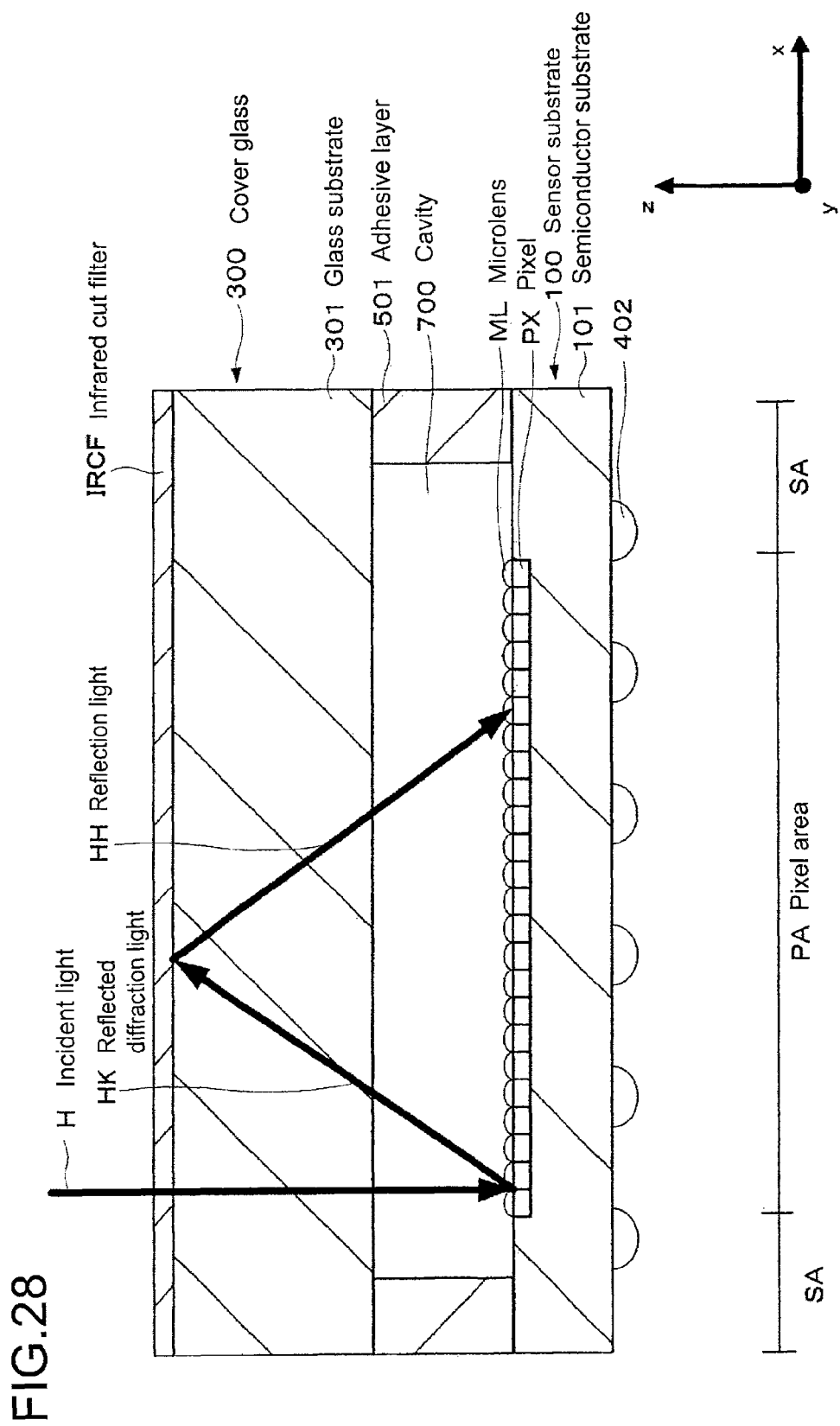
FIG. 28 is a cross-sectional view showing a state of light in a case where a diffraction grating 601 is not provided according to the seventh embodiment.

On the contrary, FIG. 28 is a cross-sectional view showing a state of light in a case where the diffraction grating 601 is not provided according to the seventh embodiment.

As shown in FIGS. 27 and 28, in the present embodiment, the incident light H is incident, as the subject image, to the pixels PX provided on the upper surface of the semiconductor substrate 101 from above the pixels PX through the infrared cut filter IRCF, the glass substrate 301, the diffraction grating 601, and the cavity 700.

At this time, in the upper surface side of the semiconductor substrate 101, the incident light H which is incident from above is diffracted and some of the incident light H is reflected above as the reflected diffraction light HK. For example, when the incident light H is incident, from above as the subject image, to the periodic structures such as the microlens ML periodically disposed corresponding to each of the plurality of pixels PX, the incident light H is diffracted by the periodic structures and some of the incident light H is reflected above as the reflected diffraction light. For example, the light reflected on the surface of the microlens ML and the semiconductor substrate 101 becomes the reflected diffraction light HK.

The reflected diffraction light HK is then directed upwardly and is incident on the infrared cut filter IRCF through the cavity 700 and the cover glass 300.

Therefore, as shown in FIG. 28, the reflected diffraction light HK is reflected by the reflective type infrared cut filter IRCF and may be re-incident on the pixels PX as reflection light HH. Then, when the reflection light HH is incident on the pixels PX, the ghost (flare) occurs on the captured image and the image quality is deteriorated.

In the reflective type infrared cut filter IRCF, a wavelength band of the boundary portion has a high reflectivity in a transmission wavelength band which transmits light. Moreover, in the reflective type infrared cut filter IRCF fabricated from a multilayered film, band-pass characteristics reflecting infrared light to vertically incident light are shifted on a short wavelength side with respect to obliquely incident light, so that light in a visible light band which is transmitted at vertical incidence is reflected. Therefore, the wavelength band component of the visible light among the reflected diffraction light HK is reflected by the reflective type infrared cut filter IRCF and may be re-incident on the pixels PX as the reflection light HH. Particularly, when high-luminance light such as sunlight is incident as the subject image, light of a red component with a large wavelength is re-incident on the pixels PX as the reflection light HH. Therefore, the ghost which is a so called "red-ball ghost" occurs in the captured image and the image quality may be deteriorated (for example, see Japanese Patent Application Laid-Open No. 2011-082266).

However, in the present embodiment, as shown in FIG. 27, the reflected diffraction light HK is diffracted by the diffraction grating 601, and is dispersed as diffraction light KKa having various diffraction orders, and transmits through the diffraction grating 601. Then, the diffraction light KKa is reflected by the reflective type infrared cut filter IRCF and is re-incident on the diffraction grating 601 as the reflection light HH. Subsequently, the reflection light HH is diffracted by the diffraction grating 601, and is dispersed as diffraction light KKb having various diffraction orders, and transmits through the diffraction grating 601, and is emitted to the upper surface side of the semiconductor substrate 101.

At this time, in the diffraction light having a small incidence angle onto the infrared cut filter IRCF due to diffraction, the shift amount of the band-pass characteristics with respect to the above described obliquely incident light is so small that the reflection is decreased. Therefore, some of the diffracted light does not return to the semiconductor substrate 101 side and transmits through the infrared cut filter IRCF.

Thus, when the reflected diffraction light HK is re-incident on the upper surface of the semiconductor substrate 101, the reflected diffraction light HK is re-incident as a plurality of dispersed diffraction light KKb. Therefore, in the present embodiment, the light intensity incident on the pixel PX is deteriorated in the reflected diffraction light HK.

Accordingly, even if the ghost (flare) occurs on the captured image, the ghost (flare) is less noticeable and the deterioration of the image quality can be suppressed.

(2) Conclusion

As described above, in the present embodiment, the reflective type infrared cut filter IRCF faces the upper surface of the sensor substrate 100 and selectively transmits the wavelength range of the visible light component of the incident light. The diffraction grating 601 is provided between the infrared cut filter IRCF and the sensor substrate 100 and transmits the incident light H therethrough. Then, the diffraction grating 601 diffracts the reflected diffraction light caused by that the incident light H is incident on the pixel area PA in which the plurality of pixels PX are arranged on the upper surface of the semiconductor substrate 101 and is diffracted.

Accordingly, as described above, in the present embodiment, even if the ghost (flare) occurs on a captured image, the ghost (flare) is less noticeable and the image quality can be enhanced.

8. Eighth Embodiment

Figure 29:
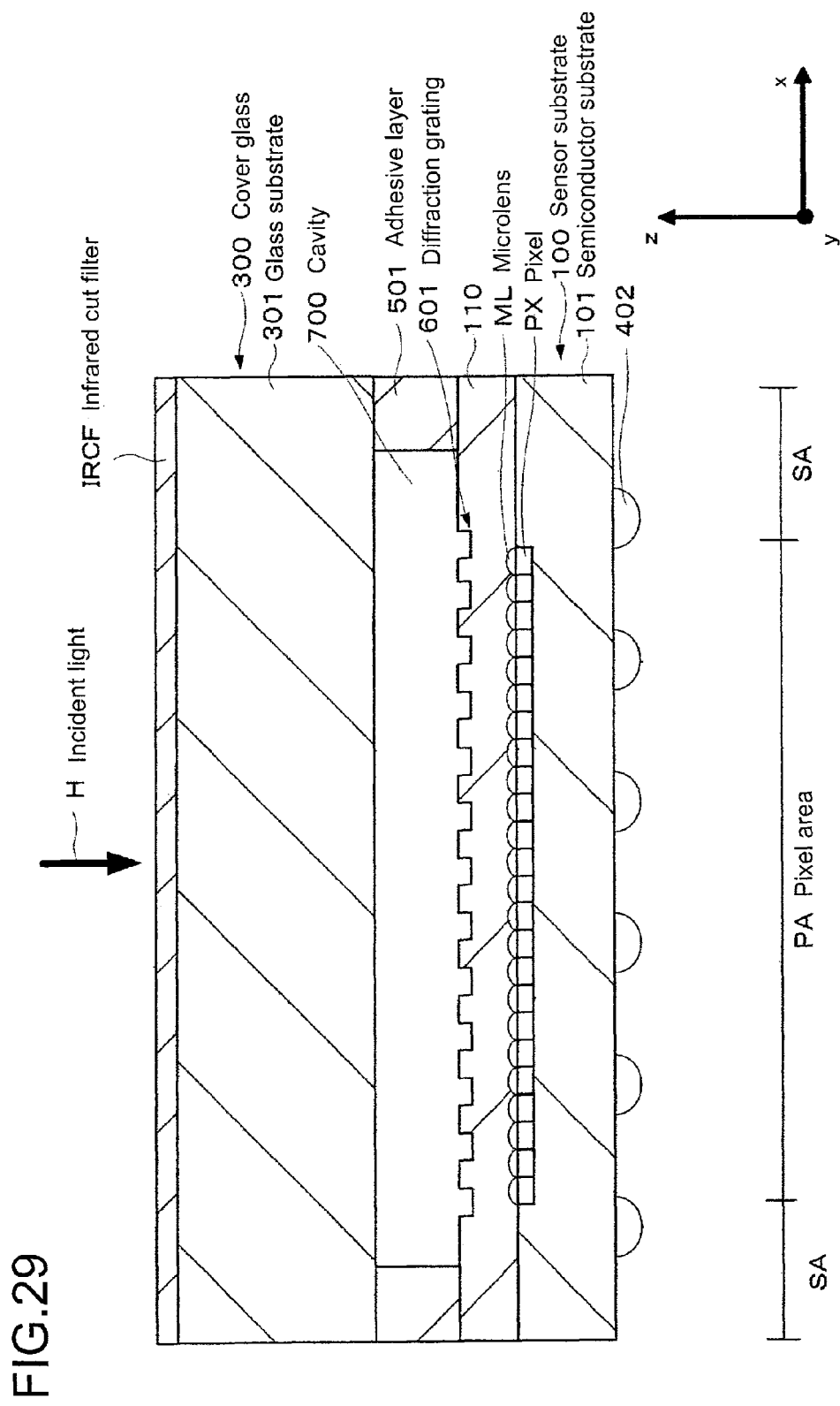
FIG. 29 is a diagram showing a main portion of a solid-state imaging apparatus according to an eighth embodiment.

FIG. 29 is a diagram showing a main portion of a solid-state imaging apparatus according to an eighth embodiment. FIG. 29 shows a cross-section similarly to FIG. 26.

As shown in FIG. 29, in the present embodiment, the transparent layer 110 is provided. Moreover, the position at which the diffraction grating 601 is provided is different. Except for this point and the associated points, the present embodiment is the same as the seventh embodiment. Therefore, a repeated description of the same parts is omitted.

As shown in FIG. 29, the transparent layer 110 is provided so as to cover and flatten the upper surface of the semiconductor substrate 101 on which the microlens ML is provided in the sensor substrate 100.

For example, the transparent layer 110 is provided in the following conditions.

(Transparent Layer 110)

Material: silicon resin-based and siloxane resin-based
Thickness: about 1 μm

Then, as shown in FIG. 29, the diffraction grating 601 is provided on the upper surface of the transparent layer 110.

Figure 30:
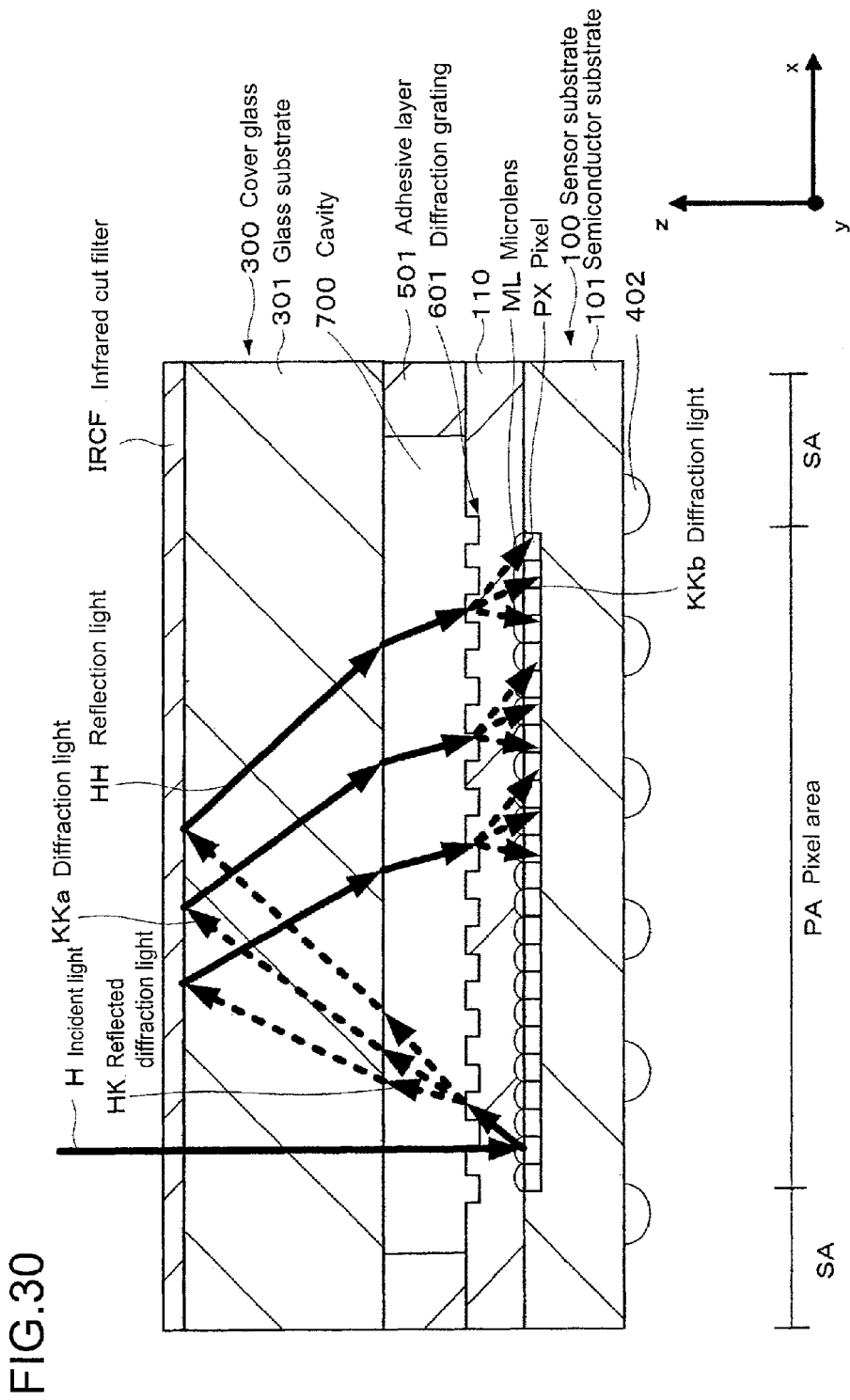
FIG. 30 is a cross-sectional view showing a state of light according to the eighth embodiment.

FIG. 30 is a cross-sectional view showing a state of light according to the eighth embodiment.

As shown in FIG. 30, the incident light H is incident, as the subject image, to the pixels PX provided on the upper surface of the semiconductor substrate 101 from above the pixels PX through the infrared cut filter IRCF, the glass substrate 301, the cavity 700, and the diffraction grating 601.

As described above, at this time, on the upper surface side of the semiconductor substrate 101, the incident light H which is incident from above is diffracted and some of the incident light H is reflected above as the reflected diffraction light HK. Then, the reflected diffraction light HK is incident on the infrared cut filter IRCF through the cavity 700 and the cover glass 300.

As shown in FIG. 30, the reflected diffraction light HK is diffracted by the diffraction grating 601, and is dispersed as the diffraction light KKa having various diffraction orders, and transmits through the diffraction grating 601. Then, the diffraction light KKa is reflected by the reflective type infrared cut filter IRCF and is re-incident on the diffraction grating 601 as the reflection light HH. Subsequently, the reflection light HH is diffracted by the diffraction grating 601, and is dispersed as diffraction light KKb having various diffraction orders, and transmits through the diffraction grating 601, and is emitted to the upper surface side of the semiconductor substrate 101.

At this time, in the diffraction light having a small incidence angle onto the infrared cut filter IRCF due to diffraction, the shift amount of the band-pass characteristics with respect to the above described obliquely incident light is so small that the reflection is decreased. Therefore, some of the diffracted light does not return to the semiconductor substrate 101 side and transmits through the infrared cut filter IRCF.

Thus, when the reflected diffraction light HK is re-incident on the upper surface of the semiconductor substrate 101, the reflected diffraction light HK is re-incident as a plurality of dispersed diffraction light KKb. Therefore, in the present embodiment, similarly to the seventh embodiment, the light intensity incident on the pixel PX is deteriorated in the reflected diffraction light HK.

Accordingly, even if the ghost (flare) occurs on the captured image, the ghost (flare) is less noticeable and the deterioration of the image quality can be suppressed.

(2) Conclusion

As described above, in the present embodiment, similarly to the eighth embodiment, the reflective type infrared cut filter IRCF is disposed. Then, the diffraction grating 601 diffracts the reflected diffraction light caused by that the incident light H is incident on the pixel area PA in which the plurality of pixels PX are arranged on the upper surface of the semiconductor substrate 101 and is diffracted.

Therefore, in the present embodiment, similarly to the eighth embodiment, even if the ghost (flare) occurs on the captured image, the ghost (flare) is less noticeable and the image quality can be enhanced.

9. Ninth Embodiment

In the present embodiment, the diffraction grating 601 is provided so that when the incident light H is diffracted by the diffraction grating 601, a diffraction pattern of the diffraction light satisfies the following Expression (E). Except for this point and the associated points, the present embodiment is the same as the seventh embodiment. Therefore, a repeated description of the same parts is omitted.

$$\frac{(KP_1 - KB)}{KP_0} > 0.1 \quad (E)$$

Figure 31A:
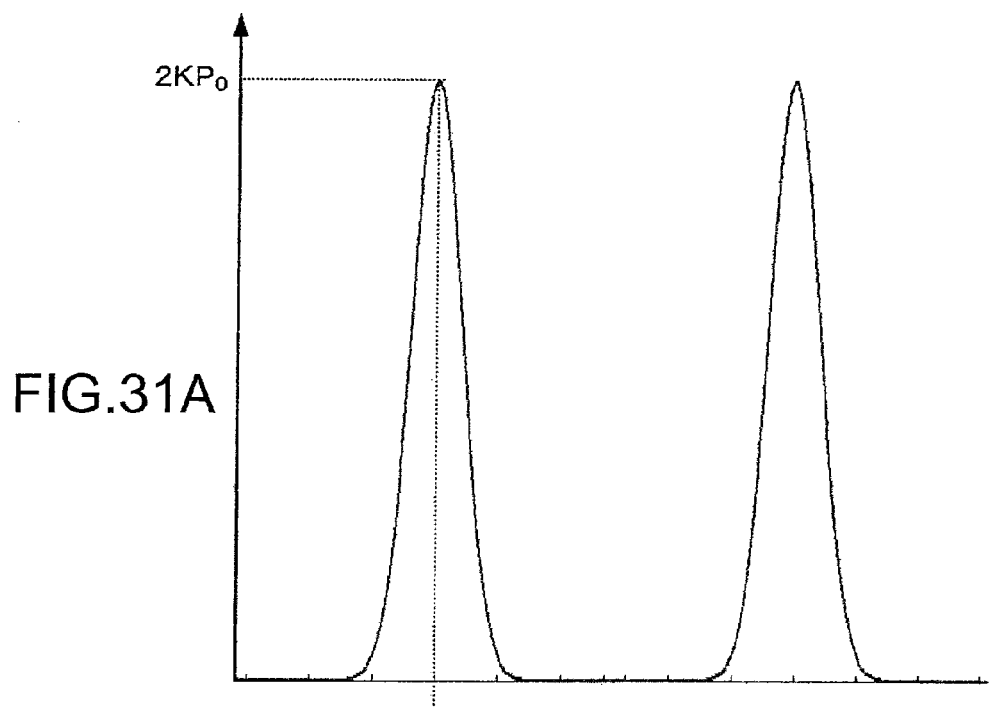
FIGS. 31A and 31B are diagrams each showing factors constituting Expression (E) according to a ninth embodiment.
Figure 31B:
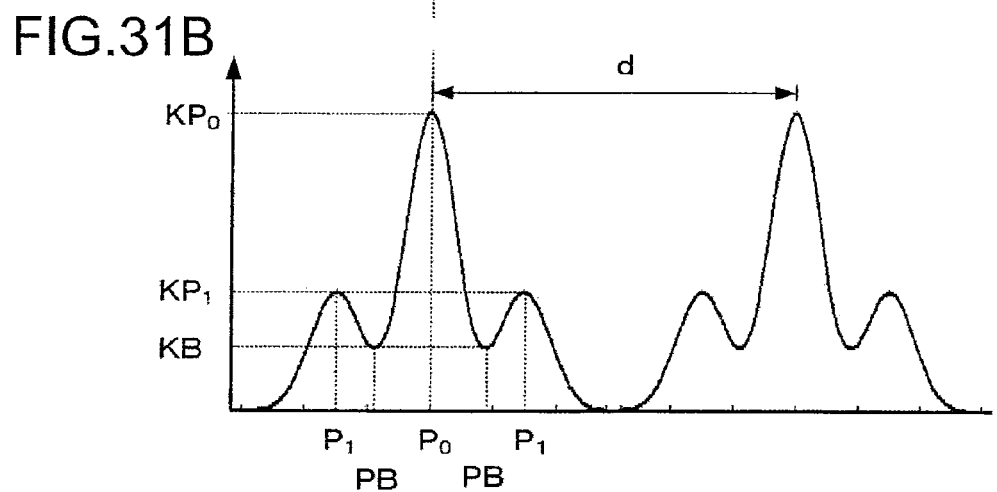

FIG. 31 is a diagram showing a diffraction pattern according to a ninth embodiment. In FIG. 31, the vertical axis shows the luminance of the diffraction pattern and the horizontal axis shows the position.

In FIG. 31, A shows an original diffraction pattern and the reflected diffraction light (red-ball ghost) caused by the plurality of pixels PX. Then, B shows the diffraction pattern after the reflected diffraction light (red-ball ghost) is diffracted by the diffraction grating 601.

As shown in FIG. 31, the respective factors constituting Expression (E) are as follows.

$KP_0$: luminance in peak position $P_0$ of 0-order diffraction light (maximum value at emitting position of 0-order diffraction light)

$KP_1$: luminance in peak position $P_1$ of ±1-order diffraction light (maximum value at emitting position of 1-order diffraction light)

KB: luminance in bottom position B generated between peak position $P_0$ of 0-order diffraction light and peak position $P_1$ of ±1-order diffraction light (minimum value between emitting position of 0-order diffraction light and emitting position of ±1-order diffraction light)

$P_0$ means the ghost image due to diffraction generated by the pixel PX (see FIG. 28). $P_1$ means the diffraction image generated by the diffraction grating 601 (see FIGS. 27 and 29).

When Expression (E) is satisfied (in the case that the left side is larger than 0.1), the light is dispersed and diffused greatly by diffraction and also some of the diffraction light is not reflected by the infrared cut filter IRCF and is transmitted therethrough. Therefore, the light having the red-ball ghost ("original diffraction pattern", see FIG. 31A) caused in the case where the diffraction grating 601 is not provided is diffused and then peak luminance of the red-ball ghost is attenuated (see FIG. 31B). For example, a level of the peak luminance becomes half. Therefore, the red-ball ghost can be decreased.

On the contrary, when Expression (E) is not satisfied (in the case that the left side is 0.1 or less), the peak luminance of the red-ball ghost is attenuated, but it is difficult to obtain the above effects due to low diffusion.

(2) Conclusion

As described above, in the present embodiment, the diffraction grating 601 is provided so that when the incident light H is diffracted by the diffraction grating 601, the diffraction pattern of the diffraction light satisfies the Expression (E).

Therefore, as described above, the captured image can be improved.

Although the present embodiment shows the case where the above Expression (E) is satisfied in the solid-state imaging apparatus having the "cavity structure" of the seventh embodiment, the present embodiment is not limited thereto.

Also in the "cavity-less structure" shown by the other embodiments, it is suitable that the diffraction grating 601 is formed so as to satisfy the above Expression (E).

10. Others

In carrying out the present technology, the present technology is not limited to the foregoing embodiments, and various modifications may be used.

In the above embodiments, although the description has been given of the case where the cross-section of the diffraction grating is configured so that the rectangular-shaped convex portion and concave portion are periodically disposed, the present embodiments are not limited thereto.

FIG. 32 is a cross-sectional view showing the shape of the diffraction grating.

Figure 32A:
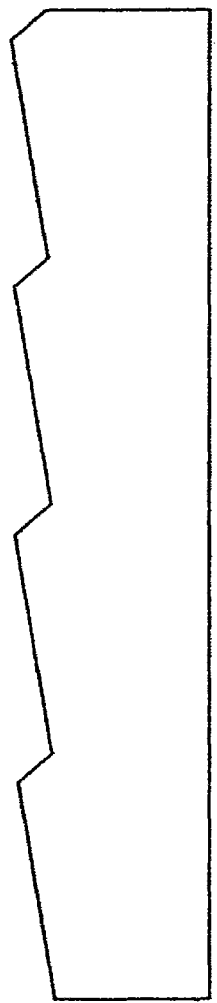
FIGS. 32A and 32B are cross-sectional views each showing a shape of the diffraction grating.
Figure 32B:
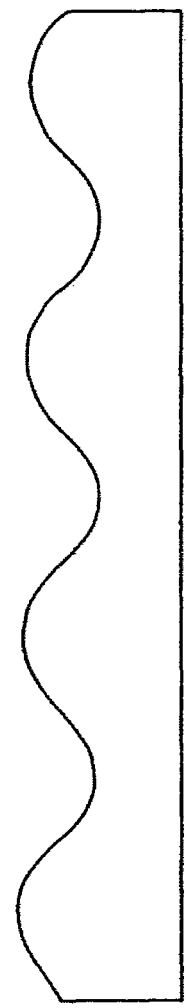

As shown in FIG. 32A, the diffraction grating may be formed so that the cross-sectional shape of the groove is formed in sawtooth shape. Moreover, as shown in FIG. 32B, the diffraction grating may be in the form of a sinusoidal wave.

In the above embodiment, although the description has been given of the case where the diffraction grating is the second level (±1-order diffraction efficiency 41% (maximum value)), the present embodiment is not limited thereto. Various diffraction gratings such as a fourth level (±1-order diffraction efficiency 81% (maximum value)) may be used.

In the above embodiments, although the description has been given of the case where the light in a visible light band is imaged as the subject image, the present embodiments are not limited thereto. When light in the other frequency bands such as near infrared bands is imaged as the subject image, the present technology may be applied.

In the above embodiments, although the diffraction grating is formed by etching the glass substrate and the transparent layer, the present embodiments are not limited thereto. The diffraction grating may be provided by various methods.

For example, a material film is formed by a refractive index material different from the glass substrate on the surface of the glass substrate and then the material film is processed into a grating structure. Subsequently, the diffraction grating may be formed by embedding a refractive index material equivalent to the glass substrate into the concave portion of the grating structure.

For example, the diffraction grating may be formed by embedding the refractive index material different from the glass substrate into the grooves formed by etching the surface of the glass substrate.

Moreover, the diffraction grating may be formed by imprinting or molding.

In the above embodiments, although the description has been given of the case where the solid-state imaging apparatus is applied to the camera, the present embodiments are not limited thereto. The solid-state imaging apparatus may be applied to other electronic apparatuses having the solid-state imaging apparatus such as a scanner and a copying machine.

In the above embodiments, although the description has been given of the case where the glass substrate is bonded on the sensor substrate as a glass cover, the present embodiments are not limited thereto. A transparent substrate constituted of plastic may be used instead of the glass substrate.

In the above embodiments, although the description has been given of the case where the solid-state imaging apparatus is the "front surface illumination type" CMOS image sensor, the present embodiments are not limited thereto. The present technology may be applied in the case of a "rear surface illumination type". Moreover, the present technology may be applied in the case of a CCD image sensor.

Otherwise, the respective embodiments may be appropriately combined.

The present technology can be also configured as follows.

(1) A solid-state imaging apparatus includes: a sensor substrate that has a plurality of pixels configured to receive incident light, the plurality of pixels being arranged on an upper surface of a semiconductor substrate; a transparent substrate that has a lower surface facing an upper surface of the sensor substrate and is configured to transmit the incident light therethrough; and a diffraction grating that is provided at any position between an upper surface of the transparent substrate and the upper surface of the sensor substrate and is configured to transmit the incident light therethrough, in which the diffraction grating is formed so as to diffract reflected diffraction light caused by that the incident light is incident on a pixel area in which the plurality of pixels are arranged on the upper surface of the semiconductor substrate and is diffracted.

(2) The solid-state imaging apparatus according to Item (1), in which the diffraction grating is formed so as to diffract and transmit therethrough a component of the reflected diffraction light, the component being totally reflected on the upper surface of the transparent substrate without the diffraction grating.

(3) The solid-state imaging apparatus according to Item (1) or (2), in which an adhesive layer is applied to an entire surface between the sensor substrate and the transparent substrate so that the sensor substrate and the transparent substrate are bonded by the adhesive layer.

(4) The solid-state imaging apparatus according to Item (3), further including a transparent layer configured to cover the upper surface of the sensor substrate, in which the sensor substrate and the transparent substrate are bonded by the adhesive layer through the transparent layer.

(5) The solid-state imaging apparatus according to Item (4), satisfying following Expression (A)

$$1 \leq \left| \frac{m_1 \lambda}{n_0 P} - \frac{n_4}{n_0} \sin\theta_4 \right| \quad (A)$$

in Expression (A), $\lambda$ is a center wavelength of the incident light received by the pixel, $n_o$ is a refractive index of a layer positioned above the transparent substrate, $n_4$ is a refractive index of the transparent layer, P is a pixel pitch in which the plurality of pixels are arranged, $\theta_4$ is an incidence angle of the incident light that is incident on the pixel, and $m_1$ is a diffraction order ($m_1 = \pm 1, \pm 2, \ldots$) of the reflected diffraction light.

(6) The solid-state imaging apparatus according to any one of Items (1) to (5), in which the diffraction grating is provided on the upper surface of the transparent substrate.

(7) The solid-state imaging apparatus according to any one of Items (1) to (5), in which the diffraction grating is provided on the lower surface of the transparent substrate.

(8) The solid-state imaging apparatus according to Item (4) or (5), in which the diffraction grating is provided on an upper surface of the transparent layer.

(9) The solid-state imaging apparatus according to any one of Items (1) to (5), in which the diffraction grating is provided on the upper and lower surfaces of the transparent substrate.

(10) The solid-state imaging apparatus according to any one of Items (1) to (9), satisfying following Expression (B)

$$W = \left| \frac{L \times \left( \frac{m_2 \lambda}{n_3 d} - \frac{n_2}{n_3} \sin\theta_2 \right)}{\sqrt{1 - \left( \frac{m_2 \lambda}{n_3 d} - \frac{n_2}{n_3} \sin\theta_2 \right)^2}} - \frac{L \times \frac{n_2}{n_3} \sin\theta_2}{\sqrt{1 - \frac{n_2^2}{n_3^2} \sin^2\theta_2}} \right| \quad (B)$$

Where $m_2 = \pm 1$ (In Expression (B), A is a center wavelength of the incident light received by the pixel, $n_2$ is a refractive index of a layer positioned above a surface on which the diffraction grating is provided, $n_3$ is a refractive index of a layer positioned below the surface on which the diffraction grating is provided, d is a grating pitch of the diffraction grating, L is an optical distance between the diffraction grating and the semiconductor substrate, $m_2$ is a diffraction order of the diffraction light caused by diffracting the incident light by the diffraction grating, $\theta_2$ is an incidence angle of the incident light that is incident on the surface on which the diffraction grating is provided, and W is a shift amount of the diffraction light caused by diffracting the incident light by the diffraction grating.

(11) The solid-state imaging apparatus according to Items (10), satisfying following Expression (C)

$$|W| \leq P \qquad (C)$$

in Expression (C), P is a pixel pitch in which the plurality of pixels are arranged.

(12) The solid-state imaging apparatus according to any one of Items (1) to (9), in which the diffraction grating is formed so that a shift amount of 1-order diffraction light caused by diffracting the incident light by the diffraction grating is smaller than the pixel pitch of the plurality of pixels.

(13) The solid-state imaging apparatus according to any one of Items (1) to (9), in which a diffraction grating is formed so that a shift amount of 1-order diffraction light caused by diffracting the incident light by the diffraction grating is identical to the pixel pitch of the plurality of pixels.

(14) The solid-state imaging apparatus according to any one of Items (1) to (9), in which the diffraction grating is formed so that a shift amount of 1-order diffraction light caused by diffracting the incident light by the diffraction grating is smaller than a width of an imaging limitation capability in an imaging optical system.

(15) The solid-state imaging apparatus according to Item (4) or (5), satisfying following Expression (D)

$$1 > \left| \frac{m_3 \lambda}{n_2 d} - \frac{n_4}{n_2} \left( \frac{m_1 \lambda}{n_4 P} - \sin\theta_4 \right) \right| \qquad (D)$$

in Expression (D), $\lambda$ is a center wavelength of the incident light received by the pixel, $n_2$ is a refractive index of a layer positioned above a surface on which the diffraction grating is provided, $n_4$ is a refractive index of the transparent layer, d is a grating pitch of the diffraction grating, $\theta_4$ is an incidence angle of the incident light that is incident on the pixel, and $m_3$ is a diffraction order ($m_3 = \pm 1, \pm 2, \ldots$) of the diffraction light caused by that the reflected diffraction light is diffracted by the diffraction grating.

(16) A solid-state imaging apparatus includes: a sensor substrate that has a plurality of pixels configured to receive incident light, the plurality of pixels being arranged on an upper surface of a semiconductor substrate; a reflective type band-pass filter that has a lower surface facing an upper surface of the sensor substrate and is configured to selectively transmit a component of the incident light therethrough, the component being within a predetermined wavelength range; and a diffraction grating that is provided between the band-pass filter and the sensor substrate and is configured to transmit the incident light therethrough, in which the diffraction grating is formed so as to diffract reflected diffraction light caused by that the incident light is incident on a pixel area in which the plurality of pixels are arranged on the upper surface of the semiconductor substrate and is diffracted.

(17) The solid-state imaging apparatus according to Item (16), further including a transparent substrate that has a lower surface facing an upper surface of the sensor substrate through a cavity and is configured to transmit the incident light therethrough, in which the band-pass filter is provided on an upper surface of the transparent substrate, and the diffraction grating is provided on a lower surface of the transparent substrate.

(18) The solid-state imaging apparatus according to Item (16), further including a transparent substrate that has a lower surface facing an upper surface of the sensor substrate through a cavity and is configured to transmit the incident light therethrough; and a transparent layer configured to cover the upper surface of the sensor substrate, in which the band-pass filter is provided on an upper surface of the transparent substrate, and the diffraction grating is provided on an upper surface of the transparent layer.

(19) The solid-state imaging apparatus according to any one of Items (1) to (18), in which the diffraction grating is provided so that when the incident light is diffracted by the diffraction grating, a diffraction pattern of the diffraction light satisfies following Expression (E)

$$\frac{(KP_1 - KB)}{KP_0} > 0.1 \qquad (E)$$

in Expression (E), $KP_0$ is luminance at a peak position of 0-order diffraction light in the diffraction pattern, $KP_1$ is luminance at a peak position of $\pm 1$-order diffraction light in the diffraction pattern, and KB is luminance at a bottom position caused between the peak position of the 0-order diffraction light and the peak position of the $\pm 1$-order diffraction light in the diffraction pattern.

(20) An electronic apparatus, including:

a sensor substrate that has a plurality of pixels configured to receive incident light, the plurality of pixels being arranged on an upper surface of a semiconductor substrate; a transparent substrate that has a lower surface facing an upper surface of the sensor substrate and is configured to transmit the incident light therethrough; and a diffraction grating that is provided at any position between an upper surface of the transparent substrate and the upper surface of the sensor substrate and is configured to transmit the incident light therethrough, in which the diffraction grating is formed so as to diffract reflected diffraction light caused by that the incident light is incident on a pixel area in which the plurality of pixels are arranged on the upper surface of the semiconductor substrate and is diffracted.

In the embodiments, the pixels PX correspond to the pixels of the present technology. In the embodiments, the semiconductor substrate 101 corresponds to the sensor substrate of the present technology. In the embodiments, the sensor substrate 100 corresponds to the sensor substrate of the present technology. In the embodiments, the glass substrate 301 corresponds to the transparent substrate of the present technology. In the embodiments, the diffraction grating 601 corresponds to the diffraction grating of the present technology. In the embodiments, the transparent layer 110 corresponds to the transparent layer of the present technology. In the embodiments, the adhesive layer 501 corresponds to the adhesive layer of the present technology. In the embodiments, the camera 40 corresponds to the electronic apparatus of the present technology. In the embodiments, the infrared cut filter IRCF corresponds to the band-pass filter of the present technology.

The present disclosure contains subject matter related to that disclosed in Japanese Priority Patent Application JP 2011-171894 filed in the Japan Patent Office on Aug. 5, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging apparatus comprising:
a sensor substrate that has a plurality of pixels configured to receive incident light, the plurality of pixels being arranged on an upper surface of a semiconductor substrate;
a transparent layer that has a lower surface directly contacting an entirety of an upper surface of the sensor substrate;
a transparent substrate that has a lower surface provided over an upper surface of the transparent layer and is configured to transmit the incident light therethrough; and
an adhesive layer applied to an entire surface between the transparent substrate and the transparent layer;
a diffraction grating that is provided over an entirety of an upper surface of the sensor substrate and configured to transmit the incident light therethrough, wherein the diffraction grating diffracts reflected diffraction light caused by the incident light that is incident on a pixel area in which the plurality of pixels are arranged on the upper surface of the semiconductor substrate wherein refractive indexes of the transparent layer and the adhesive layer are 1.52.

2. The solid-state imaging apparatus according to claim 1, wherein the diffraction grating diffracts and transmits therethrough a component of the reflected diffraction light, the component being totally reflected on the upper surface of the transparent substrate without the diffraction grating.

3. The solid-state imaging apparatus according to claim 1, satisfying following Expression (A)

$$1 \leq \left| \frac{m_1 \lambda}{n_0 P} - \frac{n_4}{n_0} \sin\theta_4 \right| \quad (A)$$

in Expression (A), λ is a center wavelength of the incident light received by the pixel,
$n_o$ is a refractive index of a layer positioned above the transparent substrate,
$n_4$ is a refractive index of the transparent layer,
P is a pixel pitch in which the plurality of pixels are arranged,
$\theta_4$ is an incidence angle of the incident light that is incident on the pixel, and
$m_1$ is a diffraction order ($m_1=\pm 1, \pm 2, \ldots$) of the reflected diffraction light.

4. The solid-state imaging apparatus according to claim 1, wherein the diffraction grating is provided on the upper surface of the transparent substrate.

5. The solid-state imaging apparatus according to claim 1, wherein
the diffraction grating is provided on an upper surface of the transparent layer.

6. The solid-state imaging apparatus according to claim 1, satisfying following Expression (B)

$$W = \left| \frac{L \times \left( \frac{m_2 \lambda}{n_3 d} - \frac{n_2}{n_3} \sin\theta_2 \right)}{\sqrt{1 - \left( \frac{m_2 \lambda}{n_3 d} - \frac{n_2}{n_3} \sin\theta_2 \right)^2}} - \frac{L \times \frac{n_2}{n_3} \sin\theta_2}{\sqrt{1 - \frac{n_2^2}{n_3^2} \sin^2\theta_2}} \right| \quad (B)$$

where $m_2=\pm 1$, in Expression (B), λ is a center wavelength of the incident light received by the pixel, $n_2$ is a refractive index of a layer positioned above a surface on which the diffraction grating is provided,
$n_3$ is a refractive index of a layer positioned below the surface on which the diffraction grating is provided,
d is a grating pitch of the diffraction grating,
L is an optical distance between the diffraction grating and the semiconductor substrate,
$m_2$ is a diffraction order ($m_2=\pm 1, \pm 2, \ldots$) of the diffraction light caused by diffracting the incident light by the diffraction grating,
$\theta_2$ is an incidence angle of the incident light that is incident on the surface on which the diffraction grating is provided, and
W is a shift amount of the diffraction light caused by diffracting the incident light by the diffraction grating.

7. The solid-state imaging apparatus according to claim 6, satisfying following Expression (C)

$$W \leq P \quad (C)$$

in Expression (C), P is a pixel pitch in which the plurality of pixels are arranged.

8. The solid-state imaging apparatus according to claim 1, wherein the diffraction grating is formed so that a shift amount of 1-order diffraction light caused by diffracting the incident light by the diffraction grating is smaller than the pixel pitch of the plurality of pixels.

9. The solid-state imaging apparatus according to claim 1, wherein the diffraction grating is formed so that a shift amount of 1-order diffraction light caused by diffracting the incident light by the diffraction grating is identical to the pixel pitch of the plurality of pixels.

10. The solid-state imaging apparatus according to claim 1, wherein the diffraction grating is formed so that a shift amount of 1-order diffraction light caused by diffracting the incident light by the diffraction grating is smaller than a width of an imaging limitation capability in an imaging optical system.

11. The solid-state imaging apparatus according to claim 1, satisfying following Expression (D)

$$1 > \left| \frac{m_3 \lambda}{n_2 d} - \frac{n_4}{n_2} \left( \frac{m_1 \lambda}{n_4 P} - \sin\theta_4 \right) \right| \quad (D)$$

In Expression (D), λ is a center wavelength of the incident light received by the pixel,
$n_2$ is a refractive index of a layer positioned above a surface on which the diffraction grating is provided,
$n_4$ is a refractive index of the transparent layer,
d is a grating pitch of the diffraction grating,
$\theta_4$ is an incidence angle of the incident light that is incident on the pixel, and
$m_3$ is a diffraction order ($m_3=\pm 1, \pm 2, \ldots$) of the diffraction light caused by that the reflected diffraction light is diffracted by the diffraction grating.

12. The solid-state imaging apparatus according to claim 1, wherein the diffraction grating is provided so that when the incident light is diffracted by the diffraction grating, a diffraction pattern of the diffraction light satisfies following Expression (E)

$$\frac{(KP_1 - KB)}{KP_0} > 0.1 \quad (E)$$

in Expression (E), $KP_0$ is luminance at a peak position of 0-order diffraction light in the diffraction pattern,
$KP_1$ is luminance at a peak position of ±1-order diffraction light in the diffraction pattern, and
KB is luminance at a bottom position caused between the peak position of the 0-order diffraction light and the peak position of the ±1-order diffraction light in the diffraction pattern.

13. The solid-state imaging apparatus according to claim 1, wherein the transparent substrate is a glass substrate.

14. The solid-state imaging apparatus according to claim 1, wherein the diffraction grating is provided over an entirety of the upper surface of the transparent substrate.

15. An electronic apparatus, comprising:
a sensor substrate that has a plurality of pixels configured to receive incident light, the plurality of pixels being arranged on an upper surface of a semiconductor substrate;
a transparent layer that has a lower surface directly contacting an entirety of an upper surface of the sensor substrate;
a transparent substrate that has a lower surface provided over an upper surface of the transparent layer and is configured to transmit the incident light therethrough;
an adhesive layer applied to an entire surface between the transparent substrate and the transparent layer; and
a diffraction grating that is provided over an entirety of an upper surface of the sensor substrate and configured to transmit the incident light therethrough, wherein
the diffraction grating diffracts reflected diffraction light caused by the incident light that is incident on a pixel area in which the plurality of pixels are arranged on the upper surface of the semiconductor substrate wherein refractive indexes of the transparent layer and the adhesive layer are 1.52.

\* \* \* \* \*